US010361690B1

(12) United States Patent
Addepalli et al.

(10) Patent No.: US 10,361,690 B1
(45) Date of Patent: Jul. 23, 2019

(54) DUTY CYCLE AND SKEW CORRECTION FOR OUTPUT SIGNALS GENERATED IN SOURCE SYNCHRONOUS SYSTEMS

(71) Applicant: SanDisk Technologies LLC, Addison, TX (US)

(72) Inventors: Sravanti Addepalli, Bengaluru (IN); Ravindra Arjun Madpur, Bangalore (IN); Sridhar Yadala, Bengaluru (IN)

(73) Assignee: SanDisk Technologies LLC, Addision, TX (US)

( * ) Notice: Subject to any disclaimer, the term of this patent is extended or adjusted under 35 U.S.C. 154(b) by 0 days.

(21) Appl. No.: 16/008,678

(22) Filed: Jun. 14, 2018

(51) Int. Cl.
*H03K 5/15* (2006.01)
*H03K 5/156* (2006.01)
*G11C 7/22* (2006.01)
*H03L 7/089* (2006.01)
*G06F 1/10* (2006.01)
*G06F 1/06* (2006.01)
*H03K 5/133* (2014.01)
*H03K 5/00* (2006.01)

(52) U.S. Cl.
CPC ............ *H03K 5/1565* (2013.01); *G06F 1/06* (2013.01); *G06F 1/10* (2013.01); *G11C 7/222* (2013.01); *H03K 5/133* (2013.01); *H03L 7/0891* (2013.01); *H03K 2005/00052* (2013.01); *H03K 2005/00078* (2013.01)

(58) Field of Classification Search
CPC .......... G11C 7/222; G11C 7/22; G11C 7/225; H03K 5/1565; H03K 5/133; H03K 2005/00052; H03K 2005/00078; G06F 1/06; G06F 1/10; H03L 7/0891

USPC ................................ 365/194, 233.1, 233.12
See application file for complete search history.

(56) References Cited

U.S. PATENT DOCUMENTS

| 6,125,157 | A | 9/2000 | Donnelly et al. |
| 7,034,597 | B1 | 8/2006 | Mo et al. |
| 7,227,795 | B2 * | 6/2007 | Lee ....................... G11C 7/1051 327/155 |
| 7,812,657 | B2 | 10/2010 | Gomm et al. |
| 9,275,706 | B2 | 3/2016 | Tam |
| 9,673,798 | B1 | 6/2017 | Tang et al. |
| 2005/0254318 | A1 * | 11/2005 | Jang ......................... G11C 7/22 365/194 |
| 2007/0046346 | A1 | 3/2007 | Minzoni |
| 2007/0285289 | A1 | 12/2007 | Swoboda |

(Continued)

OTHER PUBLICATIONS

M. Ragavan et al., "Duty Cycle Corrector with SAR for DDR Dram Application", International Journal of Advanced Research in Electrical, Electronics and Instrumentation Engineering, vol. 2, Issue 5, May 2013; pp. 1924-1932.

*Primary Examiner* — Tan T. Nguyen
(74) *Attorney, Agent, or Firm* — Brinks Gilson & Lione

(57) ABSTRACT

A first integrated circuit configured to send data to a second integrated circuit may perform a duty cycle correction process and/or a skew correction process. For duty cycle correction, a data-in input buffer is enabled to feedback an output clock signal from an output clock node to a duty cycle correction circuit that adjusts a delay of a clock signal received from a delay-locked loop circuit. For skew correction, data-in input buffers are enabled to feedback an output clock signal and an output data signal to adjust delay amounts of delay circuits that adjust delays of clock signals output to clock inputs of output path circuits.

22 Claims, 11 Drawing Sheets

(56) References Cited

U.S. PATENT DOCUMENTS

| | | | |
|---|---|---|---|
| 2008/0056029 A1* | 3/2008 | Cheng | G06F 13/4243 |
| | | | 365/194 |
| 2008/0204097 A1 | 8/2008 | Wu | |
| 2011/0309869 A1 | 12/2011 | Choi | |
| 2014/0241082 A1 | 8/2014 | Tam | |
| 2015/0187401 A1* | 7/2015 | Choi | G11C 7/222 |
| | | | 365/189.07 |

\* cited by examiner

DUTY CYCLE AND SKEW CORRECTION FOR OUTPUT SIGNALS GENERATED IN SOURCE SYNCHRONOUS SYSTEMS

BACKGROUND

In source synchronous systems, a sending circuit may send a clock signal to a receiving circuit in order for the receiving circuit to retrieve data. The receiving circuit may use the clock signal to retrieve the data and generate data and clock signals for transmission back to the sending circuit. Upon receipt of the data and clock signals, the sending circuit samples data pulses of the data signals in response to clock edges of the clock signals in order to identify the data values of the data carried by the data signals. In order to correctly identify the data values, the sending circuit relies on the receiving circuit transmitting the clock signals at a target duty cycle (e.g., 50%), and also relies on the receiving circuit transmitting the data and clock signals with proper timing or edge alignment between each other. In the event that the duty cycle of the clock signals is too far from the target duty cycle, or in the event that too much skew exists between the clock and data signals, the sending circuit may not accurately identify the data values.

The receiving circuit may include a clock path extending from an input clock node to an output clock node. The receiving circuit may receive an input clock signal from the sending circuit at the input clock node, and may output an output clock signal to the sending circuit at the output clock node. The clock path may include various circuitry that generates intermediate clock signals based on the input clock signal in order to generate the output clock signal. At some point along the clock path, an intermediate clock signal generated in the clock path may be used to generate the clock and data pulses that are converted into the output clock and data signals, respectively.

The receiving circuit may include a duty cycle correction circuit that measures and corrects for duty cycle distortion in the input clock signal or an intermediate signal generated in the clock path. While such duty cycle correction may help reduce duty cycle distortion in the output clock signal, it would not correct for any extra distortion created in the clock path between the input or intermediate clock signal being measured and the output clock signal at the output clock node. The extra distortion may be insignificant at lower frequencies, but may become problematic as clock frequencies increase into the Gigahertz range and beyond.

Performing localized duty cycle correction of the output clock signal by implementing duty cycle correction circuitry at or near the output clock node may not be feasible. For example, performing localized duty cycle correction may violate data out timing specifications that specify the timing relationships between the clock and data signals. Additionally, the driver and pre-driver circuits used to generate the output clock signal are relatively large circuits that are located close to the output node, such that there is not enough room to also include duty cycle correction circuitry. Also, even if there was enough room, adding additional circuitry may undesirably increase the capacitance on the output nodes, limiting the operating speed. Moreover, the pre-driver and driver circuitry may have separate pull-up (PMOS) and push-down (NMOS) paths to generate a single output clock signal, thus making duty cycle correction for the single output clock signal difficult. Similar obstacles may be present for performing localized skew correction between output clock and data signals. As such, ways to implement duty cycle correction circuits that detect and correct for duty cycle distortion in the output clock signal, and/or skew correction circuits that detect and correct for skew distortion between output clock and data signals, may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 2:
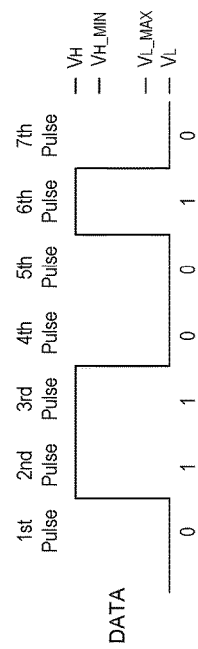
FIG. 2 is an example timing diagram of a waveform of a data signal.

The following embodiments describe systems, apparatuses, devices, circuits, and methods for performing duty cycle and skew correction for output clock and data signals. In one embodiment, a circuit includes a delay circuit, an input buffer, and a duty cycle correction controller. The delay circuit is configured to output a delayed clock signal to a clock input of an output clock path circuit. The input buffer is configured to generate a buffered clock signal in response to receipt of an output clock signal from the output clock path circuit. The duty cycle correction controller is configured to identify a duty cycle level of the buffered clock signal, and adjust a delay amount of the delay circuit in response to the identified duty cycle level of the buffered clock signal.

In some embodiments, the duty cycle correction controller is configured to wait to begin adjusting the delay amount of the delay circuit until determining that a delay-locked loop circuit is locked.

In some embodiments, the duty cycle correction controller is configured to adjust the delay amount of the delay circuit until the duty cycle correction controller identifies that the duty cycle level of the buffered clock signal has reached a target duty cycle level.

In some embodiments, the duty cycle correction controller is further configured to identify a delay direction to adjust the delay amount of the delay circuit, and adjust the delay amount in the direction until the duty cycle correction controller identifies that the duty cycle level of the buffered clock signal has reached the target duty cycle level.

In some embodiments, the duty cycle correction controller is further configured to adjust a number of delay cells of the delay circuit in order to adjust the delay in the delay direction until the duty cycle correction controller identifies that the duty cycle level of the buffered clock signal has reached the target duty cycle level.

In some embodiments, the duty cycle correction controller is configured to select values of a digital code in a selection direction corresponding to the delay direction to adjust the delay amount in the delay circuit until the duty cycle correction controller identifies that the duty cycle level of the buffered clock signal has reached the target duty cycle level.

In some embodiments, the delay circuit includes a delay chain including a plurality of delay cells, and a biasing circuit configured to bias the plurality of delay cells in response to the identified duty cycle level of the buffered clock signal.

In some embodiments, the duty cycle correction controller is configured to adjust the delay amount during a data-out operation.

In some embodiments, the input buffer is further configured to receive a pair of complementary output clock signals, where the output clock signal includes one of the pair of complementary output clock signals. In addition, the input buffer is configured to generate the buffered clock signal in response to receipt of the pair of complementary output clock signals.

In some embodiments, the input buffer is further configured to receive a reference voltage, and generate the buffered clock signal in response to receipt of the output clock signal and the reference voltage.

In some embodiments, the duty cycle correction controller is configured to adjust the delay amount of the delay circuit relative to a delay amount of another delay circuit to generate a pair of complementary delayed clock signals during a duty cycle correction process. In addition, a pulse generation circuit configured to combine pulse generation signals in response to receipt of the pair of complementary delayed clock signals in order to reduce duty cycle distortion in the output clock signal.

In some embodiments, the input buffer includes an input clock buffer, a second delay circuit is configured to output a second delayed clock signal to a clock input of an output data path circuit, an input data buffer is configured to generate a buffered data signal in response to receipt of an output data signal from the output data path circuit, and a skew correction controller is configured to detect a phase difference between the buffered clock signal and the buffered data signal, and adjust a delay amount of the second delay circuit in response to the detected phase difference.

In some embodiments, the input data buffer includes a first input data buffer, a third delay circuit is configured to output a third delayed clock signal to a clock input of a second output data path circuit, a second input data buffer is configured to generate a second buffered data signal in response to receipt of a second output data signal from the second output data path circuit, and a second skew correction controller is configured to detect a phase difference between the buffered clock signal and the second buffered data signal, and adjust a delay amount of the third delay circuit in response to the detected phase difference.

In some embodiments, the input clock buffer includes an input terminal coupled to an input/output (I/O) clock node, the first input buffer includes an input terminal coupled to a first I/O data node, the second input buffer includes an input terminal coupled to a second I/O data node, and the first and second I/O data nodes are positioned on opposite sides of the I/O clock node.

In some embodiments, the input buffer includes a first input clock buffer, a second delay circuit is configured to output a second delayed clock signal to a clock input of a complementary output clock path circuit, a second input clock buffer is configured to generate a second buffered clock signal in response to receipt of a complementary output clock signal from the complementary output clock path circuit, and a skew correction controller is configured to detect a phase difference between the first buffered clock signal and the second buffered clock signal, and adjust a delay of the second delay circuit in response to the detected phase difference.

In another embodiment, a circuit includes an integrated circuit that includes an output clock path circuit, a duty cycle detection circuit, and a delay circuit. The output clock path circuit includes a pulse generation circuit configured to generate clock pulses in response to receipt of an intermediate clock signal, and a driver circuit configured to generate an output clock signal at an input/output node of the integrated circuit in response to receipt of the clock pulses. The duty cycle detection circuit is configured to detect a duty cycle of the output clock signal. The delay circuit is configured to generate a delayed clock signal based on the detected duty cycle of the output clock signal, and output the delayed clock signal to the pulse generation circuit.

In some embodiments, a delay-locked loop circuit is configured to receive an intermediate clock signal, and output a delay-locked clock signal to the delay circuit. The delay circuit is configured to delay the delay-locked clock signal to generate the delayed clock signal.

In some embodiments, an input clock path is configured to receive an input clock signal by way of an input clock node, and output the intermediate clock signal to the delay-locked loop circuit in response to receipt of the input clock signal.

In some embodiments, a duty cycle correction controller is configured to wait to begin adjusting a delay amount of the delay circuit until determining that the delay-locked loop circuit is locked.

In some embodiments, the delay circuit includes a delay chain that includes a plurality of delay cells, and a biasing circuit configured to bias the plurality of delay cells according to a locked bias setting that locks the delay-locked loop circuit.

In some embodiments, the delay-locked loop circuit is configured to output a second delay-locked clock signal of a pair of complementary delay-locked clock signals to a second delay circuit. The second delay circuit is configured to delay the second delay-locked clock signal by a constant amount while the first delay circuit adjusts a delay amount by which to delay the first delay-locked clock signal.

In another embodiment, a system includes a memory die that includes: a memory array including a plurality of memory cells, an output data path circuit, an output clock path circuit, a delay circuit, and a duty cycle correction controller. The output data path circuit is configured to generate an output data signal carrying data stored in the memory array. The output clock path circuit is configured to generate an output clock signal. The delay circuit is configured to receive a first intermediate clock signal from an input clock path circuit, delay the first intermediate clock signal to generate a second intermediate clock signal, and output the second intermediate clock signal to the output clock path circuit and the output data path circuit. The duty cycle correction controller is configured to set an amount of delay of the delay circuit in response to a duty cycle of the output clock signal.

In some embodiments, the duty cycle correction controller is configured to wait to begin adjusting the amount of delay of the delay circuit until determining that a delay-locked loop circuit is locked.

In another embodiment, a method includes: generating, with a delay circuit, a delayed clock signal in response to receiving an intermediate clock signal from an input clock path circuit; generating, with an output clock path circuit, an output clock signal at an input/output node of an integrated circuit in response to receipt of the delayed clock signal; generating, with an input buffer of the integrated circuit; a buffered clock signal in response to receiving the output clock signal; and adjusting, with a controller, a delay of the delay circuit until a duty cycle level of the input signal reaches a target duty cycle level.

In another embodiment, a circuit includes: means for delaying a first intermediate clock signal to output a second intermediate clock signal; means for generating a plurality of clock pulses in response to receipt of the second intermediate clock signal; means for generating an output clock signal based on the plurality of clock pulses; means for generating a buffered clock signal in response to receipt of the output clock signal; means for detecting a duty cycle level of the buffered clock signal; and means for adjusting a delay amount of the means for delaying in response to the detected duty cycle level of the buffered clock signal.

In another embodiment, a circuit includes a delay circuit, an input buffer, and a skew correction controller. The delay circuit is configured to output a delayed clock signal to a clock input of an output data path circuit. The input buffer is configured to generate a buffered data signal in response to receipt of an output data signal from an output data path circuit. The skew correction controller is configured to identify a phase difference between the buffered data signal and a reference clock signal, and adjust a delay amount of the delay circuit in response to the identified phase difference between the buffered data signal and the reference clock signal.

In some embodiments, the skew correction controller is configured to adjust the delay amount of the delay circuit until the skew correction controller identifies that the phase difference has reached a target difference.

In some embodiments, the reference clock signal includes a buffered clock signal, and a second input buffer is configured to generate the buffered clock signal in response to receipt of an output clock signal.

In some embodiments, a second delay circuit is configured to output a second delayed clock signal to a second clock input of the output data path circuit, and the skew correction controller is configured to adjust the second delay circuit by the delay amount in response to the identified phase difference.

In some embodiments, an output clock path circuit configured to generate an output clock signal for generation of the reference clock signal, where data inputs of the output data path circuit are configured to receive a same pair of high and low voltages as data inputs of the output clock path circuit.

In some embodiments, the skew correction controller is configured to adjust the phase difference between the buffered data signal and the reference clock signal to a target difference during a data-out operation.

In some embodiments, a second skew correction controller is configured to identify a second phase difference between a second buffered data signal and the reference clock signal, and adjust a second delay amount of a second delay circuit in response to the identified second phase difference between the second buffered data signal and the reference clock signal.

In some embodiments, a second input buffer is configured to generate the second buffered data signal in response to receipt of a second output data signal.

In some embodiments, a second skew correction controller is configured to identify a second phase difference between a buffered complementary clock signal and the reference clock signal, and adjust a second delay amount of a second delay circuit in response to the identified second phase difference between the buffered complementary clock signal and the reference clock signal.

In some embodiments, a second delay circuit is configured to output a second delayed clock signal to the first delay circuit and to a fixed delay circuit, and a duty cycle correction controller is configured to identify a duty cycle of the reference clock signal, and adjust a delay amount of the second delay circuit in response to the identified duty cycle level of the reference clock signal.

In some embodiments, the skew correction controller is configured to begin adjusting the delay amount of the first delay circuit to correct for skew between the buffered data signal and the reference clock signal after the duty cycle correction controller performs a duty cycle correction process.

In another embodiment, a circuit includes an integrated circuit that includes an output data path circuit, a phase detection circuit, and a delay circuit. The output data path circuit includes a pulse generation circuit configured to generate data pulses in response to receipt of a delayed clock signal, and a driver circuit configured to generate an output data signal at an input/output node of the integrated circuit in response to receipt of the data pulses. The phase detection circuit configured to detect a phase difference between the output data signal and an output clock signal. The delay circuit is configured to generate a delayed clock signal based on the detected phase difference, and output the delayed clock signal to the pulse generation circuit.

In some embodiments, The circuit of claim 12, a first input buffer is configured to generate a buffered data signal in response to receipt of the output data signal, and a second input buffer is configured to generate a buffered clock signal in response to receipt of the output clock signal. The phase detection circuit is configured to detect the phase difference between the output data signal and the output clock signal by detection of a phase difference between the buffered data signal and the buffered clock signal.

In some embodiments, the delay circuit is configured to adjust a delay amount by which to delay an intermediate clock signal to generate the delayed clock signal until a target phase difference is reached.

In some embodiments, a second delay circuit is configured to generate a second delayed clock signal complementary to the first delayed clock signal, and a skew correction controller is configured to adjust a delay of the second delay circuit by a same delay amount as the first delay circuit during a skew correction process.

In some embodiments, the pulse generation circuit includes a first data input configured to receive a high voltage and a second data input configured to receive a low voltage during a duration of a skew correction process performed during a calibration process.

In some embodiments, the delay circuit is configured to adjust a delay amount to generate the delayed clock signal during a data-out operation.

In some embodiments, an output clock path circuit is configured to generate the output clock signal, and a second output data path circuit is configured to generate a second output data signal, where the first and second output data path circuits are positioned on opposite sides of the output clock path circuit. Additionally, a first skew correction controller is configured to adjust the first delay circuit based on the first phase difference, and a second skew correction controller is configured to adjust a second delay circuit based on a second phase difference between the second output data signal and the output clock signal.

In another embodiment, a system includes a memory array including a plurality of memory cells, an output data path circuit, an output clock path circuit, a delay circuit, and a skew correction controller. The output data path circuit is configured to generate an output data signal carrying data stored in the memory array. The output clock path circuit is configured to generate an output clock signal. The delay circuit is configured to receive a first intermediate clock signal from an intermediate clock generation circuit, delay the first intermediate clock signal to generate a second intermediate clock signal, and output the second intermediate clock signal to the output data path circuit. The skew correction controller is configured to set a delay amount of the delay circuit in response to a phase difference between the output data signal and the output clock signal.

In some embodiment, the intermediate clock generation circuit includes a duty cycle correction circuit including a second delay circuit, and the duty cycle correction circuit further includes a duty cycle correction controller configured to adjust a second delay amount of the second delay circuit during a duty cycle correction process. In addition, the skew correction controller is configured to adjust the first delay amount during a skew correction process after the duty cycle correction process completes.

In another embodiment, a method includes: generating, with a delay circuit, a delayed clock signal in response to receiving an intermediate clock signal from an intermediate clock generation circuit; generating, with an output data path circuit, an output data signal at an input/output node of an integrated circuit in response to receipt of the delayed clock signal; generating, with an input buffer of the integrated circuit, a buffered data signal in response to receiving the output data signal; and adjusting, with a controller, a delay of the delay circuit until the buffered data signal is edge-aligned with a reference clock signal.

In another embodiment, a circuit includes: means for delaying a first intermediate clock signal to output a second intermediate clock signal; means for generating a plurality of data pulses in response to receipt of the second intermediate clock signal; means for generating an output data signal based on the plurality of data pulses; means for generating a buffered data signal in response to receipt of the output data signal; means for detecting a phase difference between the buffered data signal and a reference clock signal; and means for adjusting a delay amount of the means for delaying in response to the detected phase difference.

Other embodiments are possible, and each of the embodiments can be used alone or together in combination. Accordingly, various embodiments will now be described with reference to the attached drawings.

Figure 1:
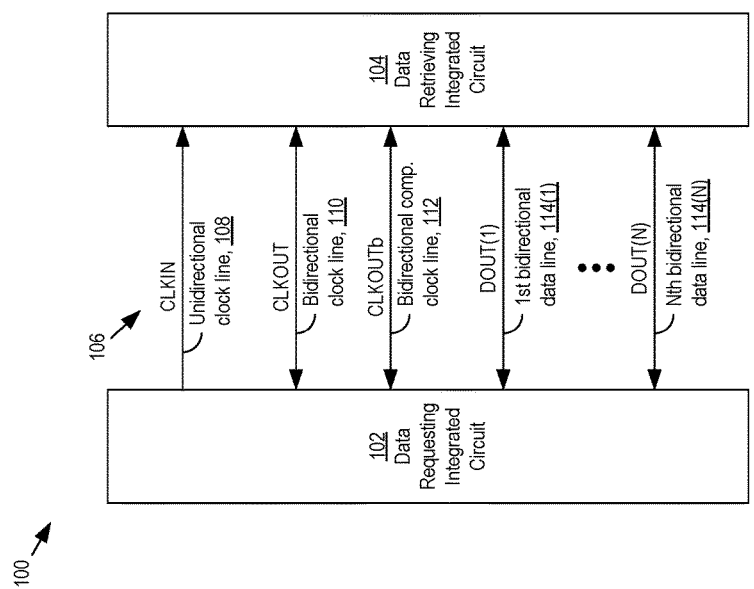
FIG. 1 is a block diagram of an example system that includes a data requesting integrated circuit and a data retrieving integrated circuit.

In further detail, FIG. 1 shows a system 100 in which a duty cycle correction circuit and/or a skew correction circuit may be implemented. The system 100 may include a data requesting integrated circuit 102 and a data retrieving integrated circuit 104 configured to communicate with each other via a communications bus 106. In general, an integrated circuit (IC)—also referred to as a monolithic IC, a chip, or a microchip—is an assembly or a collection of electronic circuit components (including active components, such as transistors and diodes, and passive components, such as capacitors and resistors) and their interconnections formed as a single unit, such as by being fabricated, on a substrate typically made of a semiconductor material such as silicon. In the system 100, the data requesting IC 102 and the data retrieving IC 104 are separate integrated circuits, and the communication bus 106 is configured to communicate signals external to the separate data requesting and data retrieving ICs 102, 104.

In particular example configurations, both the data requesting IC 102 and the data retrieving IC 104 are transceiver circuits, meaning that each can be configured to transmit and receive signals.

In the system 100, the data requesting IC 102 wants to obtain and/or receive data, and the data retrieving IC 104 has access to the data that the data requesting IC 102 wants, and can therefore retrieve the data and send the data to the data requesting IC 102. In some example embodiments, the data retrieving IC 104 may have access to the data because it is storing the data, such as in a memory array, although in other example embodiments, the data may be stored external to the data retrieving IC 104, such as by being stored in another IC, and the data retrieving IC 104 can communicate with the other IC to retrieve the data. Upon accessing the data, the data retrieving IC 104 sends the data to the data requesting IC 102 by sending one or more output data signals carrying the data to the data requesting IC 102.

The data requesting IC 102 and the data retrieving circuit 104 form a source synchronous system 100. In general, a source synchronous system is a system in which a source circuit sends a data signal along with a clock signal to a destination circuit in order for the destination circuit to use the clock signal to identify the data values of the data signal. In the system 100, the data requesting IC 102 and the data retrieving IC 104 function as the source circuit and the destination circuit, and may change roles as the source circuit and the destination circuit in the source synchronous system, depending on whether they are performing a data-in operation or a data-out operation. For data-in operations where the data requesting IC 102 sends data in the form of data signals to the data retrieving IC 104, the data requesting IC 102 is the source circuit and the data retrieving IC 104 is the destination circuit. The data retrieving IC 104 identifies the data values of the data signals using the clock signal, such as in response to rising and/or falling edges of the clock signal. For data-out operations where the data retrieving IC 104 sends data in the form of data signals to the data requesting IC 102, the data retrieving IC 104 is the source circuit and the data requesting IC 102 is the destination circuit of the source synchronous system.

In a particular example configuration, as shown in FIG. 1, the communications bus 106 includes a unidirectional clock line 108, a pair of bidirectional clock lines 110, 112, and an N-number of bidirectional data lines 114, extending from a bidirectional data line 114(1) to an Nth bidirectional data line 114(N). Herein a unidirectional line is a transmission line that is configured to communicate signals one way or in one direction, either only from the data requesting IC 102 to the data retrieving IC 104, or only from the data retrieving IC 104 to the data requesting IC 102. In contrast, a bidirectional line is a transmission line that is configured to communicate signals both ways or in both directions, from the data requesting IC 102 to the data retrieving IC 104, and from the data retrieving IC 104 to the data requesting IC 102. With reference to the configuration in FIG. 1, the unidirectional clock line 108 communicates clock signals from the data requesting IC 102 to the data retrieving IC 104. The bidirectional clock lines 110, 112 communicate clock signals both from the data requesting IC 102 to the data retrieving IC 104, and from the data retrieving IC 104 to the data requesting IC 102. Similarly, the bidirectional data lines 114 communicate data signals from the data requesting IC 102 to the data retrieving IC 104, and from the data retrieving IC 104 to the data requesting IC 102.

The data requesting integrated IC 102 and the data retrieving circuit IC 104 communicate input and output signals between each other over the lines 108-114 of the communications bus 106. The input and output signals include input clock signals, input data signals, output clock signals, and output data signals. The terms output and input are used herein to indicate the direction in which a signal is communicated between the data requesting IC 102 and the data retrieval IC 104. An input signal of an integrated circuit is a signal that the integrated circuit receives on a line of the communications bus 106, and an output signal of an integrated circuit is a signal that the integrated circuit outputs onto a line of the communications bus 106. Of course, the terms input and output depend on the perspective of the integrated circuit. An output signal for one of the integrated circuits 102, 104 is an input signal for the other of the integrated circuits 102, 104.

The present description focuses on situations where the data requesting IC 102 sends a clock signal on the unidirectional clock line 108 to the data retrieving IC 104, and the data retrieving IC responds by sending data signals on the bidirectional data lines 114 and clock signals on the bidirectional clock lines 112 to the data requesting 102. For clarity, hereafter and unless specified otherwise, the input and output signals are identified with reference to (or from the perspective of) the data retrieving IC 104. That is, the data retrieving IC 104 is configured to receive an input clock signal CLKIN from the data requesting IC 102 by way of the unidirectional clock line 108, send output clock signals CLKOUT, CLKOUTb to the data requesting IC 102 by way of the bidirectional clock lines 110, 112, and send an N-number of output data signals DOUT(1) to DOUT(N) to the data requesting IC 102 by way of the N-number of bidirectional data lines 114(1) to 114(N).

In other situations where the data requesting IC 102 wants to send data to the data retrieving IC 104, the data requesting IC 102 may send an N-number of output data signals DOUT(1) to DOUT(N) to the data retrieving IC 104 by way of the bidirectional data lines 114. The data requesting IC 102 may also send output clock signals CLKOUT, CLK-OUTb, in parallel with the output data signals DOUT, to the data retrieving IC 104 by way of the bidirectional clock lines 110, 112.

In general, a signal may be at a level at a given point in time. As used herein, a level of a signal at a given point in time is a magnitude value, such as a voltage magnitude value or a current magnitude value. In some cases, the signal may be referred to as being at a high level or at a low level, transitioning between a high level and a low level, or transitioning between a low level and a high level. In general, a high level and a low level are both magnitude values, where the high level is higher in magnitude than the low level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

In addition or alternatively, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MIN}$ may be predetermined levels or values, and in particular example configurations, predetermined levels or values specified as part of a swing requirement with which the source circuit 102 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLKIN and the output clock signals CLKOUT, CLKOUTb, is a signal that has repetitive cycles occurring over successive periods T. Within each period T, a first portion of a respective cycle occurs first in time and a second portion of the respective cycle occurs second in time—i.e., after the first portion. After the second portion of one cycle occurs, the first portion of a next cycle occurs. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

In addition, a clock signal has an associated duty cycle. As used herein, a duty cycle of a clock signal is the percentage or fraction of one period that the clock signal is at its high level. In addition or alternatively, the duty cycle of a clock signal is the ratio of a pulse width of a clock pulse in a single period or cycle of the clock signal to a total time duration of the period or cycle.

In particular example configurations, the output clock signals CLKOUT, CLKOUTb are a pair of complementary (comp.) output clock signals. In this context, the bidirectional clock lines 110, 112 may be referred to as a pair of bidirectional complementary clock lines 110, 112 configured to communicate a pair complementary output clock signals CLKOUT, CLKOUTb. For clarity, the bidirectional clock line configured to communicate the first output clock signal CLKOUT is referred to as the bidirectional clock line 110 and the other bidirectional clock line configured to communicate the second output clock signal CLKOUTb is referred to as the bidirectional complementary (comp.) clock line 112. In addition, the unidirectional clock line 108 is shown in FIG. 1 as being a single-ended transmission line that communicates a single-ended input clock signal CLKIN. In other example configurations, the unidirectional clock line 108 is configured as a pair of unidirectional clock lines configured to communicate a pair of complementary input clock signals CLKIN, CLKINb from the data requesting IC 102 to the data retrieving IC 104.

In general, two signals of a pair of signals are complementary in that when one of the signals is at an associated high level the other is at an associated low level. The waveforms of two complementary signals are considered to inversely track each other in that when one signal performs a rising transition, the other signal performs a falling transition. In addition or alternatively, two signals that are complementary are 180-degrees out of phase with each other or have waveforms representative of two signals that are 180-degrees out of phase with each other.

For a pair of complementary signals, when a first signal of the pair is performing a rising transition, a second signal of the pair is performing a falling transition, or in the event that the rising and falling transitions are not occurring concurrently, then the transition of the second signal that is occurring closest in time to the rising transition of the first signal is a falling transition. Similarly, when the first signal of the pair is performing a falling transition, the second signal is performing a rising transition, or in the event that the rising and falling transitions are not occurring concurrently, then the transition of the second signal that is occurring closest in time to the falling transition of the first signal is a rising transition.

Additionally, a data signal is a signal that carries and/or includes data. The data carried by and/or included in a data signal includes a bit sequence of bits, where each bit includes or has a single-bit logic value of "1" or "0". The data signal may include a series or sequence of data pulses corresponding to a bit sequence of the data. A data pulse is a portion of the magnitude waveform of the data signal that represents one or more bits of the bit sequence. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

FIG. 2 shows a timing diagram of a magnitude waveform of at least a portion of an example data signal DAT, which may be representative of at least a portion of one of the N-number of output data signals DOUT(1) to DOUT(N) that the data retrieving IC 104 outputs to the data requesting IC 102, or an internal data signal generated and/or communicated within the data requesting circuit 102 or the data retrieving IC 104. For purposes of illustration, the example data signal DAT shown in FIG. 2 includes seven data pulses. Each data pulse is shown as being either at a high level at or above a minimum high level $V_{H\_MIN}$ or at a low level at or below a maximum low level $V_{L\_MAX}$. For the example data signal DAT in FIG. 2, the high level and the low level each indicate a single-bit logic or data value of "1" or "0", where the high level corresponds to and/or indicates a single-bit logic or data value of "1" (otherwise referred to as a logic 1 value) and the low level corresponds to and/or indicates a single-bit logic or data value of "0" (otherwise referred to as a logic 0 value). Other example data signals where different levels of the magnitude waveform correspond to and/or indicate multi-bit logic values (i.e., logic values that each include two or more digits or bits) may be possible.

For two consecutive data pulses of the data signal DAT, where the two consecutive pulses correspond to different logic levels, the data signal DAT performs a rising transition or a falling transition to transition between the two consecutive data pulses. For the example shown in FIG. 2, where one pulse in the sequence indicates a logic 0 value and a next pulse in the sequence indicates a logic 1 value, the data signal DAT performs a rising transition to transition between the first and second pulses. On the other hand, where one pulse corresponds to a logic 1 value and a next pulse indicates a logic 0 value, the data signal DAT performs a falling transition to transition between the first and second pulses. In addition, where two consecutive pulses indicate the same logic level, then as the pulse sequence transitions from the first data pulse to the next data pulse, the level of the data signal DAT stays the same during those two pulses, and a rising transition or a falling transition may not occur.

Figure 3:
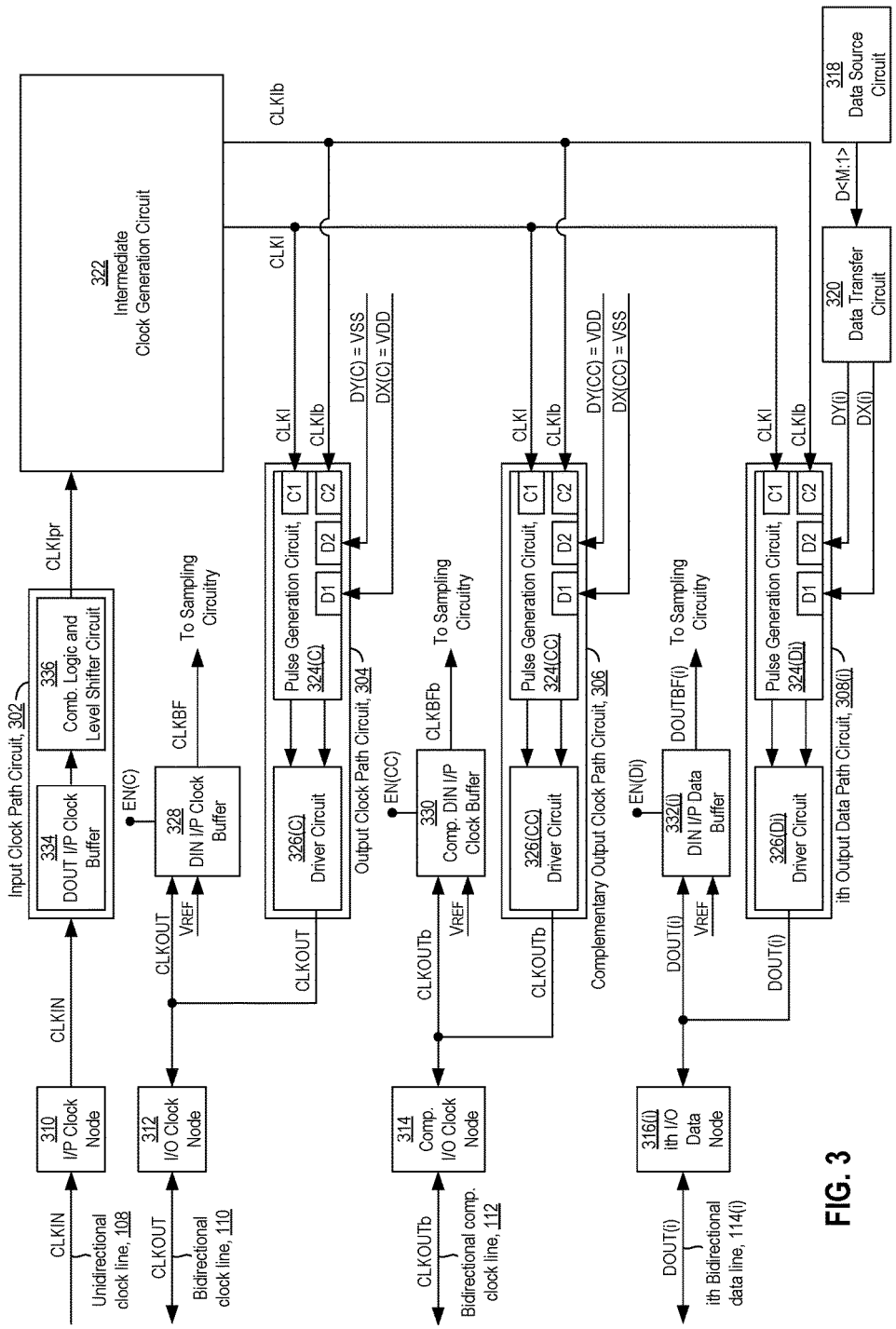
FIG. 3 is a block diagram of components of the data retrieving integrated circuit of FIG. 1.

FIG. 3 shows a block diagram of components of the data retrieving IC 104 used to receive the input clock signal CLKIN and generate the output data signals DOUT and the output clock signals CLKOUT, CLKOUTb. The components of the data retrieving IC 104 include an input clock path circuit 302, an output clock path circuit 304, a complementary output clock path circuit 306, and an N-number of output data path circuits 308. For simplicity, FIG. 3 shows only one of the output data path circuits, an ith output data path circuit 308(i), which is representative of any one of the N-number of output data path circuits 308(i).

In addition, the components of the data retrieving IC 104 further include an input node and a plurality of input/output nodes, including an input clock node 310, an input/output (I/O) clock node 312, a complementary I/O clock node 314, and an N-number of I/O data nodes 316. For simplicity, FIG. 3 shows only one of the I/O data nodes, an ith I/O data node 316(i).

In general, an input node of an integrated circuit is the first component of the integrated circuit to receive an input signal from a location external to the integrated circuit. Prior to propagating at the input node, the signal may propagate over an external conductive transmission line or wirelessly. Also, as used herein, an output node of an integrated circuit is the last component of the integrated circuit to receive an output signal that the integrated circuit generates before the output signal leaves the integrated circuit to an external location that is external to the integrated circuit, either by way of a conductive transmission line or wirelessly.

In addition, as used herein, an input/output node (or I/O node), is a node that functions as both an input node and as an output node. As an input node, the I/O node is the component of the integrated circuit to first receive an input signal from an external location external to the integrated circuit. As an output node, the I/O node is a last component of the integrated circuit to receive an output signal that the integrated circuit generates before the output signal leaves the integrated circuit. Typically, at any given moment in time, the I/O node is functioning either as an input node or as an output node. That is, the I/O node is not simultaneously receiving input and output signals.

Physically, an input node, an output node, or an I/O node is a conductive structure and/or made of a conductive material. In some embodiments, an input node, an output node, or an I/O node of an integrated circuit may be referred to as a pin. In addition, an input node, an output node, or an I/O node may take the form of any of various conductive structures, such as a contact pad, a solder ball (such as of a ball grid array), or a conductive via, as non-limiting examples.

With reference to FIG. 3, the input clock path circuit 302 is configured to receive the input clock signal CLKIN from the unidirectional clock line 108 by way of the input (I/P) clock node 310. The input clock node 310 is the first component of the data retrieving IC 104 to receive the input clock signal CLKIN. In some example configurations, the unidirectional clock line 108 may directly contact the input clock node 310 to communicate the input clock signal CLKIN to the input clock node 310. In other example configurations, another conductive structure (e.g., a wire bond) or collection of conductive structures may form a conductive path between the unidirectional clock line 108 and the input clock node 310 to communicate the input clock signal CLKIN to the input clock node 310. Various configurations for electrically coupling the unidirectional clock line 108 to the input clock node 310 may be possible.

The output clock path circuit 304 is configured to generate the output clock signal CLKOUT and output the output clock signal CLKOUT to the bidirectional clock line 110 by way of the input/output clock node 312. Similarly, the complementary output clock path circuit 306 is configured to generate the complementary output clock signal CLKOUTb and output the complementary output clock signal CLKOUTb to the bidirectional complementary clock line 112 by way of the complementary I/O clock node 314. In addition, the ith output data path circuit 308 is configured to generate the ith output data signal DOUT(i) and output the ith output data signal DOUT(i) to the ith bidirectional data line 114(i) by way of the ith I/O data node 316(i). As previously described, FIG. 3 shows only one of the output data path circuits 308 (i.e., an ith output data path circuit 308(i)) to generate one of the output data signals, the ith DOUT(i). For configurations where the data retrieving IC 104 generates an N-number of output data signals DOUT(1) to DOUT(N), the data retrieving IC 104 may include an N-number of the output data path circuits 308(1) to 308(N) configured to generate the N-number of output data signals DOUT(1) to DOUT(N) and output the output data signals DOUT(1) to DOUT(N) to the N-number of bidirectional data lines 114(1) to 114(N) by way of an N-number of I/O data nodes 316(1) to 316(N).

The data retrieving IC 104 further includes a data source circuit 318 that is storing or otherwise holding or in possession of the data. In other example embodiments, the data source circuit 318 is located external to the data retrieving IC 104 (i.e., the data source circuit 318 is part of another integrated circuit). Example types or configurations of the data source circuit 318 may include latches and/or a memory cell structure of a plurality of memory cells, as non-limiting examples. A memory cell is an element or component that stores a unit of data having an n-bit data value, where n is one or more. Any suitable type of memory can be used for the memory cells. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form a memory cell structure, such as a two-dimensional or three-dimensional memory array, may be located within and/or over a substrate. The substrate may be a wafer over or in which the layer of the memory cells are formed or it may be a carrier substrate which is attached to the memory cells after they are formed. As a non-limiting example, the substrate may include a semiconductor and/or be made of a semiconductor material, such as silicon.

In addition, a plurality of memory cells that form the entire memory cell structure or at least a portion of the memory cell structure may be arranged in two dimensions or in three dimensions. A plurality of memory cells arranged in two dimensions is referred to as a two-dimensional (2-D)

memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory cells in each column. The columns may be arranged in a two dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array, referred to as a memory array. One type of a memory array is an orthogonal array, which is a matrix-like structure that includes rows and columns. The memory cells of the memory array are arranged in the rows and columns. At the intersection of a row and a column is a memory cell. However, in other configurations, the memory cells may be arrayed in non-regular or non-orthogonal configurations.

The data retrieving IC 104 may further include a data transfer circuit 320 that is configured to transfer or communicate the data from the data source circuit 318 to the output data path circuits. In some example configurations, the data source circuit 318 is configured to provide the data to the data transfer circuit 320 in the form of M-bit data signals D<M:1>. The number M may be larger than the number N—i.e., the number of output data signals DOUT communicated in parallel to the data requesting IC 102, and in particular, may M may be a multiple of N. The data transfer circuit 320 is to convert the M-bit data signals D<M:1> to either an N-number of data signals, or to a lower multiple of N. For example, in the example configuration shown in FIG. 3, the data transfer circuit 320 converts the M-bit data signals to 2*N-number of data signals DX, DY. In some example configurations, the data transfer circuit 320 may be configured as a serializer/deserializer (SERDES) circuit in order to perform the conversion.

As shown in FIG. 3, the data transfer circuit 320 outputs ith data signals DX(i), DY(i) to the ith output data path circuit 308(i). Each ith data signal DX(i), DY(i) carries one-bit of data per clock cycle relative to the clock rate of the output clock signals CLKOUT, CLKOUTb. As described in further detail below, the ith output data path circuit 308(i) combines the data pulses of the ith data signals DX(i), DY(i) to generate the ith output data signal DOUT(i) such that the ith output data signal DOUT(i) carries two-bits of data per clock cycle of the output clock signals CLKOUT, CLKOUTb.

The data retrieving IC 104 may further include an intermediate clock generation circuit 322 configured to generate a pair of complementary intermediate clock signals CLKI, CLKIb based on the input clock signal CLKIN, and output the pair of complementary intermediate clock signals CLKI, CLKIb to the output clock and data path circuits 304, 306, 308 for generation of pulses of the output clock and data signals CLKOUT, CLKOUTb, DOUT.

The input clock path 302, in combination with the intermediate clock generation circuit 322, the output clock paths 304, 306 may form a plurality of clock paths extending from the input clock node 310 to the I/O clock nodes 312, 314. In particular, a first clock path may extend from the input clock node 310 to the I/O clock node 312, and include the input clock path circuit 302, the clock generation circuit 322, and the output clock path circuit 304. A second clock path may extend from the input clock node 310 to the complementary I/O clock node 314, and include the input clock path circuit 302, the clock generation circuit 322, and the complementary output clock path circuit 306.

The clock paths may generate a plurality of intermediate clock signals CLKI in response to receipt of the input clock signal CLKIN in order to generate the output clock signals CLKOUT, CLKOUTb and the output data signals DOUT. In general, as used herein, an intermediate signal is a signal that an integrated circuit generates internally in order to generate an output signal. An intermediate signal may be a single-ended signal or a pair of complementary intermediate signals. A pair of complementary input signals are two signals that are both intermediate signals and that are generated complementary two each other. Also, as used herein, intermediate clock signals generated in a clock path before the pair of complementary intermediate clock signals CLKI, CLKIb are generated (or in order to generate the pair of complementary intermediate clock signals CLKI, CLKIb, or on which the pair of complementary intermediate clock signals CLKI, CLKIb are based) are referred to as pre-intermediate clock signals CLKIpr. Similarly, intermediate clock signals generated in a clock path after the pair of complementary intermediate clock signals CLKI, CLKIb are generated (or that are generated based on or in response to the pair of complementary intermediate clock signals CLKI, CLKIb) are referred to as post-intermediate clock signals CLKIpo.

As shown in FIG. 3, each of the output clock path circuit 304, the complementary output clock path circuit 306, and the ith output data path circuit 308(i) includes a respective pulse generation circuit 324 and a respective driver circuit 326. As used herein, a pulse generation circuit is a circuit that generates pulses of an output signal in response to receipt of an input signal. The pulse generation circuit responds to certain triggering features or characteristics of the input signal that cause the pulse generation circuit to perform an action for generation of a pulse. A triggering feature or characteristic is a feature or characteristic of the input signal, an occurrence of which triggers or causes the pulse generation circuit to perform a next action to generate the pulses. An example triggering feature or characteristic may include a triggering transition, such as a rising transition or a falling transition, of the input signal. When the pulse generation circuit detects a triggering transition, the pulse generation circuit performs a next action to generate the pulses. Other triggering features or characteristics may be possible. In general, a triggering feature may be any measurable feature or characteristic of a signal and/or for which occurrences of can be detected. Non-limiting examples of triggering features or characteristics other than transitions may include an amplitude, a frequency, a pulse width, or a duty cycle satisfying a criteria with respect to an associated threshold level, such as by rising above or falling below the threshold level. When a pulse generation circuit detects a triggering feature or characteristic of the input signal, the pulse generation circuit performs a next action to generate the pulses. A next action that a pulse generation performs may include starting a pulse, such as by transitioning the level of the output signal from a low level to a high level, ending a pulse such as by transitioning the level of the output signal from the high level to the low level, or transitioning from one pulse to a next or new pulse, such as by transitioning the level of the output signal from a low level to a high level, from a high level to a low level, or maintaining the level of the output signal.

In addition, a pulse generation circuit may include any of various circuit configurations of circuits configured to generate pulses in response to triggering features of an input signal. Particular example configurations include latches and/or flip flops that generate signals at levels corresponding to levels of input data signals in response to detecting transitions (e.g., rising transitions and/or falling transitions) of clock signals. A pulse generation circuit may also include a combination circuit, such as a multiplexer, that combines two or more signals, including combining their phases, according to triggering features (e.g., rising and/or falling transitions) of clock signals. Such types of pulse generation circuits, by combining two or more signals, may adjust the duty cycles or pulse widths of the pulses they generate based on adjustments or changes in the delay amounts of the clock signals they receive. As described in further detail below with respect to FIG. 4, a duty cycle correction circuit coupled to and/or in communication with such a pulse generation circuit corrects for duty cycle distortion by adjusting delays of clock signals it sends or feeds to the pulse generation circuit in order to correct for duty cycle distortion of a clock signal that the pulse generation circuit participates in generating.

Also, as used herein, a driver circuit is a circuit that increases a strength of an output signal relative to a strength of an input signal. The strength of a signal may be dependent on and/or measured by a feature or characteristic of the signal, such as a current of the signal. Features or characteristics of a signal, such as voltage, frequency, pulse width, or duty cycle, may also or alternatively be features of a signal that a driver circuit increases or otherwise adjusts to increase a strength of an output signal relative to an input signal.

In particular implementations, the driver circuit generates the output signal at an output node that is connected to or is otherwise characterized by a load, which, at least in some embodiments, may be a capacitive load, a resistive load, or have both capacitive and resistive components. The increase in strength increases a rate or speed at which the output signal can transition from a high level to a low level, or from a low level to a high level, when generated across the load, relative to the speed or rate that the input signal would increase and decrease between high and low levels if generated across the same load.

The driver circuit may be configured to receive the input signal at an input node. In addition, the driver circuit may receive the input signal due to another circuit generating the input signal at the input node of the driver circuit. The other circuit may generate the input signal at the input node with an associated strength. For example, the other circuit may conduct current at a certain amount to transition the input signal between high and low levels. The strength of the input signal may depend on and/or be proportionate to the amount of current that the other circuit conducts to generate the input signal at the input node of the driver circuit. In certain embodiments, that strength of the input signal may be insufficient to drive the load connected to or characterizing the output node of the driver circuit, and so the driver circuit generates its output signal with an increased strength, such as with increased current, in order to overcome the insufficient strength of the input signal.

With respect to FIG. 3, a pulse generation circuit 324 of a given output path circuit is configured to generate pulses in response to receipt of the pair of complementary intermediate clock signals CLKI, CLKIb. For example, the pulse generation circuits 324(C), 324(CC) in their respective output clock path circuits 304, 306 may generate clock pulses—including starting the clock pulses, stopping the clock pulses, and transitioning from generating one clock pulse to generating a next clock pulse—in response to receipt and detection of rising transitions and/or falling transitions of the pair of complementary intermediate clock signals CLKI, CLKIb. The pulse generation circuit 324(Di) of the ith output data path circuit 308(*i*) may be configured to generate data pulses—including starting the data pulses, stopping the data pulses, and transitioning from generating one data pulse to generating a next data pulse—in response to receipt and detection of rising transitions and/or falling transitions of the pair of complementary intermediate clock signals CLKI, CLKIb.

Also, as shown in FIG. 3, each pulse generation circuit 324 includes a pair of clock inputs C1, C2 and a pair of data inputs D1, D2. In general, a data input of a pulse generation circuit is an input terminal that receives a signal that determines a level of the pulse that the pulse generation circuit is generating. A clock input of a pulse generation circuit is an input terminal that receives a signal that determines the timing at which the pulse generation circuit generates the pulses, such as when a pulse ends, when a pulse begins, or the rate or times at which the pulse generation circuit transitions from generating one pulse to a next pulse. For each pulse generation circuit 324, each clock input of the pair C1, C2 may receive a respective one of the pair of complementary intermediate clock signals CLKI, CLKIb.

With particular reference to the pulse generation circuit 324(Di) of the ith output data path circuit 308(*i*), the data inputs D1, D2 may be configured to receive the ith pair of data signals DX(i), DY(i) from the data transfer circuit 320, and generate data pulses by combining the data pulses of the ith pair of data signals DX(i), DY(i) in response to detecting transitions of the pair of complementary intermediate clock CLKI, CLKIb so that the data pulses of the ith output data signal DOUT(i) carries two-bits of data per clock pulse of the output clock signals CLKOUT, CLKOUTb. In some example configurations, the pulse generation circuit 324(Di) may be configured to double the pulse rate (or data rate) relative to the pulse rate of the ith pair of data signals DX(i), DY(i) in order to combine the data pulses of the ith pair of data signals DX(i), DY(i), although other ways of combining the data pulses may be possible.

The pulse generation circuit 324(Di) may have any of various configurations to generate the data pulses. In one example configuration, a latch circuit is configured to receive one of the data signals DX(i), DY(i) and a flip flop circuit is configured to receive the other of the data signals DX(i), DY(i). The latch and flip flop circuits may provide their respective outputs to level shifter circuitry, and the level shifter circuitry may provide its outputs to a multiplexer, which generate and output the data pulses of the pulse generation circuit 324(Di). Each of the circuit components may have clock inputs to receive the pair of complementary intermediate clock signals CLKI, CLKIb.

In addition, the pulse generation circuits 324(C), 324(CC) of the output and complementary output clock path circuits 304, 306 may have the same or similar circuit configuration to that of the pulse generation circuit 324(Di) of the ith output data path circuit 308(i) in order to ensure that the paths are matched. As shown in FIG. 3, the data inputs D1, D2 of the pulse generation circuit 324(C) of the output clock path circuit are configured to receive respective first and second data input signals DX(C), DY(C). Similarly, the data inputs D1, D2 of the pulse generation circuit 324(CC) of the complementary output clock path circuit 306 are configured to receive respective first and second data input signals DX(CC), DY(CC). During duty cycle correction, as well as normal operation, the data input signals DX(C), DY(C), DX(CC), DY(CC) are held at certain combinations of a high voltage level VDD and a low voltage level VSS so that the pulses that the pulse generation circuits 324(C), 324(CC) output have a clock pattern (i.e., alternating high and low voltage levels). In particular example configurations, the data inputs D1, D2 of the two pulse generation circuits 324(C), 324(CC) may receive the high and low voltages VDD, VSS in reverse of each other so that the output clock path circuits 304, 306 generate the output clock signals CLKOUT, CLKOUTb as complementary signals. For example, FIG. 3 shows the first data inputs D1 of the output clock path circuit 304 and the complementary output clock path circuit 306 configured to receive the high voltage VDD and the low voltage VSS, respectively, and the second data inputs D2 of the output clock path circuit 304 and the complementary output clock path circuit 306 configured to receive the low voltage VSS and the high voltage VDD, respectively.

Each of the pulse generation circuits 324 may be configured to output their pulses to a respective driver circuit 326. Each driver circuit 326 may be configured to generate a respective one of the output signals CLKOUT, CLKOUTb, DOUT(i) in response to receipt of pulses from a respective one of the pulse generation circuits 324. In particular, a driver circuit 326(C) is configured to generate the output clock signal CLKOUT in response to receipt of clock pulses from the pulse generation circuit 324(C), a driver circuit 326(CC) is configured to generate the complementary output clock signal CLKOUTb in response to receipt of clock pulses from the pulse generation circuit 324(CC), and a driver circuit 326(Di) is configured to generate the ith output data signal DOUT(i) in response to receipt of data pulses from the pulse generation circuit 324(Di).

Each driver circuit 326 may have its output coupled to a respective one of the I/O nodes 312, 314, 316 such that the output signal it generates is generated at the I/O node to which it is coupled. In particular, the driver circuit 326(C) is configured to generate the output clock signal CLKOUT at the I/O clock node 312, the driver circuit 326(CC) is configured to generate the complementary output clock signal CLKOUTb at the complementary I/O clock node 314, and the driver circuit 326(Di) is configured to generate the ith output data signal DOUT(i) at the ith I/O data node 316(i). The I/O nodes 312, 314, 316 then communicate the output signals CLKOUT, CLKOUTb, DOUT(i) over the bidirectional lines 110, 112, 114 to which they are electrically coupled.

In general, the driver circuits 326 are configured to increase the strength of the respective clock and data pulses that they receive from the pulse generation circuits 324 in order to overcome the load capacitance at the I/O nodes. In particular example configurations, the driver circuits 326 increase the strength by increasing the current to generate the clock and data pulses. The driver circuits 326 may have any of various circuit topologies that can increase the strength of the clock and data pulses. In particular example configurations, the driver circuits 326 may each include two stages of pre-driver circuits and an output driver circuit. At least the output driver circuit may be configured as a push-pull circuit that includes one or more p-channel metal-oxide-semiconductor field-effect transistors (PMOS transistors) to pull-up the voltage level to a high voltage level and one or more n-channel metal-oxide-semiconductor field-effect transistors (NMOS transistors) to push down the voltage level to a low voltage level. Accordingly, to generate the output signals CLKOUT, CLKOUTb, DOUT(i), the driver circuits 326 may include push-pull circuits that pull up the voltage levels at the I/O nodes 312, 314, 316 to transition the voltages of the output signals CLKOUT, CLKOUTb, DOUT(i) from the low voltage levels to the high voltage levels and maintain the signals at the high voltage levels, and that push down the voltage levels at the I/O nodes 312, 314, 316 to transition the voltages of the output signals CLKOUT, CLKOUTb, DOUT(i) from the high voltage levels to the low voltage levels and maintain the signals at the low voltage levels.

In at least some example configurations, the timing according to which the driver circuits 326 generate the clock and data pulses CLKOUT, CLKOUTb, DOUT(i) by pulling up and pushing down the voltages at the I/O nodes 312, 314, 316 may depend on the timing of the clock and data pulses received from the pulse generation circuits 324 without being dependent upon any received clock signals. As mentioned, the pulse generation circuits 324 may generate the clock and data pulses in response to rising and/or falling transitions of the pair of complementary intermediate signals CLKI, CLKIb. The driver circuits 326 may rely on the timing of the clock and data pulses received from the pulse generation circuits 324 to operate to pull up and push down the voltages they generate, including the voltages of the output signals CLKOUT, CLKOUTb, DOUT(i) at the I/O nodes 312, 314, 316.

The data retrieving IC 104 may further include a plurality of input (I/P) buffers 328, 330, 332 coupled to the I/O nodes 312, 314, 316. As used herein, an input buffer is a circuit component of an integrated circuit that initially receives an input signal of the integrated circuit. The input buffer may be the circuit component that initially receives the input signal by having an input terminal coupled to an input or an I/O node of the integrated circuit that receives the input signal. The input buffer may be configured to receive the input signal as an analog signal generated on a communication line between two integrated circuits, and convert the analog signal to a digital signal that the integrated circuit receiving the analog signal can use internally. An input buffer may convert the analog signal to a digital signal. The input buffer may do so without distorting the duty cycle or by negligibly or minimally adding duty cycle distortion when generating the digital signal. The digital signal that the input buffer outputs is referred to herein as a buffered signal. For example, an input clock buffer outputs a buffered clock signal, and an input data buffer outputs a buffered data signal. Accordingly, as used herein, a buffered clock signal is a clock signal that an input clock buffer generates in response to receipt of an output clock signal generated and/or received at an output or I/O clock node. In addition, as used herein, a buffered data signal is a data signal that an input data buffer generates in response to receipt of an output data signal generated and/or received at an output or I/O data node.

Additionally, an input buffer may be configured to generate its buffered signal by comparing a first input signal with a second input signal. When the input buffer detects that the first input signal is higher than the second input signal, the input buffer generates its buffered signal at an associated high level, and when then input buffer detects that the first input signal is lower than the second input signal, the input buffer generates its buffered signal at an associated low voltage level. In the example configuration shown in FIG. 3, the second input signal that each input buffer 328, 330, 332 receives is a reference voltage $V_{REF}$. Accordingly, each of the input buffers 328, 330, 332 is configured to generate its respective buffered signal at an associated high level when it detects that its first input signal is higher than the reference voltage $V_{REF}$, and may generate its respective buffered signal at an associated low level when it detects that its first input signal is lower than the reference voltage $V_{REF}$.

In some example configurations, the level of the reference voltage $V_{REF}$ is about half of the signal swing, from the low level to the high level, of the input clock and data signals that the data retrieving IC 104 receives from the data requesting IC 102 by way of the bidirectional clock and data lines 110, 112, 114. In addition or alternatively, the reference voltage $V_{REF}$ is about half a supply voltage Vsupply (not shown) that the data retrieving IC 104 receives from externally, such as from the data requesting IC 102, for example. Various ways of configuring the input buffers 328, 330, 332 to receive the reference voltage $V_{REF}$ may be possible.

The example configuration shown in FIG. 3 shows three input buffers coupled to the I/O nodes 312, 314, 316, including a data-in (DIN) input (I/P) clock buffer 328, a complementary data-in (DIN) input clock buffer 330, and an ith data-in (DIN) input data buffer 332(*i*). The term "data-in" refers to communications between the data requesting IC 102 and the data retrieving IC 104 for performance of a data-in operation to have the data retrieving IC 104 receive data, such as in the form of data signals over the bidirectional data lines 114, from the data requesting IC 102. In some example configurations, the data-in operation may be part of a write operation in which the data retrieving IC 104 is configured to write, program, or otherwise store data that the data retrieving IC 104 receives from the data requesting IC 102 in a storage location, such as in a memory cell structure.

When the data requesting IC 102 wants the data retrieving IC 104 to receive data during a data-in operation, the data requesting IC 102 may send a pair of complementary clock signals over the bidirectional clock lines 110, 112, in parallel and/or simultaneously with data signals over the bidirectional data lines 114. The data signal carry the data that the data requesting IC 102 wants the data retrieving IC 104 to receive. The DIN input buffers 328, 330, 332 are the input buffers of the data retrieving IC 104 that receive the complementary clock signals and the data signals from the data requesting IC 102 by way of the bidirectional clock and data lines 110, 112, 114 and the I/O nodes 312, 314, 316. In response to receipt of the clock and data signals, the DIN input buffers 328, 330, 332 may generate respective buffered clock and data signals. In particular, the DIN input clock buffer 328 may receive a first clock signal of the pair of complementary clock signals from the bidirectional clock line 110 by way of the I/O clock node 312, and in response, generate a buffered clock signal CLKBF. The complementary DIN input clock buffer 330 may receive a second clock signal of the pair of complementary clock signals from the bidirectional clock line 112 by way of the complementary I/O clock node 314, and in response, generate a complementary buffered clock signal CLKBFb. The ith DIN I/O data buffer 332(*i*) may receive an ith data signal from the ith bidirectional data line 114(*i*) by way of the ith I/O data node 316(*i*), and in response, generate a buffered data signal DOUTBF(i).

As indicated in FIG. 3, the DIN input buffers 328, 330, 332 are configured to output their respective buffered clock and data signals CLKBF, CLKBFb, DOUTBF to sampling circuitry, such as latches and/or flip flops, that is configured to sample or otherwise identify, capture, or obtain the data values of the data carried by the data signals for performance of the data-in operation. Although not shown in FIG. 3, the sampling circuitry may be part of a data-in or write path configured to process the data and clock signals in order to perform the data-in operation.

Each of the DIN input buffers 328, 330, 332 may be selectively enabled (or activated) and disabled (or deactivated). When a given DIN input buffer is enabled, the given DIN input buffer is able to generate its buffered signal upon receipt of an output signal from the bidirectional line to which the given DIN input buffer is electrically coupled. Alternatively, when a given DIN input buffer is disabled, the given DIN input buffer is unable to generate its buffered signal. Each of the DIN input buffers 328, 330, 332 may be selectively enabled and disabled in response to receipt of a respective enable control signal EN. Not shown in FIG. 3, a control circuit may be configured to output enable control signals EN(C), EN(CC), EN(Di) to each of the DIN input buffers 328, 330, 332(*i*) to enable or disable each of the DIN input buffers 328, 330, 332(*i*). For example, to perform a data-in operation, the control circuit may enable each of the DIN input buffers so that when the data requesting IC 102 sends the clock signals and data signals over the bidirectional lines 110, 112, 114, the DIN input buffers 328, 330, 332 are enabled to convert the clock and data signals to respective digital, buffered signals CLKBF, CLKBFb, DOUTBF and output the buffered signals CLKBF, CLKBFb, DOUTBF to the sampling circuitry of the data-in paths.

The input clock path circuit 302 may include a data-out (DOUT) input clock buffer and combinational (Comb.) logic and level shifter circuitry 336. The term "data-out" refers to communications between the data requesting IC 102 and the data retrieving IC 104 for performance of a data-out operation to have the data retrieving IC 104 output data, such as in the form of the output data signals DOUT over the bidirectional data lines 114 to the data requesting IC 102. In some example configurations, the data-out operation may be part of a read operation in which the data retrieving IC 104 is configured to read data from a storage location storing the data, such as a memory array of memory cells, and output the read data in the form of the output data signals DOUT to the data requesting IC 102.

When the data requesting IC 102 wants the data retrieving IC 104 to perform a data-out operation, the data requesting IC 102 may send an input clock signal CLKIN over the unidirectional clock line 108. The DOUT input clock buffer 334 may receive the input clock signal CLKIN from the unidirectional clock line 108 by way of the input clock node 310, convert the input clock signal CLKIN to a buffered, digital clock signal, and provide the buffered clock signal to the combinational logic and level shifter circuit 336.

The combinational logic circuit and level shifter circuit 336 may be configured to output a pre-intermediate clock signal CLKIpr to the intermediate clock generation circuit 322 in response to receipt of the input clock signal CLKIN. The intermediate clock generation circuit 322 may be configured to generate and output the pair of complementary intermediate clock signals CLKI, CLKIb in response to receipt of the pre-intermediate clock signal CLKIpr received from the input clock path 302.

The combinational logic portion of the circuit 336 may be configured to delay the buffered clock signal received from the DOUT input clock buffer 334 so that the pair of complementary intermediate clock signals CLKI, CLKIb meet setup and hold requirements, or other timing requirements, in the output and data path circuits 304, 306, 308. The level shifter portion of the circuit 336 may be configured to change voltage domains such that the pre-intermediate clock signal CLKIpr toggles between high and low levels in a different voltage domain compared to the voltage domain in which the input clock signal CLKIN toggles over the unidirectional clock line 108.

Also, although not shown in FIG. 3, the input clock path circuit 302 may also be configured to generate a second clock signal based on the input clock signal CLKIN, and output the second clock signal to the data source circuit 318 and/or to the data transfer circuit 320. In turn, the data source circuit 318 and/or the data transfer circuit 320 may use the second clock signal to transfer the data D<M:1> and the/or data signals DX(i), DY(i) to the ith output data path circuit 308(i).

Accordingly, when the data requesting IC 102 wants to receive data from the data retrieving IC 104, such as through performance of a data-out operation, the data requesting IC 102 may output an input clock signal CLKIN over the unidirectional clock line 108. The input clock path 302 may receive the input clock signal CLK from the unidirectional clock line 108 by way of the input clock node 310, and in response, generate and output the pre-intermediate clock signal CLKIpr. The intermediate clock generation circuit 322 may receive the pre-intermediate clock signal CLKIpr from the input clock path circuit 302, and in response, generate the pair of complementary intermediate clock signals CLKI, CLKIb. The output clock path circuit 304, the complementary output clock path circuit 306, and the N-number of output data path circuits 308, including the ith output data path circuit 308(i), may each receive the pair of complementary intermediate clock signals CLKI, CLKIb, and in response, generate the pair of complementary output clock signals CLKOUT, CLKOUTb, and the N-number output data signals DOUT, including the ith output data signal DOUT(i), at the I/O clock and data nodes 312, 314, 316. The bidirectional clock lines 110, 112, 114 may communicate the pair of complementary output clock signals CLKOUT, CLKOUTb and the output data signals DOUT from the data retrieving IC 104 to the data requesting IC 102. The data requesting IC 102 may use the complementary output clock signals CLKOUT, CLKOUTb to identify the voltage levels of the data pulses of the output data signals DOUT in order to identify the data values of the data that the data requesting IC 102 has requested.

In order to accurately identify the voltage levels of the output data signals DOUT, and in turn the data values of the data, the data requesting IC 102 may want to receive the pair of complementary output clock signals CLKOUT, CLKOUTb with their duty cycles at a target duty cycle level, such as 50% for example. Conversely, the farther away that the actual duty cycles of the pair of complementary output clock signals CLKOUT, CLKOUTb are from the target duty cycle level, the greater the likelihood that the data requesting IC will identify wrong data values of the data. Accordingly, in order to minimize the amount of errors in the data transfer from the data retrieving IC 104 to the data requesting IC 102, it is desirable for the data retrieving IC 104 may want to output the pair of complementary output clock signals CLKOUT, CLKOUTb with actual duty cycles that are at or as close to the target duty cycle level as possible.

In general, a clock signal that has a duty cycle different than the target duty cycle level has duty cycle distortion or a distorted duty cycle. An amount that the duty cycle of the clock signal is away or different from the target duty cycle level is referred to as an amount of duty cycle distortion or an amount of duty cycle error. The duty cycle of a clock signal may be an instantaneous value that indicates a single duty cycle level of a single cycle or period of the clock signal. Alternatively, the duty cycle of a clock signal may be an average value that indicates an average duty cycle of or over a plurality of cycles or periods of the clock signal. Accordingly, an amount of duty cycle distortion may be an instantaneous value for a single cycle or period of a clock signal, or may be an average value for a plurality of cycles of periods of a clock signal.

In addition, in order to maximize the likelihood that the data requesting IC 102 accurately identifies the voltage levels of the output data signals DOUT, and in turn the data values of the data, the data requesting IC 102 is to receive the output data signals DOUT in parallel with the pair of complementary output clock signals CLKOUT, CLKOUTb in accordance with one or more target timing relationships. As used herein, a target timing relationship is a timing relationship between two signals that identifies a target time difference between cycles or pulses of the two signals. For communication of output clock and data signals between the data requesting IC 102 and the data retrieving IC 104, a target timing relationship defines a target time difference that two of the output signals are to have to maximize the number of data values that the data requesting IC 102 correctly identifies during a data-out operation, or to maximize the number of data values that the data retrieving IC 104 correctly identifies during a data-in operation.

A target time difference defined by a timing relationship is an amount of time or a time period that can be quantified in units of time (e.g., milliseconds (ms), microseconds (as), nanoseconds (ns), picoseconds (ps), etc.), or quantified in units of phase, such as a number of degrees or a number of radians. A target time difference quantified in terms of units of phase may also be referred to as a target phase difference.

A target timing relationship may define a target time difference for two clock signals or for a clock signal and a data signal. A target timing relationship for two clock signals is typically defined for a pair of complementary clock signals, in which case the target time difference is a target phase difference of 180 degrees (meaning that while one clock signal is at the high level the other is at the low level, and when one clock signal is performing a rising transition the other is performing a falling transition), although other target timing relationships for two clock signals other than complementary clock signals may be possible.

A target timing relationship for a clock signal and a data signal defines a target time difference between when target transitions of the clock signal are to occur relative to when data pulses of the data signal occur. The target transitions can be rising transitions, falling transitions, or both rising and falling transitions of the clock signal. As an example, a target timing relationship defining a target time difference as a target phase difference of 0 degrees defines a zero degree phase shift, phase difference, or time difference between the target transitions of the clock signal and when the data pulses of the data signal start and stop, the target transitions of the clock signal are to be in direct alignment with the edges or transitions of the data pulses, and/or that the target transitions of the clock signal occur at the same time as the transitions or edges of the data signal. As another example, a target timing relationship defining a target time difference as a target phase difference of 90 degrees defines a 90-degree phase difference or phase shift between the target transitions of the clock signal and transitions or edges or the data pulses of the data signal, or that the target transitions of the clock signal occur in the middle of the durations of the data pulses of the data signal.

Hereafter, for clarity and unless expressed otherwise, the target timing difference defined by a target timing relationship is referred as a target difference that can be quantified either in terms of units of time or in units of phase.

With respect to the output clock and data signals CLKOUT, CLKOUTb, DOUT that the data retrieving IC 104 sends to the data requesting IC 102 for performance of a data-out operation, target timing relationships may be established or set between the two complementary clock signals CLKOUT, CLKOUTb, and between one or both of the complementary clock signals CLKOUT, CLKOUTb and each of the output data signals DOUT. Given that the two clock signals CLKOUT, CLKOUTb are complementary, the target difference for the two complementary clock signals CLKOUT, CLKOUTb is 180 degrees. For at least some example configurations, a target difference between one or both of the clock signals CLKOUT, CLKOUTb and each of the output data signals DOUT is 0 degrees, although other target differences for other configurations may be possible.

Ideally, the data retrieving IC 104 transmits the output signals CLKOUT, CLKOUTb, DOUT according to the target timing relationships. In actuality, however, skew may exist between the output clock signals CLKOUT, CLKOUTb and/or between one or both of the output clock signals CLKOUT, CLKOUTb and one or more of the output data signals DOUT. In general, skew is a difference between an actual difference and a target difference between two signals. Like the target difference, an actual difference is a time difference, quantified in units of time or units of phase, between two clock signals or between a clock signal and a data signal. Two signals that have an actual difference that is different than their target difference have skew between them. Conversely, two signals that have an actual difference that is the same as their target difference do not have skew between them.

An amount of skew of the two signals is the amount of difference between the actual difference and the target difference. An amount of skew between two signals may be an instantaneous value or an average value. An instantaneous amount of skew is a single value or amount of difference, such as a time difference or a phase difference, between a pair of edges of the two signals. An average amount of skew is an average value or average amount of difference between multiple pairs of edges of the two signals.

In order to maximize the likelihood that the data requesting IC 102 identifies the correct data values indicated by the data pulses of the output data signals DOUT during a data-out operation, the data retrieving IC 104 desirably outputs the output signals CLKOUT, CLKOUTb, DOUT without duty cycle distortion or skew. Ideally, during a data-out operation, the data retrieving IC 104 receives the input clock signal CLKIN at the target duty cycle, generates all of its intermediate clock signals at the target duty cycle such that the output clock path circuits 304, 306 and the output data path circuits 308 (including the ith output data path circuit 308(i)) generate the complementary output clock signals CLKOUT, CLKOUTb and the output data signals DOUT with no duty cycle distortion or skew.

In actuality, however, due to any of various process-voltage-temperature (PVT) variations, fluctuations, or imperfections in the system 100, the data retrieving IC 104 may output the complementary output clock signals CLKOUT, CLKOUTb and the output data signals DOUT with duty cycle distortion or skew, should a duty cycle correction process or a skew correction process not be performed. A duty cycle process is a process that reduces duty cycle distortion of a sample clock signal by moving an actual, detected, and/or measured duty cycle of the sample clock signal to a target duty cycle level. A sample clock signal may be any clock signal for which a duty cycle is measured. With particular reference to the data retrieving IC 104, the sample clock signal may be the input clock signal CLKIN, any of the intermediate clock signals (such as the pre-intermediate clock signal CLKIpr or the pair of complementary intermediate clock signals), either of the complementary output clock signals CLKOUT, CLKOUTb, or either of the complementary buffered clock signals CLKBF, CLKBFb.

Additionally, a skew correction process is a process that reduces skew between two sample signals by moving an actual, detected, and/or measured difference between the two sample signals to a target difference. The two sample signals may be any two signals for which a phase relationship may be measured. With particular reference to the data retrieving IC 104, the two signals may be any pair of complementary signals (such as the pair of complementary intermediate clock signals CLKI, CLKIb, the pair of complementary output clock signals CLKOUT, CLKOUTb, or the pair of complementary buffered clock signals CLKBF, CLKBFb), or any pair of a clock signal and a data signal (such as one of the output clock signals CLKOUT or CLKOUTb and one of the output data signals DOUT, or one of the buffered clock signals CLKBF, CLKBFb and one of the buffered data signals DOUTBF).

To perform a duty cycle correction process, the data retrieving IC 104 may include a duty cycle correction circuit that identifies, detects, or measures a duty cycle of a sample clock signal, and that performs one or more actions to move the duty cycle of the sample clock signal from a current duty cycle level to a target duty cycle level. The data retrieving IC 104, with the duty cycle correction circuit, may perform a duty cycle correction process over a number of iterations or over a predetermined time period. The duty cycle correction process may end when the duty cycle correction circuit determines that the target duty cycle level has been reached or the predetermined time period has expired.

In addition, to perform a skew correction process, the data retrieving IC 104 may include a skew correction circuit that identifies, detects, or measures an actual difference between two sample signals, and that performs one or more actions to move the actual difference from a current difference level to a target difference level. The data retrieving IC 104, with the skew correction circuit, may perform a skew correction process over a number of iterations or over a predetermined time period. The skew correction process may end when the skew correction circuit determines that the actual difference between the two sample signals has reached the target difference level or the predetermined time period has expired.

Ideally, the sample signals of the duty cycle correction process and/or the skew correction process are the output clock and data signals CLKOUT, CLKOUTb, DOUT since those are the signals that the data retrieving IC 104 outputs onto the bidirectional lines 110, 112, 114 for transmission to the data requesting IC 102. However, implementing duty cycle correction circuitry and/or skew correction circuitry near the I/O clock and data nodes to identify the duty cycle and/or skew of those output signals may not be feasible due to certain packaging constraints, undesirable increases in I/O node (e.g., pin) capacitance, the positioning of the I/O nodes, and the need to position the driver circuits 326 as close to the I/O nodes as possible. Also, the separate pull-up and pushdown paths of the driver circuits 326 may make identification of duty cycles and skew for signals that the driver circuits 326 generate difficult. Moreover, since the complementary intermediate clock signals CLKI, CLKIb, and not the complementary output clock signals CLKOUT, CLKOUTb, determine the timing of the data pulses of the output data signals DOUT, performing duty cycle correction on the complementary output clock signals CLKOUT, CLKOUTb may alter the timing between the output clock signals CLKOUT, CLKOUTb and the output data signals DOUT in a way that creates timing (e.g., setup and hold) violations.

The following embodiments describe non-localized duty cycle and skew correction circuits that correct for duty cycle distortion and skew in the clock and data output signals CLKOUT, CLKOUTb, DOUT that the data retrieving IC 104 sends to the data requesting IC 102 during and/or for performance of a data-out operation. The duty cycle and skew correction circuits are non-localized in that they perform actions on signals other than the clock and data output signals CLKOUT, CLKOUTb, DOUT in order to correct for duty cycle distortion and skew in the clock and data output signals CLKOUT, CLKOUTb, DOUT. The actions that are performed are delaying actions, and the signals that are delayed are intermediate clock signals.

The duty cycle and skew correction circuits form at least a part of the intermediate clock generation circuit 322 configured to output the complementary intermediate signals CLKI, CLKIb to the output clock and data path circuits. In order to measure the duty cycle distortion and skew in the output clock signals CLKOUT, CLKOUTb, the duty cycle and skew correction circuits leverage the DIN input clock and data buffers 328, 330, 332 that are otherwise disabled during data-out operations. Enabled, the DIN input buffers 328, 330, 332 may receive the output clock and data signals CLKOUT, CLKOUTb, DOUT that the output clock and data path circuits generate at the I/O clock and data nodes, and generate buffered signals CLKBF, CLKBFb, DOUTBF in response to receipt of the output clock and data signals CLKOUT, CLKOUTb, DOUT. The data cycle and skew correction circuits may be configured to receive or intercept the buffered signals CLKBF, CLKBFb, DOUTBF in order to identify the duty cycle levels and phase differences in the buffered signals CLKBF, CLKBFb, DOUTBF. The buffered signals CLKBF, CLKBFb, DOUTBF may have duty cycles and phase differences that are the same as or sufficiently close to the duty cycles and phase differences of the output clock and data signals CLKOUT, CLKOUTb, DOUT such that detecting the duty cycles and phase differences of the buffered signals effectively detects and corrects for duty cycle distortion and skew in the output clock and data signals CLKOUT, CLKOUTb, DOUT.

Figure 4:
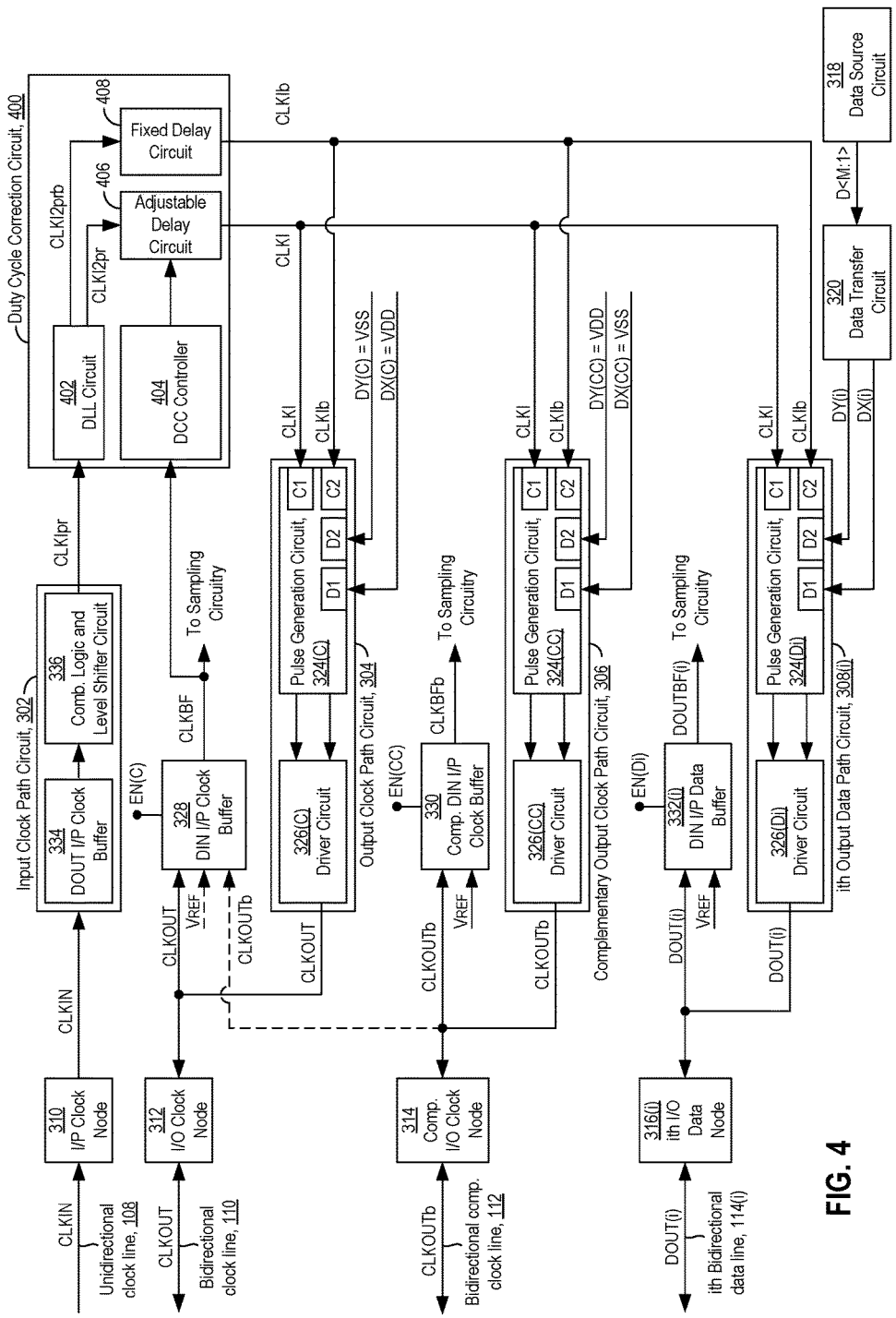
FIG. 4 is a block diagram of the components of the data retrieving integrated circuit of FIG. 3, with a duty cycle correction circuit.
Figure 5:
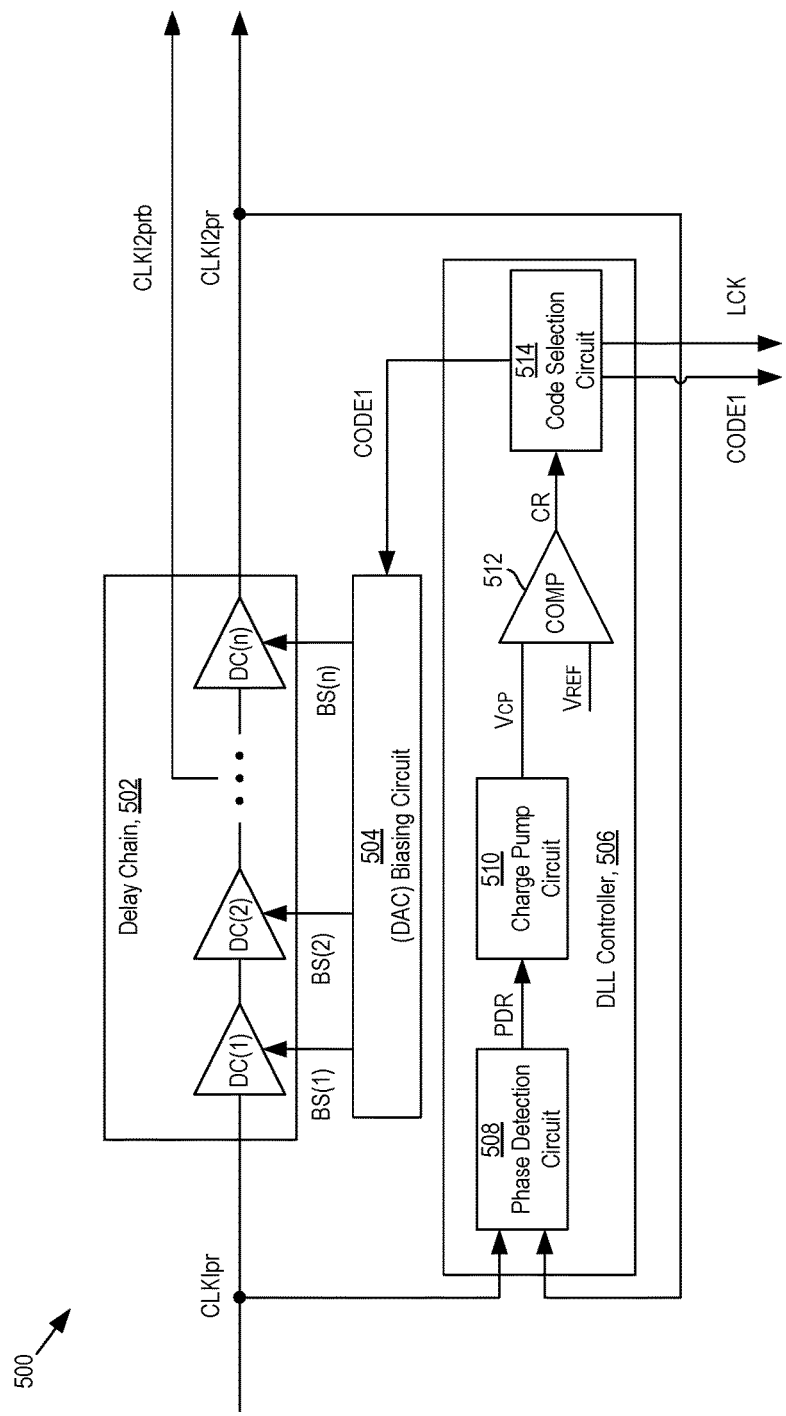
FIG. 5 is a block diagram of an example configuration of a delay-locked loop circuit of the duty cycle correction circuit of FIG. 4.
Figure 6:
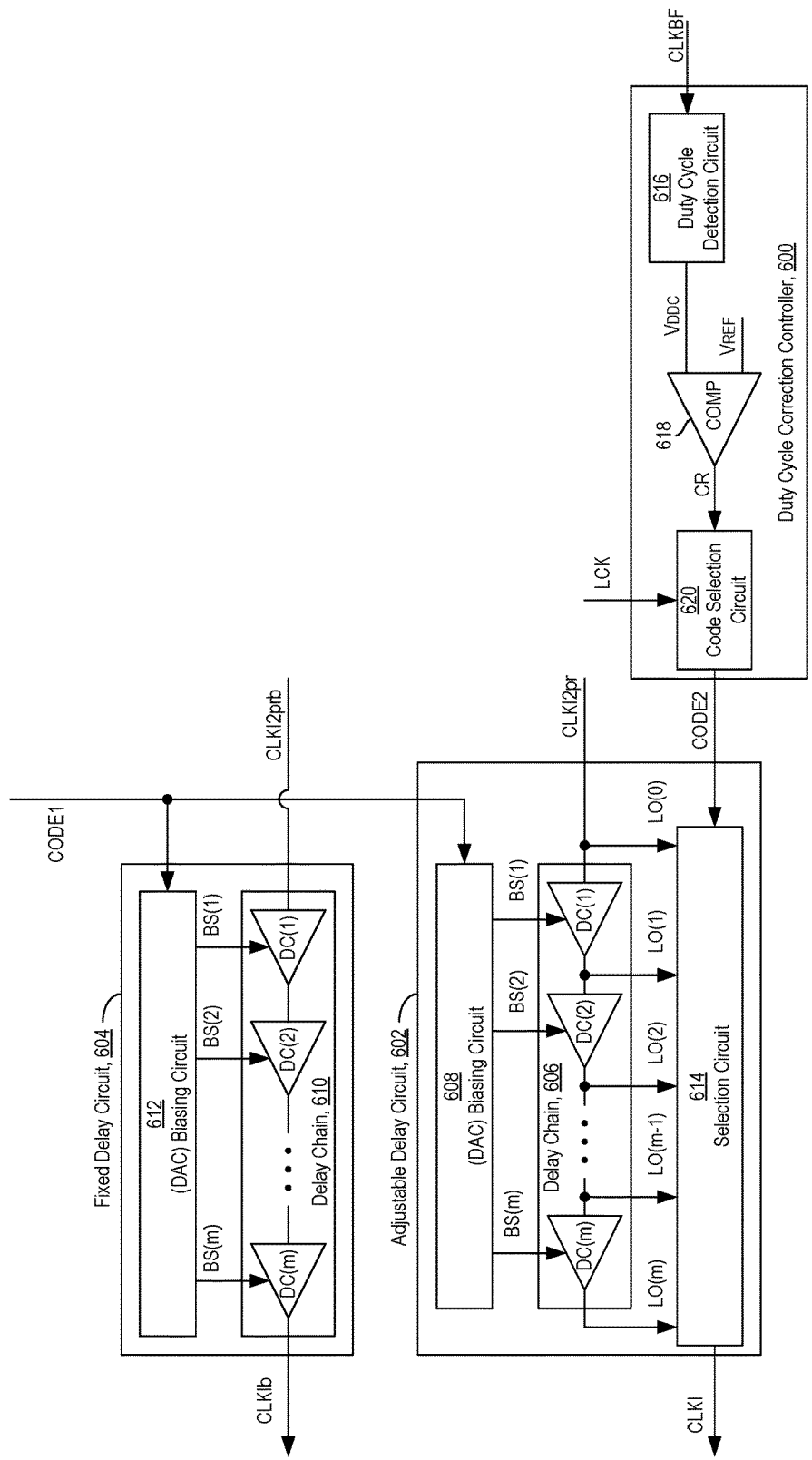
FIG. 6 is a block diagram of example configurations of a duty cycle correction controller, an adjustable delay circuit, and a fixed delay circuit of the duty cycle correction circuit of FIG. 4.
Figure 7:
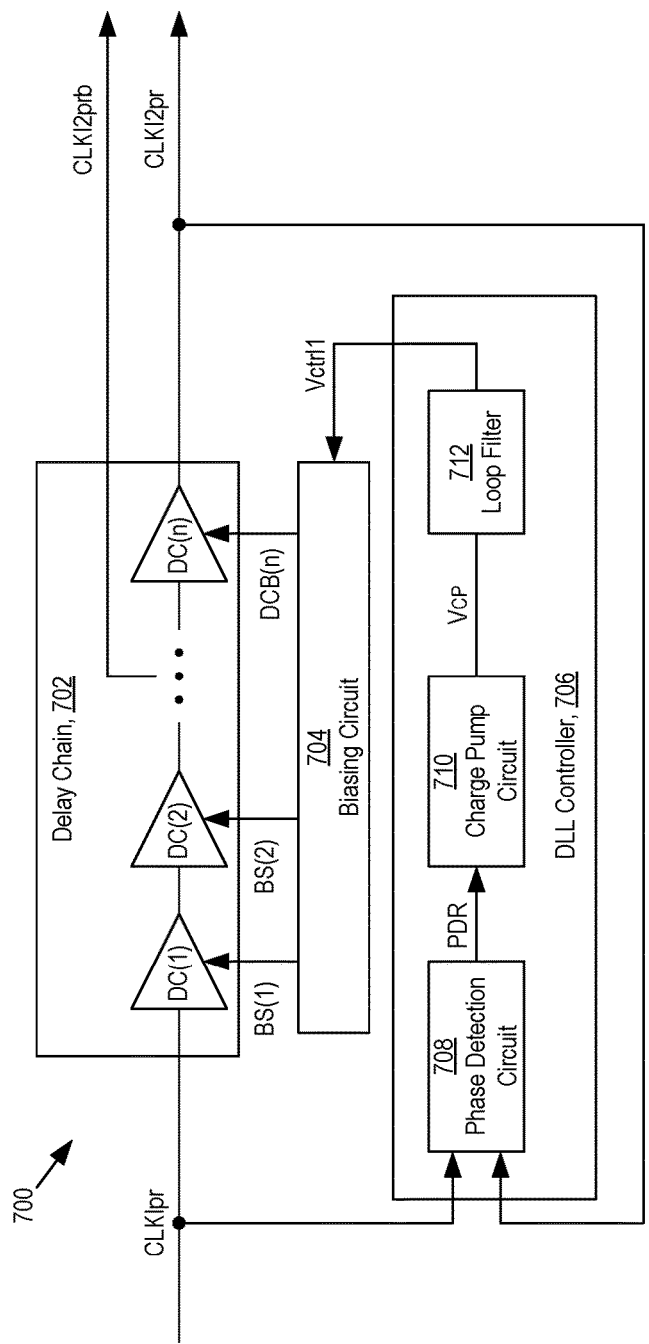
FIG. 7 is a block diagram of another example configuration of a delay-locked loop circuit of the duty cycle correction circuit of FIG. 4.
Figure 8:
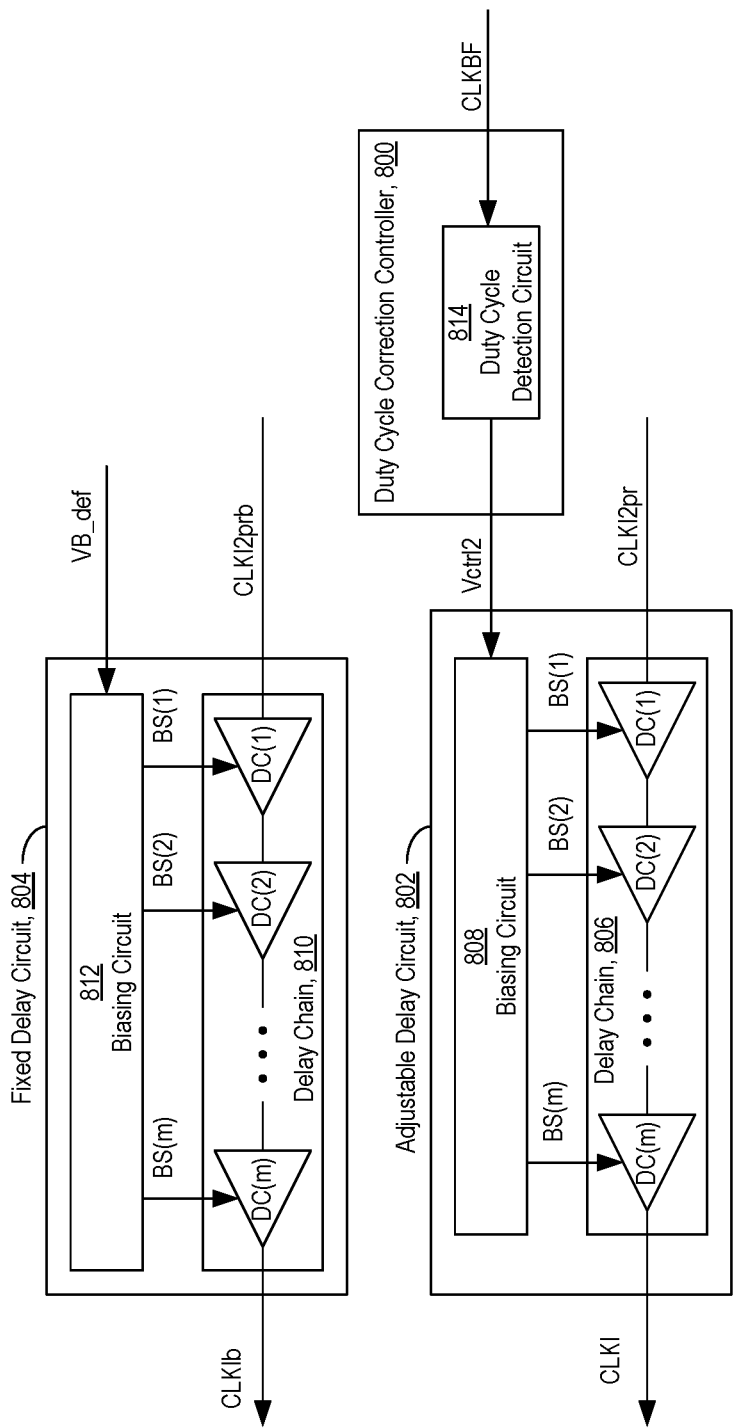
FIG. 8 is a block diagram of other example configurations of a duty cycle correction controller, an adjustable delay circuit, and a fixed delay circuit of the duty cycle correction circuit of FIG. 4.
Figure 9:
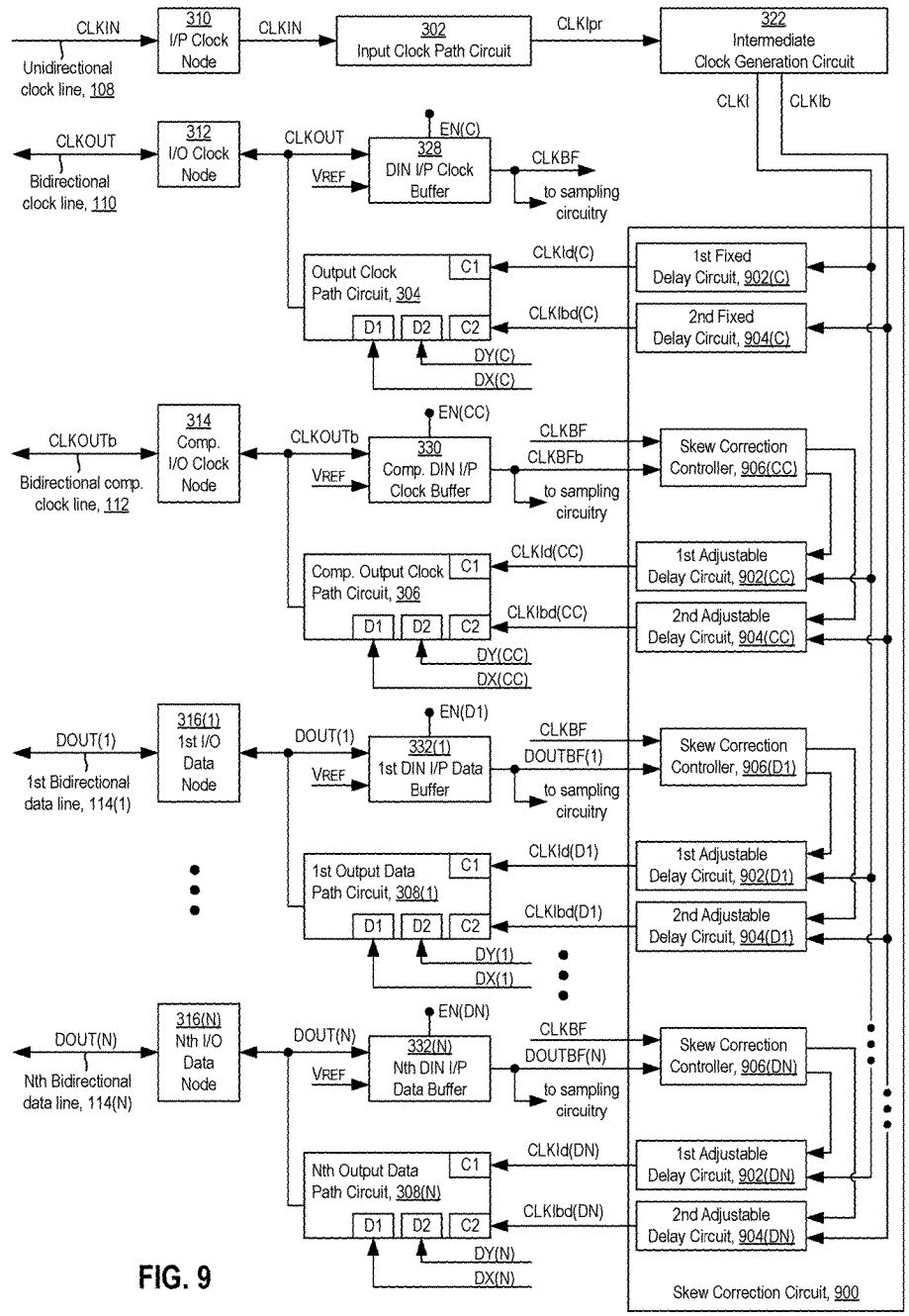
FIG. 9 is a block diagram of the components of the data retrieving integrated circuit of FIG. 3, with a skew correction circuit.
Figure 10:
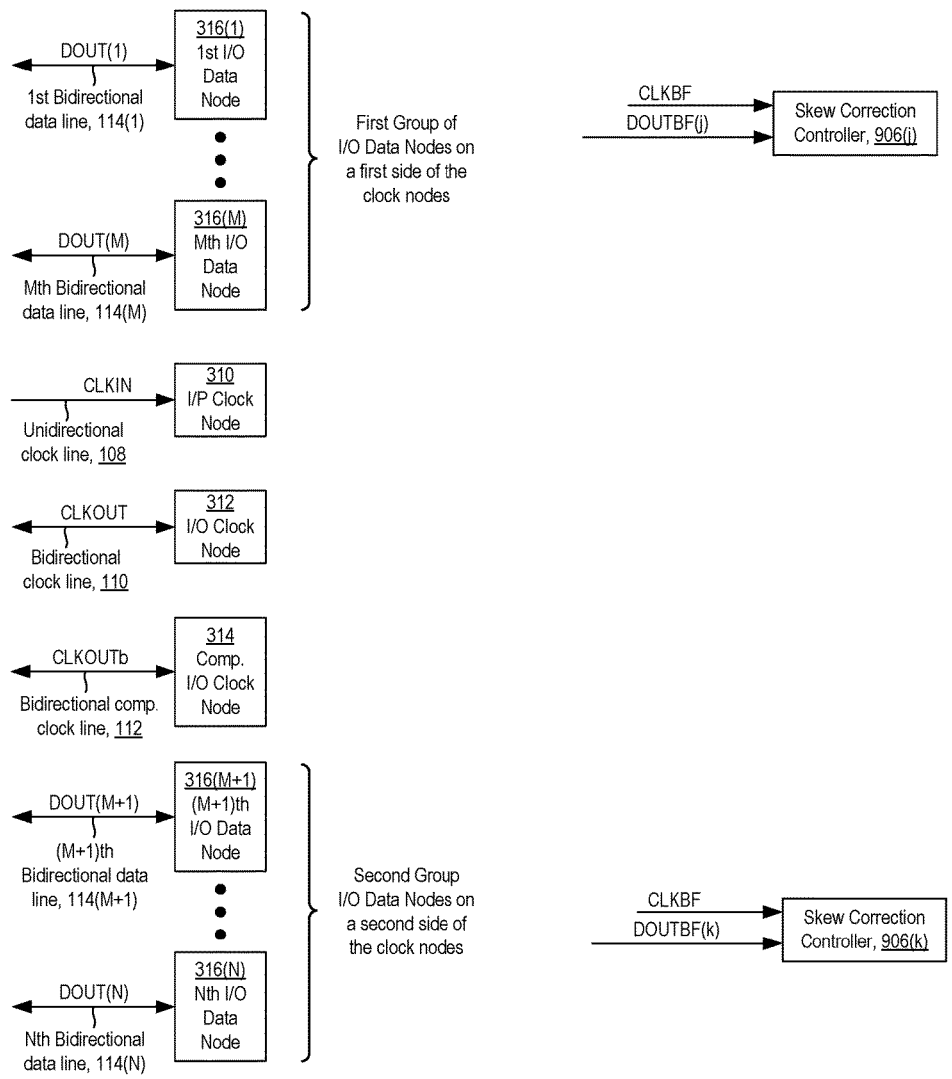
FIG. 10 is a block diagram of some of the components of the data retrieving integrated circuit of FIG. 3, illustrating another example configuration of a skew correction circuit that detects phase differences for output data signals generated on data nodes positioned on opposite sides of clock nodes.
Figure 11:
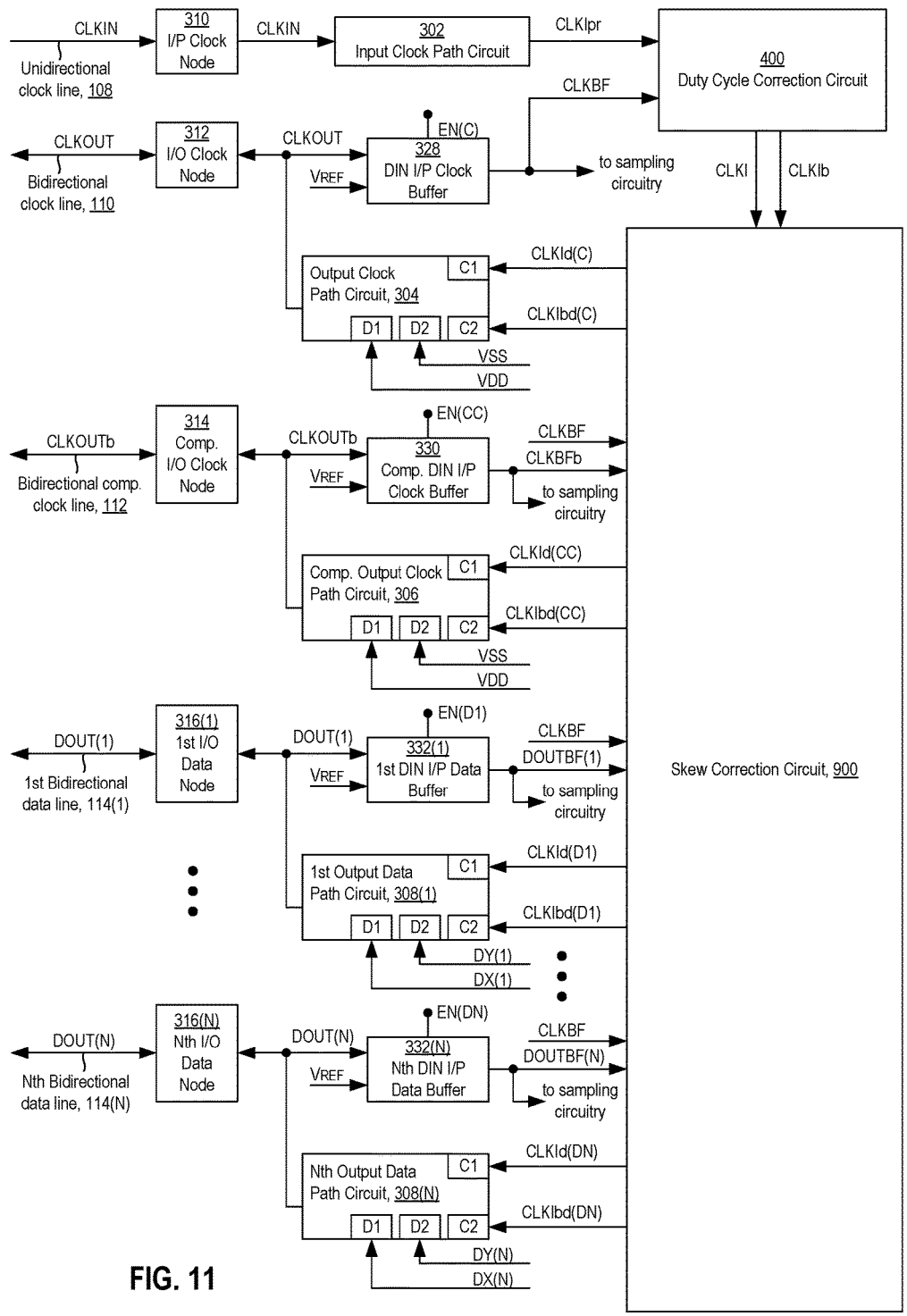
FIG. 11 is a block diagram of the components of the data retrieving integrated circuit of FIG. 3, with a combination of a duty cycle correction circuit and a skew correction circuit.

FIG. 4 describes an embodiment of the data retrieving IC 104 that includes a duty cycle correction circuit integrated with the components of the data retrieving IC 104. FIGS. 5 and 6 show example configurations of a digital delay-locked loop (DLL) circuit, digital adjustable and fixed delay circuits, and a duty cycle correction controller for the digital DLL and delay circuits that can be implemented for the duty cycle correction circuit of FIG. 4. FIGS. 7 and 8 show example configurations of an analog delay-locked loop circuit, analog adjustable and fixed delay circuits, and a duty cycle correction controller for the analog DLL and delay circuits that can be implemented for the duty cycle correction circuit of FIG. 4. FIG. 9 describes another embodiment of the data retrieving IC 104 that includes a skew correction circuit integrated with the components of the data retrieving IC 104. FIG. 10 shows an example of how the skew correction circuit in FIG. 9 can be modified corresponding to a physical layout of the I/O nodes of the data retrieving IC 104. FIG. 11 describes a third embodiment of the data retrieving IC 104 that includes both the duty cycle correction circuit of FIG. 4 and the skew correction circuit of FIG. 9.

In further detail, FIG. 4 is a block diagram of the circuit components of the data retrieving IC 104 in FIG. 3, with a duty cycle correction (DCC) circuit 400 replacing or forming the intermediate clock generation circuit 322. The duty cycle correction circuit 400 includes a delay-locked loop (DLL) circuit 402, a duty cycle correction (DCC) controller 404, an adjustable delay circuit 406, and a fixed delay circuit 408.

In general, a DLL circuit is a circuit that locks a delay by which to delay an input signal to a locked delay amount. The locked delay amount may be dependent on the input signal, and in particular a number of cycles or periods of the input signal. In particular example configurations, the locked delay amount is one cycle or period of the input signal. The DLL circuit may operate in a search phase and in a locked phase. In the search phase, the DLL circuit searches for a locked bias setting that causes the DLL circuit to delay the input signal by the locked delay amount. During the search phase, the DLL circuit may adjust a bias setting to adjust the delay of the DLL circuit until it identifies that a current bias setting is the locked bias setting, or it identifies a predetermined time period to search for the locked delay amount has expired. The DLL circuit may identify that a current bias setting is the locked bias setting by identifying that is has delayed the input signal by the locked delay amount.

The DLL circuit 402 of the duty cycle correction circuit 400 of FIG. 4 is configured to receive the pre-intermediate clock signal CLKIpr from the input clock path circuit 302 as its input signal. Otherwise stated, the input clock path circuit 302 is configured to output the pre-intermediate clock signal CLKIpr to the DLL circuit 402. In the search phase, the DLL circuit 402 may be configured to search for the locked delay amount by adjusting a bias setting until the DLL circuit 402 identifies a locked bias setting that causes the DLL circuit 402 to delay the pre-intermediate clock signal CLKIpr by the locked delay amount, or until a predetermined time period has expired. When the DLL circuit 402 identifies the locked bias setting or the predetermined time period has expired, the DLL circuit 402 may transition from the search phase to the locked phase. In at least some example configurations, the DLL circuit 402 maintains or keeps constant a current bias setting upon transitioning to and operating in the locked phase.

In a particular example configuration, the locked delay amount may be one cycle or period of the pre-intermediate clock signal CLKIpr. Accordingly, in the search phase, the DLL circuit 402 searches for a locked bias setting that causes the DLL circuit 402 to delay the pre-intermediate clock signal CLKIpr by one cycle or period of the pre-intermediate clock signal CLKIpr.

In addition, the DLL circuit 402 may be configured to output a pair of complementary second pre-intermediate clock signals CLKI2*pr*, CLKI2*prb*, also referred to as a pair of complementary delay-locked clock signals. The DLL circuit 402 may be configured to use one of the delay-locked clock signals CLKI2*pr*, CLKI2*prb* to determine how to adjust the bias setting and/or to identify when the DLL circuit 402 has found the locked bias setting. For example, the DLL circuit 402 may be configured to determine a phase difference between the pre-intermediate clock signal CLKIpr and a first delay-locked clock signal CLKI2*pr* of the pair in order to determine how to adjust the bias setting. In addition or alternatively, the DLL circuit 402 may be configured to determine that it is delaying the first delay-locked clock signal CLKI2*pr* by the locked delay amount, and in response, determine that it has found the locked bias setting and transition to the locked phase. A second delay-locked clock signal CLKI2*prb* is a clock signal that the DLL circuit 402 is configured to generate that has a phase shift of 180 degrees relative to the first delayed-locked clock signal CLKI2*pr* so that the two delay-locked clock signals CLKI2*pr*, CLKI2*prb* that the DLL circuit 402 outputs are complementary to each other.

The adjustable delay circuit 406 is configured to receive the first delay-locked clock signal CLKI2*pr*, and the fixed delay circuit 408 is configured to receive the second delay-locked clock signal CLKI2*prb*. In general, a delay circuit is a circuit that is configured to delay an input signal by a delay amount to generate and output a delayed signal. Where the input signal is a clock signal, the delayed signal is referred to as a delayed clock signal. Where the input signal is a data signal, the delayed signal is referred to as a delayed data signal. In addition, the input signal may include a sequence of pulses. For example, an input clock signal includes a sequence of clock pulses. Each pulse of the sequence of pulses has a relative temporal position in the sequence relative to the other pulses. Assuming that the sequence of pulses propagates over a given point of a conductive path, the relative temporal positions of the pulses indicates when the pulses propagate over the given point relative to when the other pulses propagate over the given point. The delayed signal that the delay circuit outputs also has a sequence of pulses, with each pulse having a relative temporal position in the sequence relative to the other pulses. The delay circuit includes an input terminal at which the delay circuit receives the input signal and an output terminal at which the delay circuit generates the delayed signal. In addition, the delay circuit is configured with a delay amount, which is the amount by which the delay circuit delays the input signal to generate the delayed signal at its output terminal. Accordingly, the delay circuit generates the delayed signal at its output terminal by delaying each of the pulses of the input signal by the delay amount. As a result, for each of the pulses of the delayed signal, a time at which the delay circuit generates a given pulse of the delayed signal at the output terminal occurs later in time, equal in duration to the delay amount, from the time that the delay circuit received the pulse of the input signal having the same temporal position in its sequence as the given pulse of the delayed signal.

In addition, as used herein, an adjustable delay circuit is a delay circuit that is configured to adjust its delay amount during a duty cycle correction process or a skew correction process, and a fixed delay circuit is a delay circuit that is configured to maintain its delay amount at a fixed or constant value during the duty cycle correction process or the skew correction process.

With respect to the delay circuits 406, 408 of the duty cycle correction circuit 400, the adjustable delay circuit 406 is configured to receive the first delay-locked clock signal CLKI2*pr* as its input signal, and to delay the first delay-locked clock signal CLKI2*pr* to generate the first intermediate clock signal CLKI as its delayed signal. The fixed delay circuit 408 is configured to receive the second delay-locked clock signal CLKI2*prb* as its input signal, and to delay the second delay-locked clock signal CLKI2*prd* to generate the second intermediate clock signal CLKIb as its delayed signal.

The duty cycle correction controller 404 is a control circuit that controls the delay amount by which the adjustable delay circuit 406 delays the first delay-locked clock signal CLKI2*p*. During a duty cycle detection process to correct for duty cycle distortion in the output clock signal CLKOUT, the duty cycle correction controller 404 identifies, detects, and/or measures a duty cycle level of the output clock signal CLKOUT. The duty cycle correction controller 404 is configured to detect the duty cycle level of the output clock signal CLKOUT by detecting a duty cycle level of the buffered clock signal CLKBF that the DIN input clock buffer 328 generates in response to receipt of the output clock signal CLKOUT.

As described in further detail below, the duty cycle correction controller 404 is configured to correct for duty cycle distortion by delaying the adjustable delay circuit 406 relative to the fixed delay circuit 408. In particular example configurations, the duty cycle correction controller 404 leaves a delay amount of the fixed delay circuit 408 fixed while adjusting a delay amount of the adjustable delay circuit 406 based on the detected duty cycle level of the buffered clock signal CLKBF. The duty cycle correction controller 404 corrects for duty cycle by adjusting the delay amount of the adjustable delay circuit 406 in that the output clock path circuit 304, via its pulse generation circuit 324(C) receiving the pair of complementary clock signals CLKI, CLKIb, combines those signals to generate the output clock signal CLKOUT. Through the duty cycle correction circuit 400 delaying one of the complementary intermediate clock signals CLKI, CLKIb relative to the other during the duty cycle correction process, the pulse generation circuit 324(C), in response, adjusts timings of one of the rising edges or the falling edges through the combination, resulting in an adjustment of the duty cycle of the output clock signal CLKOUT. The duty cycle correction controller 404 controls the delaying of the adjustable delay circuit 406 relative to the fixed delay circuit so whichever of the rising or falling edges that is adjusted as a result of the combining occurs earlier or later so that the duty cycle of the output clock signal CLKOUT moves toward the target duty cycle level and duty cycle distortion is eliminated or corrected.

Figure 12:
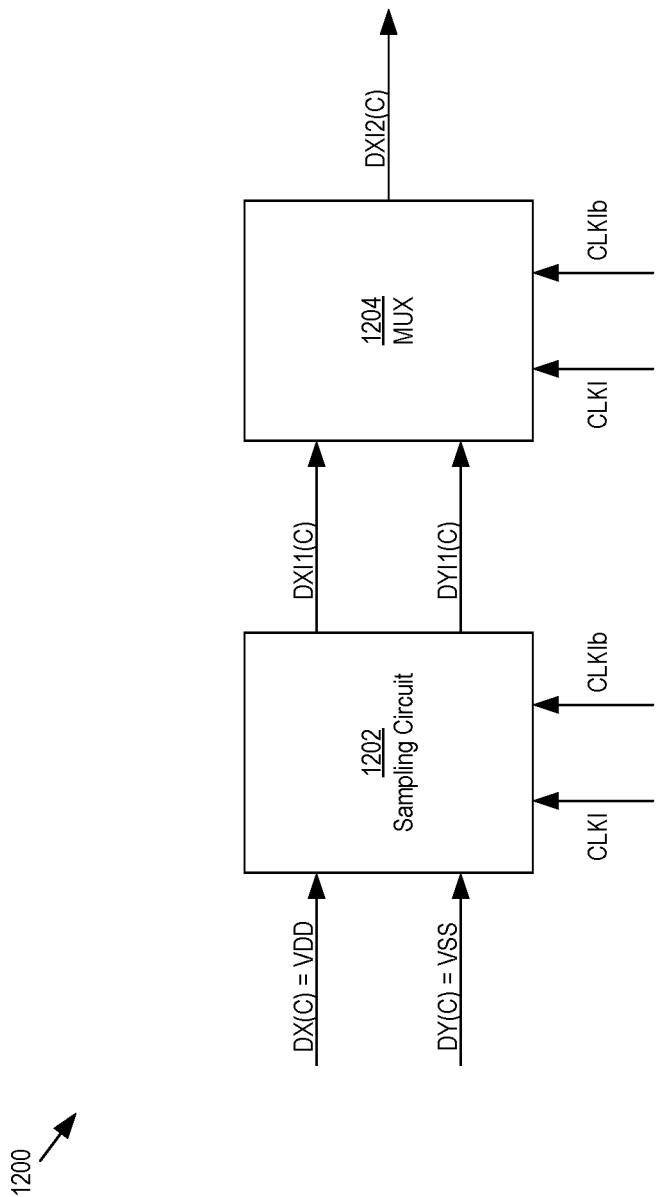
FIG. 12 is a block diagram of an example configuration of a pulse generation circuit of an output clock path circuit.

FIG. 12 shows a block diagram of an example configuration of a pulse generation circuit 1200, which may be representative of the pulse generation circuit 324(C) of the output clock path circuit 304. The pulse generation circuit 1200 may include a sampling circuit 1202 and a multiplexer (MUX) 1204. In particular example configurations, the sampling circuit 1202 may include a level shifter circuit that generates the output signals of the sampling circuit 1202. In other example configurations, a level shifter circuit may be disposed in between the flip-flop/latch circuit 1202 and the multiplexer 1204. In still other example configurations, a level shifter circuit may not be included.

As shown in FIG. 12, each of the sampling circuit 1202 and the multiplexer 1204 are configured to receive the complementary intermediate clock signals CLKI, CLKIb. The sampling circuit 1202 may be configured to sample the data input signals DX(C), DY(C) in response to rising and/or falling edges of the complementary intermediate clock signals CLKI, CLKIb to generate and output a first set of clock pulse generation signals DXI1(C), DYI1(C). The first set of clock pulse generation signals DXI1(C), DYI2(C) may each be single-ended signals or a pair of complementary signals. That is, the multiplexer 1204 may receive the first set of clock pulse generation signals DXI1(C), DYI1(C) as a pair of complementary clock signals or as two sets of complementary clock signals. Additionally, the sampling circuit 1202 may include any of various circuit configurations configured to generate signals based on data and clock inputs, such as flip-flops, latches, or a combination thereof.

The multiplexer 1204 is configured to receive the first set of clock pulse generation signals DXI1(C), DYI1(C) and the pair of complementary intermediate clock signals CLKI, CLKIb, and combine the first set of clock pulse generation signals DXI1(C), DYI2(C) based on the timing (i.e., based on the occurrence of the rising and/or falling edges) of the intermediate clock signals CLKI, CLKIb to generate a second clock pulse generation signal DXI2(C) that it provides to the driver circuit 326(C). Based on changes or adjustments in the delay of the first intermediate clock signal CLKI relative to the second intermediate clock signal CLKIb, the multiplexer 1204 will adjust the timing of the rising edges or falling edges of second clock pulse generation signal DXI2(C), resulting in an output clock signal CLKOUT having a corrected duty cycle.

Returning back to FIG. 12, the adjustable delay circuit 406 generates its delayed clock signal CLKI based on the detected duty cycle level of the output clock signal CLKOUT in that the delay amount by which the adjustable delay circuit 406 delays the first delay-locked clock signal CLKI2$pr$ depends on the duty cycle level of the buffered clock signal CLKBF that the duty cycle correction controller 404 identifies. The adjustable delay circuit 406 outputs the delayed clock signal CLKI to the first clock input C1 of the pulse generation circuit 324(C) of the output clock path circuit 304. The output clock path circuit 304, through its driver circuit 326(C), continues to generate clock pulses of the output clock signal CLKOUT at the I/O clock node 312 in response to the delayed clock signal CLKI received from the adjustable delay circuit 406, and the DIN input clock buffer 328 responds by continuing to output clock pulses of the buffered clock signal CLKBF to the duty cycle correction controller 404.

In operation, the duty cycle correction controller 404, the adjustable delay circuit 406, the output clock path circuit 304, and the DIN input buffer 328 form a loop, where the DIN input buffer 328 feeds back information about the duty cycle of the output clock signal CLKOUT to the duty cycle correction controller 404 through its generation of the buffered clock signal CLKBF. The duty cycle controller 404 may continue to adjust the delay amount of the adjustable delay circuit in response to the duty cycle level it identifies through continued receipt of the buffered clock signal CLKBF until either the duty cycle controller 404 identifies that the duty cycle level of the buffered clock signal CLKBF, and in turn the duty cycle level of the output clock signal CLKOUT, has reached, moved to, or is otherwise at the target duty cycle level, or until the duty cycle controller 404 identifies that a predetermined time period for performing the duty cycle correction processes as expired or ended.

The duty cycle correction circuit 400 may be configured to perform a duty cycle correction process as a calibration process or as an on-the-fly process. When performed as a calibration process, the duty cycle correction circuit 400 may perform the duty cycle correction process in advance of a data-out operation. The data retrieving IC 104 may receive a training clock signal as the input clock signal CLKIN from the data requesting IC 102 by way of the unidirectional clock line 108 and the input clock node 310. In response to receipt of the training clock signal, the duty cycle correction circuit 400 may perform the duty cycle correction process, during which the duty cycle correction controller 404 may determine a target delay amount that sets the duty cycle of the buffered clock signal CLKBF to the target duty cycle level. Thereafter, when the data retrieving IC 104 performs a data-out operation, the duty cycle correction controller 404 sets and maintains the delay of the adjustable delay circuit 406 to the target delay amount, so that as the input clock path circuit 302 generates the pre-intermediate clock signal CLKIpr in response to receipt of the input clock signal CLKIN, the duty cycle correction circuit 400 generates the pair of complementary intermediate clock signals CLKI, CLKIb with the adjustable delay circuit 406 set to the target delay amount.

Alternatively, when performed as an on-the-fly process, the duty cycle correction circuit 400 may perform the duty cycle correction process as part of the data-out operation. To perform the duty cycle correction process as an on-the-fly process and/or as part of the data-out operation, the data requesting IC 102 may append a predetermined number of dummy clock cycles, including a predetermined number of dummy clock pulses, to the beginning of the input clock signal CLKIN. The duty cycle correction controller 404 will use the initial dummy clock pulses—or more particularly the clock pulses of the pre-intermediate clock signals generated in response to the initial dummy clock pulses—to identify a target delay amount that sets the duty cycle of the buffered clock signal CLKBF to the target duty cycle level. This way, by the time that the data retrieving IC 104 receives the first clock pulse of the input clock signal CLKIN to transfer the data back to the data requesting IC 102, the duty cycle controller 404 will have set the adjustable delay circuit 406 to at an optimal delay amount for setting the duty cycle of the output clock signal CLKOUT to the target duty cycle level.

FIG. 5 shows a block diagram of an example digital DLL circuit 500 that may be representative of an example configuration of the DLL circuit 402 of FIG. 4 when used to perform duty cycle correction as a calibration process in advance of a data-out operation. FIG. 6 shows a block diagram of an example configuration of a duty cycle correction controller 600, an adjustable delay circuit 602, and a fixed delay circuit 604, which may be representative of an example configuration of the duty cycle correction controller 404, the adjustable delay circuit 406, and the fixed delay circuit 408 of FIG. 4, respectively, and/or that may be used in conjunction with the DLL circuit 500, to perform a duty cycle correction process as a calibration process. As described in further detail below, the DLL circuit 500 in FIG. 5 and the adjustable and fixed delay circuits 602, 604 in FIG. 6 may be considered digital circuits in that they receive, generate, or otherwise use digital codes to set delay amounts with which they delay their respective input clock signals to generate their respective output clock signals.

Referring particularly to FIG. 5, the digital DLL circuit 500 includes a delay chain 502, a biasing circuit 504, and a DLL controller 506. In general, as used herein, a delay chain is a plurality of delay cells connected in cascade. A delay cell is a circuit configured to delay an input signal received at its input terminal one delay unit to generate an output signal at its output terminal. The input terminal of a delay cell is referred to as its local input terminal, and the output terminal of a delay cell is referred to as its local output terminal. Additionally, the input signal that a delay cell receives at its local input terminal is referred to as a local input signal, and the output signal that a delay cell generates at its local output terminal is referred to as a local output signal. Accordingly, the local output signal that a delay cell generates at its local output terminal is delayed one delay unit relative the local input signal the delay cell receives at its local input terminal.

The delay cells in a chain are configured to sequentially receive and delay their local input signals to generate their local output signals. Positions of the delay cells in the delay chain define an order in which the delay cells sequentially receive and delay their respective local input signals. A position of a delay cell in the delay chain indicates when the delay cell will receive and delay its local input signal relative to when the other delay cells in the delay chain will receive and delay their local input signals.

With respect to a given delay cell in the chain, those delay cells that receive and delay their respective local input signals before the given delay cell receives and delays its local input signal are referred to as earlier delays cells positioned before the given delay cell. In addition, those delay cells that receive and delay their respective local input signals after the given delay cell receives and delays its local input signal are referred to as later delay cells positioned after the given delay cell.

The delay cells may be labeled or referenced by their respective positions in the delay chain. A position of a delay cell in the delay chain may be represented by an ordinal that identifies the number delay cell in the sequence to receive and delay its local input signal. To illustrate, a first delay cell has the first position in the delay chain and is the first delay cell of the chain to receive and delay its local input signal, a second delay cell has the second position in the delay chain and is the second delay cell of the chain, after the first delay cell, to receive and delay its local input signal, and so on. For an n-number of delay cells in the chain, the nth delay cell may be referred to as the last delay cell in the chain, and is the last delay cell of the chain to receive and delay its local input signal.

With respect to a given delay cell in the chain, a delay cell that receives and delays its local input signal directly before the given delay cell receives and delays its local input signal is referred to as a prior delay cell of the given delay cell. In addition, a delay cell that receives and delays its local input signal directly after the given delay cell receives and delays its local input signal is referred to as a next delay cell of the given delay cell.

Except for the first delay cell, each of the delay cells in the chain may have their respective local input terminals coupled to the local output terminals of their respective prior delay cells. Accordingly, except for the first delay cell, the local input signal that a given delay cell receives is the local output signal that its prior delay cell generates. In addition, except for the last delay cell, each of the delay cells in the chain may have their respective local output terminals coupled to the local input terminals of their respective next delay cells. Accordingly, except for the last delay cell, the local output signal that a given delay cell outputs is the local input signal that its next delay cell receives and delays.

The delay chain as a whole is configured to receive an input signal. The input signal to the delay chain is also the local input signal to the first delay cell of the delay chain.

In accordance with the sequential receipt and delay by the delay cells to generate the local output signals, when the first delay cell receives the input signal to the delay chain, the first delay cell delays the input signal by one delay unit to generate its local output signal. Thereafter, the later delay cells positioned after the first delay cell each receive and delay their respective local input signals by one delay unit upon generation of the local output signals by their respective prior delay cells. As a result, the delay cells of the delay chain are configured to increment the delay with which they generate their respective local output signals relative to the input signal by one delay unit as they move higher in position in the chain. The first delay cell is configured to generate its local output signal with a delay of one delay unit relative to the input signal of the delay chain, and each delay cell positioned after the first delay cell is configured to generate its local output signal with a delay relative to the input signal one delay unit greater than the delay relative to the input signal with which the prior delay cell generated its local output signal.

The amount of delay with which a given delay cell generates its local output signal relative to the input signal to the delay chain may be equal to the amount of delay of one delay unit multiplied by the position of the given delay cell in the chain. As a brief illustration, if one unit of delay is 50 picoseconds (ps), a third delay cell in a chain generates its local output signal with a delay of 150 ps relative to the input signal to the delay chain.

Also, in at least some delay chains, an amount of delay of one delay unit by which a delay cell delays its input signal corresponds to one unit of phase delay shift, which may be represented by an amount of degrees. For such configurations, the delaying action performed by a delay cell may be a phase delay in addition to a time delay. The amount of the phase delay with which a given delay cell generates its local output signal is equal to the number of degrees of one phase delay unit multiplied by the position of the given delay cell in the chain. As a brief illustration, if one phase delay unit is 15 degrees, a third delay cell in a chain generates its local output signal with a phase delay of 45 degrees relative to the input signal to the delay chain.

The delay chain as a whole is configured to generate and output one or more output signals. A local output signal generated by a delay cell is an output signal of the delay chain if the delay chain sends the local output signal to a circuit external to the delay chain. Conversely, a local output signal that is sent only to a next delay cell is not an output signal of the delay chain.

In addition, for at least some example configurations, an amount of delay of one delay unit may be variable. A level of a bias applied to a delay cell may set or determine the amount of the one delay unit. Accordingly, a change in the bias level applied to the delay cell may correspondingly change the amount of the one delay unit. A bias applied to a delay cell may be a voltage bias or a current bias, depending on the configuration of the delay cell. Also, whether an increase or decrease in the level of the bias increases or decreases the delay may also depend on the configuration of the delay cell. In one example configuration, a delay cell is a current-starved inverter that delays its local input signal by an amount of delay dependent on an amount of current supplied to the inverter in order to generate its local output signal. An increase in the level of the supplied current bias may decrease the amount of delay, and a decrease in the level of the supplied current may increase the amount of delay.

With respect to the digital DLL circuit 500, the delay chain 502 includes an n-number of delay cells DC(1) to DC(n). In addition, the input signal to the delay chain 502 is the pre-intermediate clock signal CLKIpr. The output signals of the delay chain 502 include the pair of complementary second pre-intermediate (or delay-locked) clock signals CLKI2*pr*, CLKI2*prb*.

The biasing circuit 504 may apply, provide, supply, or output bias signals, such as in the form of voltages or currents, to the n-number of delay cells DC(1) to DC(n). For example, the biasing circuit 504 may apply a first bias signal BS(1) to a first delay cell DC(1), a second bias signal BS(2) to a second delay cell DC(2), and an nth bias signal BS(n) to an nth delay cell DC(n). The levels of the bias signals BS applied to the delay cells DC are collected referred to as a bias setting. A change in at least one level of the bias signals BS is referred to as a change in the bias setting.

The biasing circuit 504 may output the bias signals BS at a given bias setting to set or establish the amount of the one delay unit of the delay cells DC. Additionally, the biasing circuit 504 may be configured to change the bias setting to correspondingly change the amount of the one delay unit.

In addition, in accordance with the digital configuration of the digital DLL 500, the biasing circuit 504 is configured to output the bias signals BS at a current bias setting that corresponds to a current value of a digital code CODE1 that the bias circuit 504 is receiving or has otherwise identified. A current bias setting is a bias setting at which the biasing circuit 504 is outputting the bias signals BS at a current moment in time during operation. At any moment in time during operation, the biasing circuit 504 is configured to output the bias signals BS at any one of a plurality of different bias settings. Each of the plurality of bias settings may correspond to (such as by having a direct one-to-one correspondence with) a different one of a plurality of values at which the digital code CODE1 may indicate or represent.

The digital code CODE1 may represent a p-bit binary number, where p is the number of digits of the p-bit binary number, and where each digit can be a logic 0 value or a logic 1 value. In implementation, the biasing circuit 504 may receive the digital code CODE1 as or in the form of a p-number of voltages in parallel, with each voltage being at a high voltage level to indicate a logic 1 value or a low voltage level to indicate a logic 0 value.

At a given moment in time at which the biasing circuit 504 is receiving the voltages of the digital code CODE1, the combination of the voltages at their respective high and low voltage levels may indicate a current value of the p-bit binary number that the digital code CODE1 represents. The biasing circuit 504 may respond to the digital code CODE1 by outputting the bias signals BS at a current bias setting that corresponds to the current value of the p-bit number represented by the digital code CODE1. In this context, the biasing circuit 504 may operate as a digital-to-analog converter (DAC) or a DAC biasing circuit 504 in that biasing circuit 504 converts a digital signal or code CODE1 to analog signals in the form of the biasing signals BS.

The DLL controller 506 is a circuit that selects the values of the digital code CODE1 and outputs the digital code CODE1 to the biasing circuit 504 to control the bias setting at which the biasing circuit 504 outputs the bias signals BS. The DLL controller 506 is configured to search for a value of the digital code CODE1 that corresponds to a bias setting that results in the delay chain 502 outputting the first delay-locked clock signal CLKI2*pr* with a delay relative to the pre-intermediate clock signal CLKIpr equal to a predetermined locked delay amount. In particular example configurations, the locked delay amount may be a phase delay of 360 degrees or one cycle or period of the pre-intermediate clock signal CLKIpr, relative to the pre-intermediate clock signal CLKIpr.

The value of the digital code CODE1 that results in the delay chain 502 outputting the first delay-locked clock signal CLKI2*pr* with the locked delay amount is referred to as a locking value. A bias setting at which the biasing circuit 504 outputs the bias signals BS in response to the digital code CODE1 having the locking value is referred to as a locked bias setting.

When the DLL controller 506 identifies the locking value, the DLL circuit 500 is locked, in that the DLL controller 506 stops its search and "locks" the value of the digital code CODE1 to the locking value so that the biasing circuit 504 maintains output of the bias signals BS at the locked bias setting corresponding to the locking value, and the delay chain 502 maintains output of the first delay-locked clock signal CLKI2*pr* with a delay relative to the pre-intermediate clock signal CLKIpr that is equal to the locked delay amount. In this context, the locked bias setting is the bias setting that locks the DLL circuit 500 in that it is the bias setting that causes the DLL controller 506 to stop searching and lock the value of the digital code CODE1 to the locking value so that the biasing circuit 504 maintains output of the bias signals BS at the locked bias setting and the delay chain 502 maintains output of the first delay-locked clock signal CLKI2*pr* with a delay equal to the locked delay amount.

In addition, when the DLL controller 506 identifies the locking value and the biasing circuit 504 outputs the bias signals BS at the locked bias setting, one of the delay cells DC in the delay chain 502 may output its local output signal as a second output signal of the delay chain 502, which is the second delayed-locked clock signal CLKI2*prb*, with a phase shift of 180 degrees relative to the first delay-locked clock signal CLKI2*pr*, so that the delay chain 502 outputs the first and second delay-locked clock signals CLKI2*pr*, CLKI2*prb* as a pair of complementary clock signals. For example, when the delay chain 502 outputs the first delay-locked clock signal CLKI2*pr* with a delay of 360 degrees relative to the pre-intermediate clock signal CLKIpr, the delay chain 502 may output the second delay-locked clock signal CLKIpr2*b* from the delay cell DC that generates its local output signal with a phase delay of 180 degrees relative to the pre-intermediate clock signal CLKIpr.

The DLL controller 506 may be configured to search for the locking value during a search phase. Upon identifying the locking value, the DLL controller 506 may exit the search phase and enter into a locked phase, during which the DLL controller 506 locks the value of the digital code CODE1 to the locking value, the biasing circuit 504 maintains output of the bias signals BS at the locked bias setting, and the delay chain 502 maintains output of the first delay-locked clock signal CLKI2*pr* with a delay relative to the pre-intermediate clock signal CLKIpr equal to the locked delay amount.

To perform the search phase, the DLL controller 506 includes a phase detection circuit 508, a charge pump circuit 510, a comparator (COMP) circuit 512, and a code selection circuit 514. The phase detection circuit 508 is configured to receive the pre-intermediate clock signal CLKIpr and the first delay-locked clock signal CLKI2*pr* (i.e., the i.e., the input and output signals of the delay chain 502), and identify a phase difference between the two clock signals. In addition, the phase detection circuit 508 is configured to output a phase detection result signal PDR that indicates the phase difference.

The charge pump 510 is configured to receive the phase detection result signal PDR and generate a charge pump voltage $V_{CP}$ based on the phase detection result signal PDR. In particular example configurations, the phase detection result signal PDR may indicate which of the pre-intermediate clock signal CLKIpr and the first delay-locked clock signal CLKI2$pr$ leads and which lags. Depending on which of the clock signals CLKIpr, CLKI2$pr$ leads and which lags, the charge pump circuit 510 may be configured to either increase or decrease the level of the charge pump voltage $V_{CP}$. Whether the charge pump circuit 510 increases or decreases the level of the charge pump voltage $V_{CP}$ in response to the leading or lagging as indicated by the phase detection result signal PDR may be implementation specific and depend on how the DLL controller 506 is to search for the locking value.

The comparator circuit 512 is configured to receive the charge pump voltage $V_{CP}$ and a reference voltage $V_{REF}$, and compare the two voltages $V_{CP}$, $V_{REF}$ to determine a difference relationship between the two voltages $V_{CP}$, $V_{REF}$ that indicates which of the two voltages $V_{CP}$, $V_{REF}$ has a higher voltage level. For at least some example configurations, the reference voltage $V_{REF}$ may be the same voltage and/or at the same reference voltage level as the reference voltage $V_{REF}$ received by the input buffers 328, 330, 332, as previously described with reference to FIGS. 3 and 4. In addition, in response to the comparison, the comparator circuit 512 is configured to output a comparison result signal CR at a level that indicates the difference relationship. In particular, the comparator circuit 512 may be configured to output the comparison result signal CR at a first level in response to the comparison indicating that the level of the charge pump voltage $V_{CP}$ is higher than the level of the reference voltage $V_{REF}$, and output the comparison result signal CR at a second level in response to the comparison indicating that the level of the reference voltage $V_{REF}$ is higher than the level of the charge pump voltage $V_{CP}$. The first level may be a high level and the second level may be a low level, or vice versa.

The code selection circuit 514 is configured to receive the comparison result signal CR, and search for the locking value by selecting values for the digital code CODE1 based on the difference level indicated by the comparison result signal CR. Upon selecting a value, the code selection circuit 514 may output the digital code CODE1 to indicate the selected value. For example, the code selection circuit 514 may output a p-number of voltages at respective high and low voltage levels to indicate the selected value.

The DLL controller 506 may perform the search phase over a plurality of iterations. During an initial iteration, the comparator circuit 512 may generate the comparison result signal CR at an initial level to indicate an initial difference relationship between the charge pump voltage $V_{CP}$ and the reference voltage $V_{REF}$. The initial difference relationship, as indicated by the initial level, may be that the level of the charge pump voltage $V_{CP}$ is higher than the level of the reference voltage $V_{REF}$ or alternatively, that the level of the charge pump voltage $V_{CP}$ is lower than the level of the reference voltage $V_{REF}$. The code selection circuit 514 may identify the initial difference in the first iteration, and select a selection direction in which to select values for the digital code CODE1. In at least some example configurations, the code selection circuit 514 has two selection directions to choose from, including an increasing selection direction and a decreasing selection direction. When the code selection circuit 514 chooses the increasing selection direction, the code selection circuit 514 selects values that are higher than the previous values it selected over subsequent iterations of the search phase. When the code selection circuit 514 chooses the decreasing selection direction, the code selection circuit chooses values that are lower than the previous values it selected over subsequent iterations of the search phase.

The increasing and decreasing selection directions may correspond to the difference relationship between the charge pump voltage $V_{CP}$ and the reference voltage $V_{REF}$ such that as long as the code selection circuit 514 searches in the chosen selection direction, the code selection circuit 514 will eventually select a value that causes the difference relationship to switch from the initial difference relationship. For example, if the initial difference relationship is that the level of the charge pump voltage $V_{CP}$ is higher than the level of the reference voltage $V_{REF}$, then the code selection circuit 514 will eventually select a value that causes the level of the charge pump voltage $V_{CP}$ to be lower than the level of the reference voltage $V_{REF}$. Alternatively, if the initial difference relationship is that the level of the charge pump voltage $V_{CP}$ is lower than the level of the reference voltage $V_{REF}$, then the code selection circuit 514 will eventually select a value that causes the level of the charge pump voltage $V_{CP}$ to be higher than the level of the reference voltage $V_{REF}$.

The code selection circuit 514 may detect when the difference relationship changes by detecting a change in the level of the comparison result signal from the initial level. For example, if the initial level of the comparison result signal CR is the first level, the code selection circuit 514 may detect a change in the difference relationship when the comparator circuit 512 changes the level of the comparison result signal CR from the first level to the second level. Alternatively, if the initial level of the comparison result signal CR is the second level, the code selection circuit 514 may detect a change in the difference relationship when the comparator circuit 512 changes the level of the comparison result signal CR from the second level to the first level.

When the code selection circuit 514 identifies a change in the difference relationship, such as by detecting a change in the level of the comparison result signal CR, the code selection circuit 514 may identify the value it last selected that caused the change as the locking value. Upon identifying the value it last selected as the locking value, the code selection circuit 514 may stop searching, and transition from the search phase to the locked phase.

As described in further detail below, the code selection circuit 514 may output the digital code CODE1 to the adjustable and fixed delay circuits 406, 408 (FIG. 4) or 602, 604 (FIG. 6) to set the bias settings, and in turn the amount of the delay units, in those delay circuits. In addition, the DLL controller 506, such as through the code selection circuit 514, may be configured to output a locked signal LCK to the duty cycle correction controller 404 (FIG. 4) or 600 (FIG. 6) to indicate to or notify the duty cycle correction controller 404/600 that the DLL circuit 402 (FIG. 4) or 500 (FIG. 5) is locked. For example, during the search phase, the DLL controller 506 may output the locked signal LCK to indicate that the DLL circuit 402/500 is unlocked. Then, upon identifying the locking value of the digital code CODE1, the DLL controller 506 may output the locked signal LCK to indicate that the DLL circuit 402/500 is locked. As described in further detail below, the duty cycle correction controller 404/600 may use the indication of the locked signal LCK to determine when to adjust the delay of the adjustable delay circuit 406/602.

Referring now to FIG. 6, the adjustable delay circuit 602 is configured to receive the first delay-locked clock signal CLKI2*pr* and the fixed delay circuit 604 is configured to receive the second delay-locked clock signal CLKI2*prb* from the DLL circuit 402 (FIG. 4) or 500 (FIG. 5), such as from the delay chain 502 in the DLL configuration of FIG. 5. The adjustable delay circuit 602 is configured to delay the first delay-locked clock signal CLKI2*pr* to generate the first intermediate clock signal CLKI. The fixed delay circuit 604 is configured to delay the second delay-locked clock signal CLKI2*prb* to generate the second intermediate clock signal CLKIb.

Each of the adjustable delay circuit 602 and the fixed delay circuit 604 include a delay chain comprising delay cells and a biasing circuit that biases the delay cells. In particular, the adjustable delay circuit 602 includes a delay chain 606 and biasing circuit 608. The fixed delay circuit 604 includes a delay chain 610 and a biasing circuit 612. Each of the delay chains 606, 610 is shown as including an m-number of delay cells DC, extending from a first delay cell DC(1) to an mth or last delay cell DC(m). The number m may be the same or different for the adjustable delay circuit 602 and the fixed delay circuit 604. In addition, each of the biasing circuits 608, 612 may be configured to bias the delay cells DC of their respective delay chains 606, 610, such as by outputting an m-number of bias signals BS(1) to BS(m) to their respective delay cells DC.

In addition, each of the biasing circuits 608, 612 may be configured to bias the delay cells DC of their respective delay chains 606, 610 according to the locked bias setting that locks the DLL circuit 500. For example, as shown in FIG. 6, each of the biasing circuit 608, 612 are configured to receive the digital code CODE1 from the DLL controller 506. In this way, the DLL controller 506 controls the biasing of the delay cells DC in order to control the amount of the delay units by which the delay cells DC of the adjustable and fixed delay circuits 602, 604 delay their local input signals. This may ensure that biasing circuits 608, 612 set the delay units of the delay cells DC of the delay chains 606, 610 to delay amounts that are proportionate to the frequency of operation (e.g., the frequency of the input clock signal CLKIN).

The biasing circuits 608, 612 may be configured as DAC biasing circuits, similar to the DAC biasing circuit 504 of the digital DLL 500, in that they may convert the digital code CODE1 to analog signals, such as analog voltages or analog currents, to bias the delay cells DC. Accordingly, when the DLL controller 506 identifies the locking value that causes the biasing circuit 504 to maintain output of its bias signals BS at the locked bias setting, the biasing circuits 608, 612 also maintain output of their respective bias signals BS at the locked bias setting in response to receipt of the digital code CODE1 having the locking value.

During a duty cycle correction process, the duty cycle correction controller 600 is configured to adjust a delay amount of the adjustable delay circuit 602 by which to delay the first delay-locked clock signal CLKI2*pr* in order to generate the first intermediate clock signal CLKI. Also, during a duty cycle correction process, the fixed delay circuit 604 is configured to delay the second delay-locked clock signal CLKI2*prb* by a constant amount while the duty cycle correction controller 600 adjusts the delay amount of the adjustable delay circuit 602.

In the example configuration shown in FIG. 6, the adjustable delay circuit 602 is configured to output the first intermediate clock signal CLKI by selecting the number of delay cells DC that delay their respective local input signals to generate the first intermediate clock signal CLKI. That is, the adjustable delay circuit 602 is configured to set a delay amount by which to delay first delay-locked clock signal CLKI2*pr* to generate the first intermediate clock signal CLKI by setting the number of delay cells DC that delay their respective local input signals to generate the first intermediate clock signal CLKI.

In addition, the adjustable delay circuit 602 is configured to adjust the delay amount by which to delay the first delay-locked clock signal CLKI2*pr* to generate the first intermediate clock signal CLKI by adjusting, such as by increasing or decreasing, the number of delay cells DC that delay their respective local input signals to generate the first intermediate clock signal CLKI. In general, the more delay cells that delay their respective local input signals to generate the first intermediate clock signal CLKI, the greater the delay amount by which the adjustable delay circuit 602 delays the first delay-locked clock signal CLKI2*pr* to generate the first intermediate clock signal CLKI. Conversely, the fewer delay cells that delay their respective local input signal to generate the first intermediate clock signal CLKI, the lower the delay amount by which the adjustable delay circuit 602 delays the first delay-locked clock signal CLKI2*pr* to generate the first intermediate clock signal CLKI. Accordingly, in order to increase the delay amount to delay the first delay-locked clock signal CLKI2*pr*, the adjustable delay circuit 602 increases the number of delay cells DC that delay their respective local input signals to generate the first intermediate clock signal CLKI. Additionally, in order to decrease the amount to delay the first delay-locked clock signal CLKI2*pr*, the adjustable delay circuit 602 decreases the number of delay cells DC that delay their respective local input signals to generate the first intermediate clock signal CLKI.

In a particular example configuration, the adjustable delay circuit 602 sets the number of delay cells DC that delay their respective local input signals to generate the first intermediate clock signal CLKI by selectively outputting one of a plurality of local output signals LO that the delay cells DC generate as the intermediate clock signal CLKI. The position of the delay cell DC in the delay chain 606 generating the local output signal that is selected identifies the number of delay cells delayed their local input signals to generate the first intermediate clock signal CLKI. To illustrate, if the adjustable delay circuit 602 selects the local output signal generated by the second delay cell DC(2) of the delay chain 606 as the intermediate clock signal CLKI, the adjustable delay circuit 606 will have selected two delay cells DC— i.e., the first delay cell DC(1) and the second delay cell DC(2)—to delay their respective local input signals to generate the intermediate clock signal CLKI.

Accordingly, the adjustable delay circuit 602 is configured to adjust the delay amount by which it delays the first delay-locked clock signal CLKI2*pr* to generate the first intermediate clock signal CLKI by outputting a different one of the plurality of local output signals. In particular, the adjustable delay circuit 602 increases the delay amount by selecting a local output signal from a delay cell DC having a higher position in the delay chain 606, and decreases the delay amount by selecting a local output signal from a delay cell DC having a lower position in the delay chain 606.

In order to selectively output the local output signals of the delay chain 606, the adjustable delay circuit 602 further includes a selection circuit 614 configured to receive the local output signals, and selectively output one of the local output signal as the first intermediate clock signal CLKI. The local output signals that the selection circuit 614 can select from are labeled "LO" in FIG. 6. The local output signals LO may include an m-number of local output signals LO(1) to LO(m) from the output terminals of the delay cells DC of the delay chain 606. Also, in some example configurations, the local output signals LO may include the first delay-locked clock signal CLKI2*pr*, which may be considered an undelayed or initial local output signal LO(0) of the local output signals LO.

The selection circuit 614 may have any of various circuit configurations, such as those utilizing multiplexers, to selectively output one of the local output signals LO as the first intermediate clock signal CLKI. In addition, the selection circuit 614 may select which of the local output signals LO to output based on a second digital code CODE2. Similar to the first digital code CODE1, the second digital code CODE2 may represent or indicate a q-bit binary number that includes a q-number of digits, with each digit being a logic 1 value or a logic 0 value. In implementation, the selection circuit 614 may receive the second digital code CODE2 as or in the form of a q-number of voltages in parallel, with each voltage being at a high voltage level to indicate a logic 1 value or a low voltage level to indicate a logic 0 value.

At a given moment in time at which the selection circuit 614 is receiving the voltages of the second digital code CODE2, the combination of the voltages at their respective high and low voltage levels may indicate a current value of the q-bit binary number that the second digital code CODE2 represents. Possible values that the q-bit binary number can be may each correspond to (such as through a one-to-one correspondence with) one of the local output signals LO. The selection circuit 614 may respond to the second digital code CODE2 by selecting the local output signal LO that corresponds to the current value of the q-bit number represented by the second digital code CODE2.

The duty cycle correction controller 600 is a circuit that selects the values of the second digital code CODE2 and outputs the second digital code CODE2 to the selection circuit 614 to control which local output signal LO the selection circuit 614 outputs, and in turn the delay amount by which the adjustable delay circuit 602 delays the first delayed-locked clock signal CLKI2*pr* to generate the first intermediate clock signal CLKI. The duty cycle correction controller 600 is configured to search for a value of the second digital code CODE2 that corresponds to output of a particular one of the local output signals LO that results in the duty cycle of the output clock signal CLKOUT being set to the target duty cycle level or having a minimum amount of duty cycle distortion.

The value of the second digital code CODE2 that results in the duty cycle correction controller 600 identifying that the duty cycle of the output clock signal CLKOUT is at the target duty cycle level is referred to as a target value. When the duty cycle correction controller 600 identifies that it has found the target value, the duty cycle correction controller 600 may stop the duty cycle correction process or at least stop searching for the target value. After the duty cycle correction process, when the data retrieving IC 104 performs a data-out operation, the selection circuit 614 may output the local output signal corresponding to the target value as the intermediate clock signal CLKI. Also, during the data-out operation, the biasing circuits 608, 612 may bias their respective delay cells DC at or according to the locked delay setting determined by the DLL controller 506.

The duty cycle correction controller 600 may be configured to search for the target value during a delay adjustment phase. As mentioned, upon identifying the target value, the selection circuit may be configured to output the local output signal LO that corresponds to the target value as the first intermediate clock signal CLKI during future or subsequent data-out operations.

To perform the delay adjustment phase, the duty cycle correction controller 600 includes a duty cycle detection circuit 616, a comparator (COMP) circuit 618, and a code selection circuit 620. The duty cycle detection circuit 616 is configured detect the duty cycle level of the output clock signal CLKOUT. In general, a duty cycle detection circuit is a circuit that receives an input signal and that detects, identifies, determines, and/or measures a duty cycle level of the input signal it receives. The duty cycle detection circuit may have any of various types of circuit components and configurations of those circuit components to identify the duty cycle level of the input signal. In one example configuration, the duty cycle detection circuit includes an averaging circuit in the form of a low pass filter (e.g., a resistor-capacitor (RC) low pass filter) that averages the instantaneous duty cycles over several cycles of periods of the input signal in order to identify an average duty cycle level for the several cycles or periods. Circuit configurations other than low pass filters to detect the duty cycle level of the input signal may be possible.

As the duty cycle level of the input signal changes over time, the duty cycle detection circuit may identify the change in the duty cycle level. In addition, the duty cycle detection circuit is configured to generate an output signal that indicates or identifies the duty cycle level that the duty cycle detection circuit has identified. In particular example configurations, the duty cycle detection circuit may generate its output signal at a level that corresponds to and/or is proportionate to the duty cycle level that the duty cycle detection circuit detected. In the event that the duty cycle detection circuit detects a change in the duty cycle level, the duty cycle detection circuit will change the level of its output signal to reflect or indicate the change.

With reference to FIG. 6, the duty cycle detection circuit 616 is configured to receive the buffered clock signal CLKBF from the DIN input clock buffer 328, as indicated in FIG. 4, in order to detect the duty cycle level of the output clock signal CLKOUT. That is, since the duty cycle level of the buffered clock signal CLKBF provides a sufficiently accurate indication of the duty cycle level of the output clock signal CLKOUT, then by receiving the buffered clock signal CLKBF, the duty cycle detection circuit 616 is configured to detect the duty cycle level of the buffered clock signal CLKBF and, in turn, effectively detect the duty cycle level of the output clock signal CLKOUT. Additionally, the duty cycle detection circuit 616 is configured to output a detected duty cycle voltage $V_{DDC}$ at a level that indicates the duty cycle level of the buffered and output clock signals CLKBF, CLKOUT.

The comparator circuit 618 is configured to receive the detected duty cycle voltage $V_{DDC}$ and a reference voltage $V_{REF}$, and compare the two voltages $V_{DDC}$, $V_{REF}$ to determine a difference relationship between the two voltages $V_{DDC}$, $V_{REF}$ that indicates which of the two voltages $V_{DDC}$, $V_{REF}$ has a higher voltage level. For at least some example configurations, the reference voltage $V_{REF}$ may be the same voltage and/or at the same reference voltage level as the reference voltage $V_{REF}$ received by the input buffers 328, 330, 332, as previously described with reference to FIGS. 3 and 4. In addition, in response to the comparison, the comparator circuit 618 is configured to output a comparison result signal CR at a level that indicates the difference relationship. In particular, the comparator circuit 618 is configured to output the comparison result signal CR at a first level in response to the comparison indicating that the level of the detected duty cycle voltage $V_{DDC}$ is higher than the level of the reference voltage $V_{REF}$, and output the comparison result signal CR at a second level in response to the comparison indicating that the level of the reference voltage $V_{REF}$ is higher than the level of the detected duty cycle voltage $V_{DDC}$. The first level may be a high level and the second level may be a low level, or vice versa.

The code selection circuit 620 is configured to receive the comparison result signal CR, and search for the target value by selecting values for the second digital code CODE2 based on the difference level indicated by the comparison result signal CR. Upon selecting a value, the code selection circuit 620 may output the second digital code CODE2 to indicate the selected value. For example, the code selection circuit 620 may output a q-number of voltages at respective high and low voltage levels to indicate the selected value.

The duty cycle correction controller 600 may perform the delay adjustment phase over a plurality of iterations. During an initial iteration, the comparator circuit 618 may generate the comparison result signal CR at an initial level to indicate an initial difference relationship between the detected duty cycle voltage $V_{DDC}$ and the reference voltage $V_{REF}$. The initial difference relationship, as indicated by the initial level, may be that the level of the detected duty cycle voltage $V_{DDC}$ is higher than the level of the reference voltage $V_{REF}$ or alternatively, that the level of the detected duty cycle voltage $V_{DDC}$ is lower than the level of the reference voltage $V_{REF}$. The code selection circuit 620 may identify the initial difference in the first iteration, and select a selection direction in which to select values for the second digital code CODE2. In at least some example configurations, the code selection circuit 620 has two selection directions to choose from, including an increasing selection direction and a decreasing selection direction. When the code selection circuit 620 chooses the increasing selection direction, the code selection circuit 620 selects values that are higher than the previous values it selected over subsequent iterations of the delay adjustment phase. When the code selection circuit 620 chooses the decreasing selection direction, the code selection circuit 620 chooses values that are lower than the previous values it selected over subsequent iterations of the delay adjustment phase.

The selection directions may correspond to correction directions. A correction direction is a direction that the detected duty cycle moves. Similar to the selection directions, the correction directions may include two directions, including an increasing correction direction and a decreasing correction direction. When the detected duty cycle level moves in the increasing correction direction, the detected duty cycle level increases. When the detected duty cycle level moves in the decreasing correction direction, the detected duty cycle level decreases. The selection directions and correction directions correspond to each other in that when the code selection circuit 620 selects values in the increasing correction direction, the detected duty cycle moves in one of the correction directions, and when the code selection circuit 620 selects values in the decreasing selection direction, the detected duty cycle moves in the other correction direction.

The code selection circuit 620 is configured to choose the selection direction that will move the detected duty cycle in the correction direction that will reduce the duty cycle distortion. That is, if the detected duty cycle level is higher than the target duty cycle level, the code selection circuit 620 will select values in the selection direction that reduces the detected duty cycle level. If the detected duty cycle level is lower than the target duty cycle level, the code selection circuit 620 will select values in the selection direction that increases the detected duty cycle level.

The selection directions and the correction directions may further correspond to delay directions. A delay direction is a direction that a delay amount of the adjustable delay circuit 602 moves. Similar to the selection and correction directions, the delay directions may include two directions, including an increasing delay direction and a decreasing delay direction. When the delay amount moves in the increasing delay direction, the adjustable delay circuit 602 increases the amount of delay by which it delays the first delay-locked clock signal CLKI2pr. When the delay amount moves in the decreasing direction, the adjustable delay circuit 602 decreases the amount of delay by which it delays the first delay-locked clock signal CLKI2pr. The selection directions, correction directions, and delay directions correspond to each other in that when the code selection circuit 620 selects values in the increasing correction direction, the adjustable delay circuit 602 changes the delay amount in one of the delay directions, which in turn causes the detected duty cycle to moves in one of the correction directions, and when the code selection circuit 620 selects values in the decreasing selection direction, the adjustable delay circuit 602 changes the delay amount in the other delay direction, which in turn causes the detected duty cycle to move in the other correction direction.

The code selection circuit 620 is configured to choose the selection direction that will change the delay amount in the delay direction that will reduce the duty cycle distortion. That is, if the detected duty cycle level is higher than the target duty cycle level, the code selection circuit 620 will select values in the selection direction that will change the delay amount in the delay direction that reduces the detected duty cycle level. If the detected duty cycle level is lower than the target duty cycle level, the code selection circuit 620 will select values in the selection direction that will change the delay amount in the delay direction that increases the detected duty cycle level.

In addition, the increasing and decreasing selection directions may correspond to the difference relationship between the detected duty cycle voltage $V_{DDC}$ and the reference voltage $V_{REF}$ such that as long as the code selection circuit 620 searches in the chosen selection direction, the code selection circuit 620 will eventually select a value that causes the difference relationship to switch from the initial difference relationship. For example, if the initial difference relationship is that the level of the detected duty cycle voltage $V_{DDC}$ is higher than the level of the reference voltage $V_{REF}$, then the code selection circuit 620 will eventually select a value that causes the level of the detected duty cycle voltage $V_{DDC}$ to be lower than the level of the reference voltage $V_{REF}$. Alternatively, if the initial difference relationship is that the level of the detected duty cycle voltage $V_{DDC}$ is lower than the level of the reference voltage $V_{REF}$, then the code selection circuit 620 will eventually select a value that causes the level of the detected duty cycle voltage $V_{DDC}$ to be higher than the level of the reference voltage $V_{REF}$.

The code selection circuit 620 may detect when the difference relationship changes by detecting a change in the level of the comparison result signal CR from the initial level. For example, if the initial level of the comparison result signal CR is the first level, the code selection circuit 620 may detect a change in the difference relationship when the comparator circuit 618 changes the level of the comparison result signal CR from the first level to the second level. Alternatively, if the initial level of the comparison result signal CR is the second level, the code selection circuit 620 may detect a change in the difference relationship when the comparator circuit 618 changes the level of the comparison result signal CR from the second level to the first level.

When the code selection circuit 620 identifies a change in the difference relationship, such as by detecting a change in the level of the comparison result signal CR, the code selection circuit 620 may identify the value it last selected that caused the change as the target value. Upon identifying the value it last selected as the target value, the code selection circuit 620 may stop searching, and determine that the detected duty cycle of the buffered clock signal CLKBF and/or the output clock signal CLKOUT has reached the target duty cycle level.

Accordingly, through the correspondences between the selection directions, the delay directions, the correction directions, and the difference relationship, the duty cycle correction controller 600 is configured to identify a delay direction to adjust the delay amount of the adjustable delay circuit 602, and adjust the delay amount in the identified delay direction until the duty cycle correction controller 600 identifies that the duty cycle level of the buffered clock signal CLKBF and/or the output clock signal CLKOUT has reached the target duty cycle level. That is, the duty cycle correction controller may identify the delay direction by identifying a selection direction in response to identifying an initial difference relationship between the detected duty cycle voltage $V_{DDC}$ and the reference voltage $V_{REF}$. The duty cycle correction controller 600 is further configured to adjust the delay amount in the delay direction until the duty cycle correction controller 600 identifies that the duty cycle level of the buffered clock signal CLKBF and/or the output clock signal CLKOUT has reached the target duty cycle level by selecting values in the identified selection direction until the duty cycle correction controller 600 identifies or detects a change in the difference relationship.

Additionally, upon identifying the delay direction, the duty cycle correction controller is configured to adjust the delay amount in the delay direction by adjusting the number of delay cells DC that delay their local input signals until the duty cycle correction controller 600 determines that the duty cycle level of the buffered clock signal CLKBF and/or the output clock signal CLKOUT has reached the target duty cycle level. In situations where the duty cycle correction controller 600 identifies the delay direction is the increasing delay direction, the duty cycle correction controller 600 may increase the delay amount of the adjustable delay circuit 602 by increasing the number of delay cells DC that delay their respective local input signals to generate the intermediate clock signal and/or by selecting local output signals generated from delay cells DC of higher positions in the delay chain 606, until the duty cycle correction controller 600 determines that the duty cycle level of the buffered clock signal CLKBF and/or the output signal CLKOUT has reached the target duty cycle level. In addition, in situations where the duty cycle correction controller 600 identifies the delay direction is the decreasing delay direction, the duty cycle correction controller 600 may decrease the delay amount of the adjustable delay circuit 602 by decreasing the number of delay cells DC that delay their respective local input signals to generate the intermediate clock signal and/or by selecting local output signals generated from delay cells DC of lower positions in the delay chain 606, until the duty cycle correction controller 600 determines that the duty cycle level of the buffered clock signal CLKBF and/or the output signal CLKOUT has reached the target duty cycle level.

Referring to FIGS. 4-6, for at least some example embodiments, when the duty cycle correction circuit 400 is implemented with the digital DLL and delay circuits 500, 602, 604 of FIG. 6 and performs a duty cycle correction process as a calibration process, the duty cycle correction circuit 400 may perform the duty cycle correction process in two stages, including a first stage and a second stage. In the first stage, the DLL circuit 402/500 performs the search phase, during which the DLL controller 506 searches for the locking value of the first digital code CODE1. The first stage may end and the second stage may begin when the DLL controller identifies the locking value. In the second stage, the duty cycle correction controller 404/600 performs the delay adjustment phase during which it searches for the target value of the second digital code CODE2 that sets the duty cycle level of the output clock signal CLKOUT and/or the buffered clock signal CLKBF to the target duty cycle level, or at least minimizes the amount of duty cycle distortion in the output clock signal CLKOUT and/or the buffered clock signal CLKBF.

Accordingly, when the duty cycle correction circuit 400 performs a duty cycle correction process as a two-stage process, the duty cycle correction controller 404/600 may wait to begin adjusting the delay amount of the adjustable delay circuit 406/602 until determining that the delay-locked loop circuit 402/500 is locked. Doing so may ensure that adjustment of the adjustable delay circuit 406/602 does not begin until the delay units of the delay cells in the delay circuits 406/602, 408/604 are set to amounts proportionate to the frequency of the input clock signal CLKIN and/or of the delay-locked clock signals CLKI2*pr*, CLKI2*prb*. The duty cycle correction controller 404/600 may determine that the delay-locked loop circuit 402/500 is locked in response to receiving the locked signal LCK from the DLL circuit 402/500 at a level that indicates that the DLL circuit 402/500 has identified the locking value for the first digital code CODE1. Upon determining that the delay-locked loop circuit 402/500 is locked, the duty cycle correction controller 404/600 may identify a delay direction and begin adjusting the delay amount of the adjustable delay circuit 406/602 in the identified delay direction until the duty cycle correction controller 404/600 determines that the duty cycle of the output clock signal CLKOUT and/or the buffered clock signal CLKBF has reached the target duty cycle level. Additionally, during the second stage, the DLL controller 506 may maintain output of the first code CODE1 at the locking value so that each of the biasing circuits 504, 608, 612 bias the delay cells DC of their respective delay chains 502, 606, 610 at or according to the locked bias setting while the duty cycle controller 404/600 adjusts the delay amount of the adjustable delay circuit 406/602.

After the data retrieving IC 104 is finished performing the duty cycle correction process as a two-stage calibration process, the data retrieving IC 104 may communicate with the data requesting IC 102 to perform data-out operations. After the two-stage calibration process is finished and/or during the subsequent data-out operations, the DLL controller 506 may output the first digital code CODE1 at the locking value to the biasing circuits 504, 608, 612, and the duty cycle correction controller may output the second digital code CODE2 at the target value to the selection circuit 614, as the input clock path circuit 302 generates the pre-intermediate clock signal CLKIpr in response to receipt of the input clock signal CLKIN, the DLL circuit 402 generates and outputs the pair of complementary delay-locked clock signals CLKI2*pr*, CLKI2*prb* in response to receipt of the pre-intermediate clock signal CLKIpr, the delay circuits 406, 408 generate the pair of intermediate clock signals CLKI, CLKIb in response to receipt of the delay-locked clock signals CLKI2*pr*, CLKI2*prb*, and output the intermediate clock signals CLKI, CLKIb to the clock inputs C1, C2 of the pulse generation circuits 324 of the output clock and data path output circuits 304, 306, 308, and the driver circuits 326 of the clock and data path output circuits 304, 306, 308 generate their respective output clock and data signals CLKOUT, CLKOUTb, DOUT at their respective I/O clock and data nodes for transmission over the bidirectional lines 110, 112 114 back to the data requesting IC 102.

The above described duty cycle correction process provides a system-level solution to correct duty cycle distortion in the output clock signal CLKOUT, i.e., the very last clock signal that is generated by the data retrieving IC 104 and transmitted over the bidirectional clock line 110 to the data requesting IC 102 for performance of data-out operations. Accordingly, the duty cycle correction process can correct for duty cycle distortion not only in the input clock signal CLKIN but also for any circuit components in the clock path from the input clock node 310 to the I/O clock node 312 used to generate intermediate clock signals that may introduce duty cycle distortion in the clock path. Also, the combination of both the DLL circuit 402 and the delay circuits 406, 408 may provide for optimal duty cycle correction in that the duty cycle correction system 400 can first correct for any duty cycle distortion in the input clock signal CLKIN or any duty cycle distortion introduced by the combinational logic or level shifter circuits in the input clock path circuit 302 by first finding the delay-locked setting that locks the DLL circuit 402. Then, the duty cycle correction circuit 400 can correct for any duty cycle distortion introduced in the output clock path circuit 304 by adjusting the adjustable delay circuit 406 based on any detected duty cycle distortion in the output clock signal CLKOUT. The combination of the DLL circuit 402 and the delay circuits 406, 408 may also allow for duty cycle correction over a wide range of frequencies, through the DLL controller 506 using the first digital code CODE1 to set the delay of the delay cells DC of the biasing circuits 608, 612, at least wider compared to if the delay circuits 406, 408 were configured with fixed or predetermined units of delays for their respective delay cells DC.

In addition, as previously described, the duty cycle correction circuit 400 may detect the duty cycle level of the output clock signal CLKOUT through use of the DIN input clock buffer 328. For at least some example configurations of the data retrieving IC 104, the DIN input buffer 328 is an existing component used by the data retrieving IC 104 to receive an input clock signal for performance of data-in operations. For data-out operations, the DIN input clock buffer 328 is disabled. By enabling the DIN input clock buffer 328 during a calibration operation that calibrates the duty cycle of the output clock signal CLKOUT used for data-out operations, duty cycle correction circuit 400 can correct for duty cycle distortion in the output data signal CLKOUT by leveraging existing components without having to add new components, thereby saving space and power consumption.

The DIN input clock buffer 328 can be configured in various ways to generate the buffered clock signal CLKBF.

In one example configuration, the DIN input clock buffer 328 is configured to receive the output clock signal CLKOUT and the reference voltage $V_{REF}$, and compare the voltage level of the output clock signal CLKOUT with the voltage level of the reference voltage $V_{REF}$ to generate the buffered clock signal CLKBF, as previously described with reference to FIG. 3. In another example configuration, the DIN input clock buffer 328 is configured to receive the output clock signal CLKOUT and the complementary output clock signal CLKOUTb, and compare the levels of the received pair of complementary output clock signals CLKOUT, CLKOUTb to generate the buffered clock signal CLKBF. The different signals $V_{REF}$ or CLKOUTb that the DIN input clock buffer 328 can receive are indicated by the dotted arrows in FIG. 4.

As previously described, the duty cycle correction circuit 400 may be configured to perform the duty cycle correction process as an on-the-fly process that is performed as part of a data-out operation, instead of as a calibration process. As part of a data-out operation, the duty cycle correction circuit 400 may adjust the delay amount of the adjustable delay circuit 406, and in turn correct for duty cycle distortion in the output clock signal CLKOUT while the data retrieving IC is output the data signals DOUT along with the complementary output clock signals CLKOUT, CLKOUb during the data-out operation. One benefit or advantage of performing duty cycle correction on-the-fly as opposed to as part of a calibration or training process is that process-voltage-temperature (PVT) variations may cause the duty cycle of the output clock signal CLKOUT to fluctuate, including vary or veer from the target duty cycle. The duty cycle correction circuit 400 may correct the duty cycle distortion on-the-fly by continuously monitoring for and adjusting the duty cycle, through adjustment of the adjustable delay circuit 406, as necessary throughout the course of the data-out operation.

In addition or alternatively, to perform on-the-fly duty cycle correction, the data requesting IC 102 may append a predetermined number of dummy clock cycles, including a predetermined number of dummy clock pulses, to the beginning of the input clock signal CLKIN that it sends during a data-out operation. Doing so may give the duty cycle correction circuit 400 an initial period of time during the data-out operation to correct for duty cycle distortion before sending the output data signals DOUT back to the data requesting IC 102 for the data-out operation. In order to carry out the duty cycle correction process as an on-the-fly process, the DLL circuit 402 and the delay circuits 406, 408 may be implemented as analog circuits instead of digital circuits, in that their biasing circuits may bias the delay cells at or according to a biasing setting determined from an analog control voltage, rather than from one or more digital codes.

FIG. 7 shows a block diagram of an example analog DLL circuit 700. The DLL circuit 700 is similar to the digital DLL circuit 500 of FIG. 5 in that the DLL circuit 700 includes a delay chain 702 configured to receive the pre-intermediate clock signal CLKIpr from the input clock path circuit 302, and delay the pre-intermediate clock signal CLKIpr to generate the pair of complementary second pre-intermediate or delay-locked clock signals CLKI2*pr*, CLKI2*prb*. The delay chain 702 may include an n-number of delay cells DC to perform the delaying and generate the complementary delay-locked clock signals CLKI2*pr*, CLKI2*prb*. The analog DLL circuit 700 may also include a biasing circuit 704 configured to bias the delay cells DC by supplying bias signals BS that set the amount of the delay unit with which the delay cells DC are each configured to delay their local input signals.

The analog DLL circuit 700 may further include a DLL controller 706 that controls the biasing circuit 704 and compares the phase difference between the pre-intermediate clock signal CLKIpr and the first delay-locked clock signal CLKI2pr to find a locked bias setting that causes the delay chain 702 to delay the pre-intermediate clock signal by a locked delay amount to generate the first delay-locked clock signal CLKI2pr. Like the digital DLL controller 506, the DLL controller 706 may include a phase detection circuit 708 to detect the phase difference and output a phase detection result signal PDR indicating the detected phase difference, and a charge pump circuit 710 configured to generate a charge pump voltage $V_{CP}$ at a level corresponding to the detected phase difference. However, instead of including a comparator and a code selection circuit, the DLL controller 706 may include a loop filter 712 coupled to the output of the charge pump circuit 710. The loop filter 712 may be configured to convert the charge pump voltage 712 into a more stable voltage for the biasing circuit 704 to receive to generate its biasing signals BS. The loop filter 712 may be a low pass filter, such as a resistor-capacitor (RC) low pass filter, although other loop filter configurations may be possible. The stable voltage that the loop filter 712 outputs may be referred to as a control voltage Vctrl1.

The control voltage Vctrl1 may be an analog voltage signal that has its level continuously adjusted to change the bias setting of the biasing circuit 704, as opposed to a digital voltage signal or code CODE1 having a p-bit number of voltages at discrete high and low voltage levels to indicate a p-bit binary number. In this context, the biasing circuit 704 may be considered an analog biasing circuit, rather than a DAC biasing circuit, in that it converts an analog voltage signal to a plurality of analog bias signals BS. The biasing circuit 704 may be configured in any of various ways in order to generate bias signals BS at a bias setting corresponding to a level of the control voltage Vctrl1. For example, the biasing circuit 704 may include a transistor that has a gate terminal configured to receive the control voltage Vctrl1, generate a current in response to receipt of the control voltage Vctrl1, and change a level of the current in response to a change in level of the control voltage Vctrl1. The biasing circuit 704 may further include current mirror circuitry that mirrors the current generated by the transistor, and that supplies the mirrored currents as the biasing signals BS to the delay cells DC in order to set and/or adjust the delay unit of the delay cells DC.

During an on-the-fly duty cycle correction process, the number of dummy clock cycles included at the beginning of the input clock signal CLKIN may be a sufficient enough number to allow the DLL controller 706 to identify a voltage level of the control voltage Vctrl1 that causes the delay chain 702 to delay the pre-intermediate clock signal CLKIpr by the delay locked amount. This way, by the time that the data retrieving IC 104 receives the first pulse of the input clock signal CLKIN used to generate the initial pulses of the output data signals DOUT, the analog DLL circuit 700 will be locked.

Referring to FIG. 8, for use in conjunction with the analog DLL circuit 700 of FIG. 7 for performance of an on-the-fly duty cycle correction process, the adjustable delay circuit 406 may be configured as an analog adjustable delay circuit 802 and the fixed delay circuit 408 may be configured as a fixed delay circuit 804. Similar to the configuration in FIG. 6, the adjustable delay circuit 802 may include a delay chain 806 including an m-number of delay cells DC, and a biasing circuit 808 configured to bias the delay cells DC of the delay chain 806. In addition, the delay chain 806 is configured to receive first delay-locked clock signal CLKI2pr, and delay the first delay-locked clock signal CLKI2pr by a delay amount corresponding to the bias setting at which the biasing circuit 808 outputs its bias signals BS in order to generate the first intermediate clock signal CLKI.

Similarly, the fixed delay circuit 804 may include a delay chain 810 including an m-number of delay cells DC, and a biasing circuit 812 configured to bias the delay cells DC of the delay chain 810. In addition, the delay chain 810 is configured to receive second delay-locked clock signal CLKI2prb, and delay the second delay-locked clock signal CLKI2prb by a delay amount corresponding to the bias setting at which the biasing circuit 812 outputs its bias signals BS in order to generate the second intermediate clock signal CLKIb.

As with the biasing circuit 704 of the analog DLL circuit 700 of FIG. 7, the biasing circuits 808, 812 may be configured to output their respective bias signals in response to receipt of analog signals rather than a digital signal or code. With respect to the fixed delay circuit 804, the biasing circuit 812 may receive a default bias voltage VB_def to set the amount of the delay unit for the delay cells DC of the delay chain 810. The default bias voltage VB_def may be generated by a voltage source located on-chip (i.e., is a circuit component of the data retrieving IC 104), off-chip external to the data retrieving IC 104, or in some example embodiments, may be the control voltage Vctrl1 generated by the DLL controller 706 of the analog DLL circuit 700.

The biasing circuit 812 may be configured to output the bias signals BS at a default bias setting corresponding to a level of the default bias voltage VB_def. As previously described, the level of the bias signals BS may set the amount of the delay unit with which each of the delay cells DC delays its local input signal. For at least some example configurations, the last delay cell DC(m) of the delay chain 810 is configured to generate the second intermediate clock signal CLKb, and so the delay amount by which the delay chain 810 is configured to delay the second delay-locked clock signal CLKI2prb to generate the second intermediate clock signal CLKIb is equal to the amount of the one delay unit multiplied by the number of delay cells m.

During a duty cycle correction process, the fixed delay circuit 804 may delay the second delay-locked clock signal CLKI2prb by a constant amount to generate the second intermediate clock signal CLKIb while the adjustable delay circuit 802 is adjusting its delay amount to generate the first intermediate clock signal CLKI. To do so, the voltage source may generate the default bias voltage VB_def at a constant level to cause the biasing circuit 812 to generate its bias signals at a constant bias setting, which in turn causes the delay chain 810 to delay the second delay-locked clock signal CLKI2prb with a constant delay.

The adjustable delay circuit 802 may be configured to set and/or adjust its delay amount by adjusting the bias setting at which the biasing circuit 808 biases the delay cells DC of the delay chain 806, as opposed to including a selection circuit that adjusts the number of delay cells used to generate the intermediate clock signal CLKI and/or that selects different local output signals in order to adjust the delay amount.

For use with analog adjustable and fixed delay circuits 802, 804, the duty cycle correction controller 404 may be implemented as a duty cycle correction controller 800 that includes a duty cycle detection circuit 814. Similar to the duty cycle detection circuit 616 of FIG. 6, the duty cycle detection circuit 814 may be configured to detect the duty cycle level of the output signal CLKOUT by receiving and detecting the duty cycle level of the buffered clock signal CLKBF. In response to detecting the duty cycle level, the duty cycle detection circuit 814 may be configured to output a control voltage Vctrl2 to the biasing circuit 808 at a level corresponding to the detected duty cycle level. The duty cycle detection circuit 814 will respond to a change in the duty cycle level of the output clock signal CLKOUT and/or the buffered clock signal CLKBF by changing the level of the control voltage Vctrl2, which in turn causes the biasing circuit 808 to change the bias setting at which it is generating its bias signals, and which in turn changes the delay amount by which the delay chain 806 delays the first delay-locked clock signal CLKI2*pr* to generate the intermediate clock signal CLKI.

The biasing circuit 808 is configured to change the bias setting in response to a change in the level of the control voltage Vctrl2 to effect a change in the delay amount that will cause the duty cycle level of the output clock signal CLKOUT and/or the buffered clock signal CLKBF to move toward the target duty cycle level and reduce the duty cycle distortion in the output clock signal CLKOUT. For example, if the duty cycle level of the output clock signal CLKOUT and/or the buffered clock signal CLKBF is above the target duty cycle level, the duty cycle detection circuit 814 will output the control voltage Vctrl2 at a level corresponding to the duty cycle level, which will cause the biasing circuit 808 to output the bias signals BS at a biasing setting that sets a delay amount of the delay chain 808 that will cause the duty cycle level of the output clock signal CLKOUT and/or the buffered clock signal CLKBF to decrease toward the target duty cycle level. The duty cycle detection circuit 814 will respond to the decrease in duty cycle level by changing the level of the control signal Vctrl2, which in turn will cause the biasing circuit 808 to change the bias setting. The change in bias setting will change the delay amount which will further cause the duty cycle level of the output clock signal CLKOUT and/or the buffered clock signal CLKBF to decrease toward the target duty cycle level. As another example, if the duty cycle level of the output clock signal CLKOUT and/or the buffered clock signal CLKBF is below the target duty cycle level, the duty cycle detection circuit 814 will output the control voltage Vctrl2 at a level corresponding to the duty cycle level, which will cause the biasing circuit 808 to output the bias signals BS at a biasing setting that sets a delay amount of the delay chain 808 that will cause the duty cycle level of the output clock signal CLKOUT and/or the buffered clock signal CLKBF to increase toward the target duty cycle level. The duty cycle detection circuit 814 will respond to the increase in duty cycle level by changing the level of the control signal Vctrl2, which in turn will cause the biasing circuit 808 to change the bias setting. The change in bias setting will change the delay amount which will further cause the duty cycle level of the output clock signal CLKOUT and/or the buffered clock signal CLKBF to increase toward the target duty cycle level.

For performance of an on-the-fly duty cycle correction process, the data requesting IC 102 may append a sufficient number of dummy clock cycles to the beginning of the input clock signal CLKIN so that by the time the data retrieving IC 104 receives a first clock pulse of the input clock signal CLKIN that is used to generate initial data pulses of the output data signals DOUT, the biasing circuit 808 will be biasing the delay cells DC of the delay chain 806 at a relatively constant bias setting that causes the output clock path circuit 304 to generate the output clock signal CLKOUT with a generally constant duty cycle at the target duty cycle level or with minimal duty cycle distortion.

Referring briefly back to FIG. 4, in other example embodiments of the duty cycle correction circuit 400, both of the delay circuits 406, 408 may be adjustable, rather than only one of the delay circuits. For such embodiments, the duty cycle correction controller 404 is configured to control the delay amounts of both delay circuits 406, 408 during a duty cycle correction process based on a detected duty cycle level of the output clock signal CLKOUT or the buffered clock signal CLKBF. Accordingly, when digital delay circuits are implemented, both of the delay circuits 406, 408 may be configured as the adjustable delay circuit 602 in FIG. 6, and have their respective delay amounts adjusted through control of the duty cycle collection controller 600. Alternatively, when analog delay circuits are implemented, both of the delay circuits 406, 408 may be configured as the adjustable delay circuit 802 in FIG. 8 and have their respective delay amounts adjusted through control of the duty cycle correction controller 800.

Various ways of configuring the duty cycle correction circuit 400 to adjust both delay circuits 406, 408 to correct for duty cycle distortion may be possible. For some example configurations, the duty cycle correction controller 404 may utilize a complementary or differential control scheme such that when the duty cycle correction controller 404 increases the delay amount of one of the delay circuits 406, 408, the controller 404 correspondingly decreases the delay amount of the other of the delay circuits 406, 408. The resulting combined increase and decrease of the delays of the complementary intermediate clock signals CLKI, CLKIb, in turn, causes the adjustment in duty cycle of the output clock signal CLKOUT.

FIG. 9 is a block diagram of the circuit components of the data retrieving IC 104 in FIG. 3, with a skew correction circuit 900 positioned in between the intermediate clock generation circuit 322 and the clock inputs C1, C2 of the output path circuits 304, 306, 308. For clarity, the data source circuit 318, the data transfer circuit 320, and the internal pulse generation and driver circuits 324, 326 of the output path circuits 304, 306, 308 shown in FIG. 3 are omitted in FIG. 9. Also, instead of just showing an ith bidirectional data line 114(*i*), an ith output data path circuit 308(*i*), an ith I/O data node 316(*i*), and an ith DIN input buffer 332(*i*) that generate and communicate the ith output data signal DOUT(i) and the ith buffered data signal DOUTBF(i), FIG. 9 shows a plurality of such components, including first through Nth bidirectional data lines 114(1) to 114(N), first through Nth output data path circuit 308(1) to 308(N), first through Nth I/O data nodes 316(1) to 316(N), and first through Nth DIN input data buffers 332(1) to 332(N) configured to generate and communicate the first through Nth output data signals DOUT(1) to DOUT(N) and the first through Nth buffered data signals DOUTBF(1) to DOUTBF(N).

In contrast to the configuration in FIG. 3, the intermediate clock signals CLKI, CLKIb output from the intermediate clock generation circuit 322 are not input directly to the clock input C1, C2 of the output path circuits 304, 306, 308. Instead, the skew correction circuit 900 is configured to receive or intercept the intermediate clock signals CLKI, CLKIb, and delay them to in order to reduce skew between the output clock and data signals CLKOUT, CLKOUTb, DOUT.

In further detail, the skew correction circuit 900 may be configured to reduce skew between the output clock and data signals CLKOUT, CLKOUTb, DOUT during a skew correction process by treating the output clock signal CLKOUT as a reference output signal that has a fixed delay amount by which it is generated during the skew correction process, and by adjusting delay amounts at which the other output signals CLKOUTb, DOUT are generated. The skew correction circuit 900 adjusts the delay amounts of the other output signals CLKOUTb, DOUT so that respective actual differences between reference output clock signal CLKOUT and each of the other output signals CLKOUTb, DOUT moves toward the target differences at which data retrieving IC 104 is to output the output clock and data signals CLKOUT, CLKOUTb, DOUT to the data requesting IC 102.

During a skew correction process, the skew correction circuit 900 is configured to fix a delay amount of the output clock signal CLKOUT while adjusting the delay amounts of the other output signals CLKOUTb, DOUT by delaying the intermediate clock signals CLKI, CLKIb in order to generate a plurality of pairs of complementary delayed intermediate clock signals CLKId, CLKIbd that are input to the clock inputs C1, C2 of the respective output path circuits 304, 306, 308. The skew correction circuit 900 includes a plurality of pairs of delay circuits that delay the intermediate clock signal CLKI, CLKb. Each pair of delay circuits includes a first delay circuit 902 configured to receive and delay the first intermediate clock signal CLKI and a second delay circuit 904 configured to receive and delay the second intermediate clock signal CLKIb.

Each pair of delay circuits 902, 904 is configured to delay the pair of intermediate clock signals CLKI, CLKIb to generate a respective one of the pairs of delayed intermediate clock signals CLKId, CLKIdb and output the respective pair to an associated output clock path circuit. In particular, a pair of delay circuits 902(C), 904(C) are configured to delay the pair of intermediate clock signals CLKI, CLKIb to generate a pair of delayed intermediate clock signals CLKId(C), CLKIdb(C) and output those clock signals CLKId(C), CLKIdb(C) to the clock inputs C1, C2 of the output clock path circuit 304 for generation of the output clock signal CLKOUT. In addition, a pair of delay circuits 902(CC), 904(CC) are configured to delay the pair of intermediate clock signals CLKI, CLKIb to generate a pair of delayed intermediate clock signals CLKId(CC), CLKIdb(CC) and output those clock signals CLKId(CC), CLKIdb(CC) to the clock inputs C1, C2 of the complementary output clock path circuit 306 for generation of the complementary output clock signal CLKOUTb. Also, a pair of delay circuits 902(D1), 904(D1) are configured to delay the pair of intermediate clock signals CLKI, CLKIb to generate a pair of delayed intermediate clock signals CLKId(D1), CLKIdb(D1) and output those clock signals CLKId(D1), CLKIdb(D1) to the clock inputs C1, C2 of the first output data path circuit 308(1) for generation of the first output data signal DOUT(1). Further, a pair of delay circuits 902(DN), 904(DN) are configured to delay the pair of intermediate clock signals CLKI, CLKIb to generate a pair of delayed intermediate clock signals CLKId(DN), CLKIdb(DN) and output those clock signals CLKId(DN), CLKIdb(DN) to the clock inputs C1, C2 of the Nth output data path circuit 308(N) for generation of the Nth output data signal DOUT(N).

During the skew correction process, the skew correction circuit 900 may treat the output clock signal CLKOUT as a reference clock signal in that the skew correction circuit 900 corrects skew for the complementary output clock signal CLKOUTb and each of the output data signals DOUT(1) to DOUT(N) with reference to the output clock signal CLKOUT. To do so, during a skew correction process, the delay circuits 902(C), 904(C) keep fixed their delay amounts to generate the delayed intermediate clock signals CLKId(C), CLKIbd(C) used to generate the output clock signal CLKOUT, while the other delay circuits 902(CC), 904(CC) and 902(D1), 904(D1) to 902(DN), 904(DN) adjust their respective delay amounts to generate the delayed intermediate clock signals CLKId(CC), CLKIbd(CC) and CLKId(D1), CLKIbd(D1) to CLKId(DN), CLKIbd(DN) used to generate the other output clock and data signals CLKOUTb and DOUT(1) to DOUT(N). The delay circuits 902(C), 904(C) that generate the pair of delayed intermediate clock signals CLKId(C), CLKIbd(C) with a fixed delay amount during a skew correction process are referred to as first and second fixed delay circuits 902(C), 904(C). The delay circuits 902(CC), 904(CC) and 902(D1), 904(D1) to 902(DN), 904(DN) that adjust their delay to generate the pairs of delayed intermediate clock signals CLKId(CC), CLKIbd(CC) and CLKId(D1), CLKIbd(D1) to CLKId(DN), CLKIbd(DN) are referred to as adjustable delay circuits 902(CC), 904(CC) and 902(D1), 904(D1) to 902(DN), 904(DN).

The skew correction circuit 900 may further include a plurality of skew correction controllers 906 to correct for skew between the reference output clock signal CLKOUT and each of the other output signals CLKOUTb, DOUT. In the example configuration shown in FIG. 9, the skew correction controllers 906 independently correct for skew between the reference output clock signal CLKOUT and each of the other output signals CLKOUTb, DOUT. To do so, each skew correction controller 906 is configured to correct for skew between the output clock signal CLKOUT and an associated one of the other output signals CLKOUTb, DOUT. For example, a skew correction controller 906(CC) is configured to correct for skew between the output clock signal CLKOUT and the complementary output clock signal CLKOUTb; a skew correction controller 906(D1) is configured to correct for skew between the output clock signal CLKOUT and the first output data signal DOUT(1); and a skew correction controller (DN) is configured to correct for skew between the output clock signal CLKOUT and the Nth output data signal DOUT(N).

The plurality of skew correction controller 906 may correct for skew by controlling the delay amounts of each of the pairs of adjustable delay circuits 902, 904. In the configuration shown in FIG. 9, the skew controllers 906 independently correct for skew between the reference output clock signal CLKOUT and each of the other output signals CLKOUTb, DOUT by independently controlling the delay amounts by which each of the pairs adjustable delay circuits 902, 904 delay the intermediate clock signals CLKI, CLKIb. In particular, each skew correction controller 906 controls the delay amounts of the pair of adjustable delay circuits 902, 904 that generate the respective pair of delayed intermediate clock signals CLKId, CLKIdb used to generate the other output signal CLKOUTb, DOUT for which the skew correction controller 906 is configured for skew.

Further, each skew correction controller 906 is configured to determine how to delay a respective pair of adjustable delay circuits 902, 904 based on a detected or identified phase difference between the reference output clock signal CLKOUT and the other output clock signal for which it is configured to correct for skew. For example, the skew correction controller 906(CC) determines how to delay the adjustable delay circuits 902(CC), 904(CC) that generate the delayed intermediate clock signals CLKId(CC), CLKIbd (CC) used to generate the complementary output clock signal CLKOUTb based on a detected phase difference between the output clock signal CLKOUT and the complementary output clock signal CLKOUTb. In addition, the skew correction controller 906(D1) determines how to delay the adjustable delay circuits 902(D1), 904(D1) that generate the delayed intermediate clock signals CLKId(D1), CLKId (D1) used to generate the first output data signal DOUT(1) based on a detected phase difference between the output clock signal CLKOUT and the first output data signal DOUT(1). Also, the skew correction controller 906(DN) determines how to delay the adjustable delay circuits 902 (DN), 904(DN) that generate the delayed intermediate clock signals CLKId(DN), CLKIbd(DN) used to generate the Nth output data signal DOUT(N) based on a detected phase difference between the output clock signal CLKOUT and the Nth output data signal DOUT(N).

In order to detect phase differences between the reference output clock signal CLKOUT and the other output signals CLKOUTb, DOUT, the skew correction controllers 906 are configured to detect phase differences between the buffered clock signal CLKBF and the other buffered signals received from the DIN input buffers 330, 332. Just like the duty cycle of the buffered clock signal CLKBF indicates the duty cycle of the output clock signal CLKOUT as described with reference to FIG. 4, the phase difference between two buffered clock signals received from two of the DIN input buffers 328, 330, 332 indicates the phase difference between the two output signals from which the two buffered clock signals are generated. Accordingly, the skew correction controller 906(CC) is configured to detect a phase difference between the output clock signal CLKOUT and the complementary output clock signal CLKOUTb by detecting a phase difference between the buffered clock signal CLKBF and the complementary buffered clock signal CLKBFb; the skew correction controller 906(D1) is configured to detect a phase difference between the output clock signal CLKOUT and the first output data signal DOUT(1) by detecting a phase difference between the buffered clock signal CLKBF and the first buffered data signal DOUTBF(1); and the skew correction controller 906(DN) is configured to detect a phase difference between the output clock signal CLKOUT and the Nth output data signal DOUT(N) by detecting a phase difference between the buffered clock signal CLKBF and the Nth buffered data signal DOUTBF(N).

In addition, each skew correction controller 906 may be configured to receive the buffered clock signal CLKBF from the DIN input clock buffer 328 and one of the other buffered signals CLKBFb, DOUTBF from one of the other input buffers 330, 332 outputting the other buffered signal in order to detect a phase difference between the buffered clock signal CLKBF and the other buffered signal. Accordingly, the skew correction controller 906(CC) may be configured to receive the buffered clock signal CLKBF from the DIN input clock buffer 328 and the complementary buffered clock signal CLKBFb from the complementary DIN input clock buffer 330 in order to detect the phase difference between the buffered and complementary buffered clock signals CLKBF, CLKBFb; the skew correction controller 906(D1) may be configured to receive the buffered clock signal CLKBF from the DIN input clock buffer 328 and the first buffered data signal DOUTBF(1) from the first DIN input data buffer 332(1) in order to detect the phase difference between the buffered clock signal CLKBF and the first buffered data signal DOUTBF(1); and the skew correction controller 906(DN) may be configured to receive the buffered clock signal CLKBF from the DIN input clock buffer 328 and the Nth buffered data signal DOUTBF(N) from the Nth DIN input buffer 332(N) in order to detect the phase difference between the buffered clock signal CLKBF and the Nth buffered data signal DOUTBF(N).

In sum, each skew correction controller 906 is configured to correct for skew between the output clock signal CLKOUT and a respective one of the other output signals CLKOUTb, DOUT by: receiving the buffered clock signal CLKBF from the DIN input clock buffer 328 and one of other buffered signals CLKBFd, DOUTBF from one of the other DIN input buffers 330, 332; detecting a phase difference between the buffered clock signal CLKBF and the other buffered signal CLKBFd, DOUTBF; and setting and/or adjusting delay amounts of a respective one of the pairs of adjustable delay circuits 902, 904 that generate the respective one of the pairs of delayed intermediate clock signals CLKId, CLKIdb used to generate the respective one of the other output signals CLKOUTb, DOUT.

During a skew correction process, the skew correction controllers 906 adjusts delay amounts of their respective adjustable delay circuits 902, 904 to move respective actual differences between the output clock signal CLKOUT and each of the other output signals CLKOUTb, DOUT to their respective target differences. To do so, a given skew correction controller 906 detects a phase difference between the output clock signal CLKOUT and one of the other output signals CLKOUTb, DOUT, and based on the detected difference, determines a correction direction that identifies a delay direction to adjust a delay amount to generate the other output signal in order to move the actual difference between the output clock signal CLKOUT and the other output signal to the target difference. The correction direction may be one of two directions, including an increasing correction direction and a decreasing correction direction. The increasing correction direction is a correction direction that increases a delay amount by which the other output signal is generated, and the decreasing correction direction is a correction direction that decreases the delay amount by which the other output signal is generated. In response to identifying the correction direction, the given skew correction controller 906 adjusts the delay amounts of the adjustable delay circuits 902, 904 that it controls in the identified correction direction. The given skew correction controller 906 may continue to adjust the delay amounts in the identified correction direction until the skew correction controller 906 identifies that the output clock signal CLKOUT and the other output signal no longer have skew, or upon identifying that a time period for performing the skew correction process has ended.

The skew correction circuit 900 may perform a skew correction process either as a calibration process that is performed with training input clock signals in advance of data-out operations, or as an on-the-fly process that is performed as part of a data-out operation. For at least some embodiments of the skew correction circuit 900 that perform the skew correction process as a calibration process, the fixed delay circuits 902(C), 904(C) may each be configured like, such as by having the components of, the fixed delay circuit 604, and the adjustable delay circuits 902(CC), 904(CC), and 902(D1), 904(D1) to 902(DN), 904(DN) may each be configured like, such as by having the components of, the adjustable delay circuit 602 of FIG. 6. For at least some of these embodiments, the intermediate clock generation circuit 322 may be configured as a DLL circuit, such as the digital DLL circuit 500 of FIG. 5. For such embodiments, the intermediate clock generation circuit 322, as a digital DLL circuit, may be configured to output its digital code to DAC biasing circuits of each of the delay circuits 902, 904. In other example embodiments, the intermediate clock generation circuit 322 may be configured as a circuit component different than a DLL circuit, such as a phase splitter for example, that is not able to output a digital code to set the bias settings of the bias circuits of the delay circuits. For these embodiments, the biasing circuits of the delay circuits 902, 904 may be configured to receive a default digital code. In addition, the skew correction controllers 906 may each be configured like, such as by having the components of, the duty cycle correction controller 600, except that instead of having a duty cycle detection circuit 616, the skew correction controllers 906 may each have a phase detection circuit and a charge pump, such as the phase detection circuit 508 and the charge pump circuit 510 of the DLL controller 506 of FIG. 5. Each phase detection circuit of a skew correction controller 906 may be configured to receive the buffered clock signal CLKBF from the DIN input buffer 328 and one of the other buffered signals from one of the other DIN input buffers 330, 332.

Also, another difference between the configurations that perform skew correction as a calibration process and the configurations that perform skew correction as an on-the-fly process is that for configurations that perform skew correction as a calibration process, the output path circuits 304, 306, 308 may each receive their respective data input signals DX, DY at their respective first and second data inputs D1, D2 at the same high level VDD or the same low level VSS. For example, each of the first data inputs D1 of each of the output path circuits 304, 306, 308 may receive the high level VDD, and each of the second data inputs D2 of each of the output path circuits 304, 306, 308 may receive the low level VSS. Alternatively, each of the first data inputs D1 of each of the output path circuits 304, 306, 308 may receive the low level VSS, and each of the second data inputs D2 of each of the output path circuits 304, 306, 308 may receive the high level VDD. By configuring the first data inputs D1 to receive the same high level VDD or the same low level VSS, and the second data inputs D2 to receive the same high level VSS or the same low level VSS, the skew correction circuit 900 may perform skew correction during calibration by aligning the phases of each of the complementary output clock signal CLKOUTb and the output data signals DOUT(1) to DOUT (N) with phase of the reference output clock signal CLKOUT, so that the output signals CLKOUT, CLKOUT, DOUT are in phase, have matching phases, and/or are edge aligned with each other.

In contrast, during an on-the-fly skew correction process, the data inputs D1, D2 of the different output path circuits 304, 306, 308 may receive their respective data input signals DX, DY normally, i.e. as they would during the normal course of operation, as previously described with respect to FIG. 3. However, as an on-the-fly process, the skew correction circuit 900 can check and correct for skew between the output clock signal CLKOUT and the other output signals CLKOUTb, DOUT as the data retrieving IC 104 transmits the clock and data signals CLKOUT, CLKOUTb, DOUT to the data requesting IC 102 as part of the data-out operation.

In addition, for at least some embodiments of the skew correction circuit 900 that perform the skew correction process as an on-the-fly process, the fixed delay circuits 902(C), 904(C) may each be configured like, such as by having the components of, the fixed delay circuit 804, and the adjustable delay circuits 902(CC), 904(CC), and 902 (D1), 904(D1) to 902(DN), 904(DN) may each be configured like, such as by having the components of, the adjustable delay circuit 802 of FIG. 8. In addition, the skew correction controller 906 may each be configured similar to the duty cycle correction controller 800, except that instead of having a duty cycle detection circuit, the skew correction controllers 906 may each have a phase detection circuit and a charge pump, such as the phase detection circuit 508 and the charge pump circuit 510 of the DLL controller 506 of FIG. 5. Each phase detection circuit of a skew correction controller 906 may be configured to receive the buffered clock signal CLKBF from the DIN input buffer 328 and one of the other buffered signals from one of the other DIN input buffers 330, 332.

In addition, as previously described, the skew correction circuit 900 is configured to correct for skew by independently or individually correcting for skew between the output clock signal CLKOUT and each of the other output signals CLKOUTb, DOUT. The skew correction circuit 900 does this by including skew correction controller 906 that detect the phase differences of each combination of the output clock signal CLKOUT and one of the other output signals CLKOUTb, DOUT. In other example configurations, the skew correction circuit 900 may correct for skew by detecting the phase differences for less than all of the combinations of the output clock signal CLKOUT and one of the other output signals CLKOUTb, DOUT. Although such configurations are not able to independently correct for skew, such configurations may be desirable in that it uses fewer numbers of skew correction controllers 906, which in turn saves or consumes less space on the data retrieving IC 104. At a minimum, the skew correction circuit 900 includes one skew correction circuit 906 that detects a phase difference between the output clock signal CLKOUT and one of the other output signals CLKOUTb, DOUT. Based on the detected phase difference, the skew correction circuit 906 adjusts the pairs of adjustable delay circuits 902, 904.

In some example configurations that implement a fewer number of skew correction controllers, the fewer number may be dependent on physical positions of the I/O data nodes 316 relative to the clock nodes 310, 312. FIG. 10 illustrates an example configuration where the I/O data nodes 316 are grouped into two groups of I/O data nodes, including a first group and a second group. As shown in FIG. 10, the first and second groups of I/O data nodes are physically positioned on opposite sides of the clock nodes 310, 312, 314. Otherwise stated, the clock nodes 310, 312, 314 are positioned between the two different groups of I/O data nodes. The first group of I/O data nodes is shown in FIG. 10 as including the first through Mth I/O data nodes 316(1) to 316(M), and the second group of I/O data nodes is shown as including an (M+1)th through the Nth I/O data nodes 316(M+1) to 316(N).

In one example embodiment, the skew correction circuit 900 may include two skew correction controllers 906, including a jth skew correction controller 906($j$) and a kth skew correction controller 906($k$). The jth skew correction controller 906($j$) may be configured to detect a phase difference between the output clock signal CLKOUT and a jth output data signal DOUT(j), which may be any of the first through Mth output data signals DOUT(1) to DOUT(M) generated at the first group of I/O data nodes 316(1) to 316(M). Based on the detected phase difference, the jth skew correction controller 906($j$) is configured to control those adjustable delay circuits 902, 904 that generate delayed intermediate clock signals CLKId, CLKIbd that are used to generate the first through Mth output data signals DOUT(1) to DOUT(M). Similarly, the kth skew correction controller 906($k$) may be configured to detect a phase difference between the output clock signal CLKOUT and a kth output data signal DOUT(k), which may be any of the (M+1)th through Nth output data signals DOUT(M+1) to DOUT(N)

generated at the second group of I/O data nodes 316(M+1) to 316(N). Based on the detected phase difference, the kth skew correction controller 906(k) is configured to control those adjustable delay circuits 902, 904 that generate delayed intermediate clock signals CLKId, CLKIbd that are used to generate the (M+1)th through Nth output data signals DOUT(M+1) to DOUT(N). Various other example configurations having reduced numbers of skew correction controllers 906 may be possible.

FIG. 11 shows a block diagram of an example configuration of the data retrieving IC 104 that is configured to perform both a duty cycle correction process and a skew correction process by including both the duty cycle correction circuit 400 of FIG. 4 and the skew correction circuit of FIG. 9. In at least some example configurations, the duty cycle correction circuit 400 is configured to perform its duty cycle correction process first before the skew correction circuit 900 performs its skew correction process. When the duty cycle correction circuit 400 completes the duty cycle correction process, then the skew correction circuit 900 begins performing the skew correction process. For example, the duty cycle correction circuit 400 may first adjust its adjustable delay circuit 406 until it identifies the target delay amount that minimizes the duty cycle distortion in the output clock signal CLKOUT, and then the skew correction controllers 906 of the skew correction circuit 900 may begin adjusting the adjustable delay circuits 902, 904 to minimize skew between the output clock signal CLKOUT and the other output signals CLKOUTb, DOUT. The combined duty cycle and skew correction processes may be performed as calibration or on-the-fly processes, and/or with digital or analog DLL and delay components, as previously described.

A means for delaying a first intermediate clock signal to output a second intermediate clock signal, in various embodiments, may include the adjustable delay circuit 406, the adjustable delay circuit 602, or the adjustable delay circuit 802, or the like. Other embodiments may include similar or equivalent means for delaying an intermediate clock signal.

A means for generating a plurality of clock pulses in response to receipt of a clock signal, in various embodiments, may include an output clock path circuit 304, a complementary output clock path circuit 306, a pulse generation circuit 324(C), a pulse generation circuit 324(CC), or the like. Other embodiments may include similar or equivalent means for generating a plurality of clock pulses.

A means for generating an output clock signal based on a plurality of clock pulses, in various embodiments, may include an output clock path circuit 304, a complementary output clock path circuit 306, a driver circuit 326(C), a driver circuit 326(CC), or the like. Other embodiments may include similar or equivalent means for generating an output clock signal.

A means for generating a buffered clock signal, in various embodiments, may include a data-in input clock buffer 328, a complementary data-in input clock buffer 330, or the like. Other embodiments may include similar or equivalent means for generating a buffered clock signal.

A means for detecting a duty cycle level of a clock signal, in various embodiments, may include a duty cycle duty cycle correction controller 404, a duty cycle detection circuit 616, a duty cycle detection circuit 814, a low pass filter, or the like. Other embodiments may include similar or equivalent means for detecting a duty cycle level of a clock signal.

A means for adjusting a delay amount of a delay circuit, in various embodiments, may include a duty cycle detection controller 404, a code selection circuit 620, a duty cycle detection circuit 814, or the like. Other embodiments may include similar or equivalent means for adjusting a delay amount.

A means for delaying a first intermediate clock signal to output a second intermediate clock signal, in various embodiments, may include a skew correction circuit 900, an adjustable delay circuit 902 or 904, or the like. Other embodiments may include similar or equivalent means for delaying an intermediate clock signal.

A means for generating a plurality of data pulses in response to receipt of the second intermediate clock signal, in various embodiments, may include an ith output data path circuit 308(i), an ith pulse generation circuit 324(Di), or the like. Other embodiments may include similar or equivalent means for generating a plurality of data pulses.

A means for generating an output data signal based on the plurality of data pulses, in various embodiments, may include an ith output data path circuit 308(i), an ith driver circuit 326(Di), or the like. Other embodiments may include similar or equivalent means for generating an output data signal.

A means for generating a buffered data signal in response to receipt of the output data signal, in various embodiments, may include an ith data-in input data buffer 332(i) or the like. Other embodiments may include similar or equivalent means for generating a buffered data signal.

A means for detecting a phase difference between the buffered data signal and a reference clock signal, in various embodiments, may include an ith skew correction controller 906(Di), or the like. Other embodiments may include similar or equivalent means for detecting a phase difference.

A means for adjusting a delay amount of the means for delaying in response to the detected phase difference, in various embodiments, may include a skew correction circuit 900, an ith skew correction controller 906(Di), or the like. Other embodiments may include similar or equivalent means for adjusting a delay amount.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a delay circuit configured to output a delayed clock signal to a clock input of an output data path circuit;
   an input buffer configured to generate a buffered data signal in response to receipt of an output data signal from the output data path circuit; and
   a skew correction controller configured to:
   identify a phase difference between the buffered data signal and a reference clock signal; and
   adjust a delay amount of the delay circuit in response to the identified phase difference between the buffered data signal and the reference clock signal.

2. The circuit of claim 1, wherein the skew correction controller is configured to adjust the delay amount of the delay circuit until the skew correction controller identifies that the phase difference has reached a target difference.

3. The circuit of claim 1, wherein the input buffer comprises a first input buffer, the reference clock signal comprises a buffered clock signal, the circuit further comprising a second input buffer configured to generate the buffered clock signal in response to receipt of an output clock signal.

4. The circuit of claim 1, wherein the delay circuit comprises a first delay circuit, the delayed clock signal comprises a first delayed clock signal, the clock input comprises a first clock input, and the circuit further comprising:
a second delay circuit configured to output a second delayed clock signal to a second clock input of the output data path circuit,
wherein the skew correction controller is configured to adjust the second delay circuit by the delay amount in response to the identified phase difference.

5. The circuit of claim 1, further comprising:
an output clock path circuit configured to generate an output clock signal for generation of the reference clock signal,
wherein data inputs of the output data path circuit are configured to receive a same pair of high and low voltages as data inputs of the output clock path circuit.

6. The circuit of claim 1, wherein the skew correction controller is configured to adjust the phase difference between the buffered data signal and the reference clock signal to a target difference during a data-out operation.

7. The circuit of claim 1, wherein the buffered data signal comprises a first buffered data signal, the skew correction controller comprises a first skew correction controller, the phase difference comprising a first phase difference, the delay amount comprising a first delay amount, the circuit further comprising:
a second skew correction controller configured to:
identify a second phase difference between a second buffered data signal and the reference clock signal; and
adjust a second delay amount of a second delay circuit in response to the identified second phase difference between the second buffered data signal and the reference clock signal.

8. The circuit of claim 7, wherein the output data signal comprises a first output data signal, and the input buffer comprises a first input buffer, the circuit further comprising a second input buffer configured to generate the second buffered data signal in response to receipt of a second output data signal.

9. The circuit of claim 1, wherein the skew correction controller comprises a first skew correction controller, the phase difference comprises a first phase difference, the delay circuit comprises a first delay circuit, and the delay amount comprises a first delay amount, the circuit further comprises:
a second skew correction controller configured to:
identify a second phase difference between a buffered complementary clock signal and the reference clock signal; and
adjust a second delay amount of a second delay circuit in response to the identified second phase difference between the buffered complementary clock signal and the reference clock signal.

10. The circuit of claim 1, wherein the delay circuit comprises a first delay circuit, the delayed clock signal comprises a first delayed clock signal, the circuit further comprising:
a second delay circuit configured to output a second delayed clock signal to the first delay circuit and to a fixed delay circuit; and
a duty cycle correction controller configured to:
identify a duty cycle of the reference clock signal; and adjust a delay amount of the second delay circuit in response to the identified duty cycle level of the reference clock signal.

11. The circuit of claim 10, wherein the skew correction controller is configured to begin adjusting the delay amount of the first delay circuit to correct for skew between the buffered data signal and the reference clock signal after the duty cycle correction controller performs a duty cycle correction process.

12. A circuit comprising:
an integrated circuit comprising:
an output data path circuit comprising:
a pulse generation circuit configured to generate data pulses in response to receipt of a delayed clock signal; and
a driver circuit configured to generate an output data signal at an input/output node of the integrated circuit in response to receipt of the data pulses;
a phase detection circuit configured to detect a phase difference between the output data signal and an output clock signal; and
a delay circuit configured to:
generate a delayed clock signal based on the detected phase difference; and
output the delayed clock signal to the pulse generation circuit.

13. The circuit of claim 12, further comprising:
a first input buffer configured to generate a buffered data signal in response to receipt of the output data signal; and
a second input buffer configured to generate a buffered clock signal in response to receipt of the output clock signal,
wherein the phase detection circuit is configured to detect the phase difference between the output data signal and the output clock signal by detection of a phase difference between the buffered data signal and the buffered clock signal.

14. The circuit of claim 12, wherein the delay circuit is configured to adjust a delay amount by which to delay an intermediate clock signal to generate the delayed clock signal until a target phase difference is reached.

15. The circuit of claim 14, wherein the delay circuit comprises a first delay circuit and the delayed clock signal comprises a first delayed clock signal, the circuit further comprising:
a second delay circuit configured to generate a second delayed clock signal complementary to the first delayed clock signal; and
a skew correction controller configured to adjust a delay of the second delay circuit by a same delay amount as the first delay circuit during a skew correction process.

16. The circuit of claim 12, wherein the pulse generation circuit comprises a first data input configured to receive a high voltage and a second data input configured to receive a low voltage during a duration of a skew correction process performed during a calibration process.

17. The circuit of claim 12, wherein the delay circuit is configured to adjust a delay amount to generate the delayed clock signal during a data-out operation.

18. The circuit of claim 12, wherein the output data path circuit comprises a first output data path circuit, the delay circuit comprising a first delay circuit, the phase detection circuit comprising a first phase detection circuit, the phase difference comprising a first phase difference, the output data signal comprising a first output data signal, the circuit further comprising:

an output clock path circuit configured to generate the output clock signal;
a second output data path circuit configured to generate a second output data signal, the first and second output data path circuits positioned on opposite sides of the output clock path circuit;
a first skew correction controller, comprising the first phase detection circuit, configured to adjust the first delay circuit based on the first phase difference; and
a second skew correction controller, comprising a second phase detection circuit, configured to adjust a second delay circuit based on a second phase difference between the second output data signal and the output clock signal.

19. A system comprising:
a memory array comprising a plurality of memory cells;
an output data path circuit configured to generate an output data signal carrying data stored in the memory array;
an output clock path circuit configured to generate an output clock signal;
a delay circuit configured to:
  receive a first intermediate clock signal from an intermediate clock generation circuit;
  delay the first intermediate clock signal to generate a second intermediate clock signal; and
  output the second intermediate clock signal to the output data path circuit; and
a skew correction controller configured to set a delay amount of the delay circuit in response to a phase difference between the output data signal and the output clock signal.

20. The system of claim 19, wherein the delay circuit comprises a first delay circuit, the delay amount comprises a first delay amount, wherein the intermediate clock generation circuit comprises a duty cycle correction circuit comprising a second delay circuit, the duty cycle correction circuit further comprising:
a duty cycle correction controller configured to adjust a second delay amount of the second delay circuit during a duty cycle correction process,
wherein the skew correction controller is configured to adjust the first delay amount during a skew correction process after the duty cycle correction process completes.

21. A method comprising:
generating, with a delay circuit, a delayed clock signal in response to receiving an intermediate clock signal from an intermediate clock generation circuit;
generating, with an output data path circuit, an output data signal at an input/output node of an integrated circuit in response to receipt of the delayed clock signal;
generating, with an input buffer of the integrated circuit, a buffered data signal in response to receiving the output data signal; and
adjusting, with a controller, a delay of the delay circuit until the buffered data signal is edge-aligned with a reference clock signal.

22. A circuit comprising:
means for delaying a first intermediate clock signal to output a second intermediate clock signal;
means for generating a plurality of data pulses in response to receipt of the second intermediate clock signal;
means for generating an output data signal based on the plurality of data pulses;
means for generating a buffered data signal in response to receipt of the output data signal;
means for detecting a phase difference between the buffered data signal and a reference clock signal; and
means for adjusting a delay amount of the means for delaying in response to the detected phase difference.

* * * * *